United States Patent
Sakaino

(10) Patent No.: US 10,604,697 B2
(45) Date of Patent: Mar. 31, 2020

(54) COLOR CONVERSION SHEET, LIGHT SOURCE UNIT INCLUDING THE SAME, DISPLAY, AND LIGHTING APPARATUS

(71) Applicant: Toray Industries, Inc., Tokyo (JP)

(72) Inventor: Hirotoshi Sakaino, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/076,415

(22) PCT Filed: Feb. 8, 2017

(86) PCT No.: PCT/JP2017/004634
§ 371 (c)(1),
(2) Date: Aug. 8, 2018

(87) PCT Pub. No.: WO2017/141795
PCT Pub. Date: Aug. 24, 2017

(65) Prior Publication Data
US 2019/0048255 A1   Feb. 14, 2019

(30) Foreign Application Priority Data

Feb. 19, 2016 (JP) ................................ 2016-029883
May 18, 2016 (JP) ................................ 2016-099245

(51) Int. Cl.
*H01L 33/00* (2010.01)
*C09K 11/02* (2006.01)
(Continued)

(52) U.S. Cl.
CPC ................ *C09K 11/02* (2013.01); *C09B 3/14* (2013.01); *C09B 57/00* (2013.01); *C09K 11/06* (2013.01);
(Continued)

(58) Field of Classification Search
CPC ...... H01L 33/50; H01L 33/501; H01L 33/502
See application file for complete search history.

(56) References Cited

U.S. PATENT DOCUMENTS 5,446,157 A   8/1995 Morgan et al.
9,577,158 B2   2/2017 Ito et al.
(Continued)

FOREIGN PATENT DOCUMENTS

CN   103649215 A   3/2014
EP   2730616 B1   5/2014
(Continued)

OTHER PUBLICATIONS

Fedors, R., "A Method for Estimating Both the Solubility Parameters and Molar Volumes of Liquids", Polymer Engineering and Science, Feb. 1974, vol. 14, No. 2, pp. 147-154.
(Continued)

*Primary Examiner* — Nicholas J Tobergte
(74) *Attorney, Agent, or Firm* — RatnerPrestia

(57) ABSTRACT

A color conversion sheet converts incident light into light with a wavelength longer than that of the incident light. The color conversion sheet includes the following layer (A) and layer (B):

the layer (A): a layer containing an organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing an organic light-emitting material (b) that exhibits light emission with a peak wavelength observed in a region of 580 nm or more and 750 nm or less by being excited by either or both of excitation light in a wavelength range of 400 nm or
(Continued)

more and 500 nm or less and light emission from the organic light-emitting material (a) and a binder resin.

26 Claims, 5 Drawing Sheets

(51) Int. Cl.
     *C09K 11/06*      (2006.01)
     *C09B 57/00*      (2006.01)
     *G02B 5/20*       (2006.01)
     *H01L 33/50*      (2010.01)
     *C09B 3/14*       (2006.01)

(52) U.S. Cl.
     CPC ........... *G02B 5/20* (2013.01); *H01L 33/50* (2013.01); *H01L 33/504* (2013.01); *C09K 2211/1007* (2013.01); *C09K 2211/1011* (2013.01); *C09K 2211/1018* (2013.01); *C09K 2211/1029* (2013.01); *C09K 2211/1033* (2013.01); *C09K 2211/1037* (2013.01); *C09K 2211/1055* (2013.01); *C09K 2211/1074* (2013.01); *C09K 2211/185* (2013.01); *C09K 2211/186* (2013.01)

(56) References Cited

U.S. PATENT DOCUMENTS

| | | | | |
|---|---|---|---|---|
| 2006/0163989 A1* | 7/2006 | Kawaguchi | ............ | H05K 3/02 313/112 |
| 2007/0216289 A1* | 9/2007 | Kuma | ................ | H01L 51/5265 313/504 |
| 2008/0080165 A1* | 4/2008 | Kim | .................. | C09K 11/7734 362/84 |
| 2012/0248968 A1* | 10/2012 | Ogiwara | ............ | H01L 51/5012 313/504 |
| 2014/0097461 A1* | 4/2014 | Ito | ........................ | C09K 11/02 257/98 |
| 2017/0159910 A1* | 6/2017 | Seo | ........................ | G02B 6/00 |
| 2017/0267921 A1 | 9/2017 | Shin et al. | | |
| 2018/0134952 A1* | 5/2018 | Ichihashi | ............... | C09K 11/06 |
| 2018/0179439 A1 | 6/2018 | Umehara et al. | | |
| 2018/0208838 A1* | 7/2018 | Sakaino | ................... | F21V 9/30 |
| 2018/0305611 A1* | 10/2018 | Umehara | ................. | C07F 5/02 |

FOREIGN PATENT DOCUMENTS

| | | |
|---|---|---|
| JP | 08509471 A | 10/1996 |
| JP | 2000208262 A | 7/2000 |
| JP | 2000256565 A | 9/2000 |
| JP | 2001164245 A | 6/2001 |
| JP | 2002184576 A | 6/2002 |
| JP | 2007273440 A | 10/2007 |
| JP | 2010061824 A | 3/2010 |
| JP | 2011241160 A | 12/2011 |
| JP | 2012022028 A | 2/2012 |
| JP | 2012243618 A | 12/2012 |
| JP | 2013032515 A | 2/2013 |
| TW | 201309783 A | 3/2013 |
| TW | 201643234 A | 12/2016 |
| WO | 2009116456 A1 | 9/2009 |
| WO | 2017002707 A1 | 1/2017 |

OTHER PUBLICATIONS

International Search Report and Written Opinion for International Application No. PCT/JP2017/004634, dated Mar. 21, 2017—9 pages.
Taiwan Office Action for Taiwan Application No. 106104568, dated Feb. 15, 2019, 31 pages.
Chinese Office Action for Chinese Application No. 201780011059.2, dated Apr. 12, 2019, with translation, 12 pages.

* cited by examiner

COLOR CONVERSION SHEET, LIGHT SOURCE UNIT INCLUDING THE SAME, DISPLAY, AND LIGHTING APPARATUS

CROSS REFERENCE TO RELATED APPLICATIONS

This is the U.S. National Phase application of PCT/JP2017/004634, filed Feb. 8, 2017, which claims priority to Japanese Patent Application No. 2016-029883, filed Feb. 19, 2016 and Japanese Patent Application No. 2016-099245, filed May 18, 2016, the disclosures of these applications being incorporated herein by reference in their entireties for all purposes.

TECHNICAL FIELD OF THE INVENTION

The present invention relates to a color conversion sheet, a light source including the same, a display and a lighting apparatus.

Application of a multicoloring technique by a color conversion method to liquid crystal displays, organic electroluminescence (EL) displays, lighting apparatuses, and the like is being energetically studied. Color conversion means converting light emission from a light-emitting body into light with a longer wavelength and means converting blue light emission into green or red light emission, for example.

A composition having this color conversion function (hereinafter, referred to as "a color conversion composition") is formed into a sheet form and is combined with a blue light source, for example, whereby the three primary colors of blue, green, and red can be extracted, that is, white light can be extracted from the blue light source. A white light source obtained by combining the blue light source and the sheet having the color conversion function (hereinafter, referred to as "a color conversion sheet") with each other forms a backlight unit, and this backlight unit, a liquid crystal drive part, and color filters are combined with each other, whereby a full-color display can be produced. Without the liquid crystal drive part, the residual part can be used as a white light source as it is, which can be used as the white light source such as LED lighting.

Improvement in color reproducibility is a problem in liquid crystal displays using the color conversion method. Narrowing the full width at half maximum of the respective emission spectra of blue, green, and red of the backlight unit to increase the color purity of each of blue, green, and red is effective in improving color reproducibility.

To solve this problem, developed is a technique that uses quantum dots formed of inorganic semiconductor fine particles as a component of the color conversion composition (refer to Patent Literature 1, for example). Although the technique using the quantum dots is indeed narrow in the full width at half maximum of green and red emission spectra to improve color reproducibility, the quantum dots are vulnerable to heat and water and oxygen in the air and are thus deficient in durability on the other hand. In addition, there is a problem in that cadmium is contained, for example.

Also developed is a technique that uses a light-emitting material formed of an organic substance as a component of the color conversion composition in place of the quantum dots. Disclosed as examples of the technique that uses an organic light-emitting material as the component of the color conversion composition are one that uses a coumarin derivative (refer to Patent Literature 2, for example), one that uses a rhodamine derivative (refer to Patent Literature 3, for example), and one that uses a pyrromethene derivative (refer to Patent Literature 4, for example).

PATENT LITERATURE

Patent Literature 1: Japanese Patent Application Laid-open No. 2012-22028
Patent Literature 2: Japanese Patent Application Laid-open No. 2007-273440
Patent Literature 3: Japanese Patent Application Laid-open No. 2001-164245
Patent Literature 4: Japanese Patent Application Laid-open No. 2011-241160

SUMMARY OF THE INVENTION

However, the technique using these organic light-emitting materials is insufficient in improvement in color reproducibility. In particular, deficient is a technique that achieves a wide color gamut using organic light-emitting materials exhibiting light emission with high color purity.

A problem to be solved by the present invention is to provide a color conversion sheet for use in displays, lighting apparatuses, and the like, the color conversion sheet being able to achieve both high color purity and a wide color gamut to improve color reproducibility.

To solve the problem described above and to achieve the object, a color conversion sheet according to the present invention converts incident light into light with a wavelength longer than that of the incident light. The color conversion sheet includes the following layer (A) and layer (B):

the layer (A): a layer containing an organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing an organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin.

In the color conversion sheet according to the present invention, the binder resin contained in the layer (A) and the binder resin contained in the layer (B) are different from each other.

In the color conversion sheet according to the present invention, the peak wavelength of the light emission of the organic light-emitting material (a) is 500 nm or more and 550 nm or less, and the peak wavelength of the light emission of the organic light-emitting material (b) is 580 nm or more and 680 nm or less.

In the color conversion sheet according to the present invention, $SP_A \leq SP_B$ where SP values as solubility parameters of the binder resin contained in the layer (A) and the binder resin contained in the layer (B) are $SP_A (cal/cm^3)^{0.5}$ and $SP_B (cal/cm^3)^{0.5}$, respectively.

In the color conversion sheet according to the present invention, $SP_B \geq 10.0$ where a SP value as a solubility parameter of the binder resin contained in the layer (B) is $SP_B (cal/cm^3)^{0.5}$.

In the color conversion sheet according to the present invention, a content $w_a$ of the organic light-emitting material (a) in the layer (A) and a content $w_b$ of the organic light-emitting material (b) in the layer (B) have a relation of $w_a \geq w_b$.

In the color conversion sheet according to the present invention, at least one of the organic light-emitting material (a) and the organic light-emitting material (b) is a compound represented by General Formula (1):

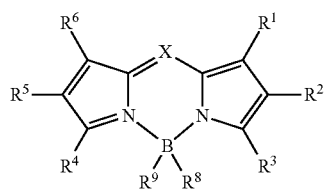

(1)

(where X is C—$R^7$ or N; $R^1$ to $R^9$ are the same as or different from each other and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents).

In the color conversion sheet according to the present invention, both the organic light-emitting material (a) and the organic light-emitting material (b) are each a compound represented by General Formula (1).

In the color conversion sheet according to the present invention, the layer (A) further contains an organic light-emitting material (c) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a).

In the color conversion sheet according to the present invention, a content $w_a$ of the organic light-emitting material (a) in the layer (A) and a content $w_c$ of the organic light-emitting material (c) in the layer (A) have a relation of $w_a \geq w_c$.

In the color conversion sheet according to the present invention, the organic light-emitting material (c) is a compound represented by General Formula (1):

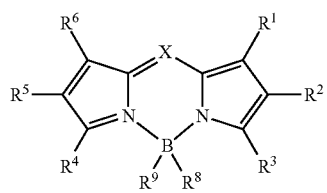

(1)

(where X is C—$R^7$ or N; $R^1$ to $R^9$ are the same as or different from each other and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents).

In the color conversion sheet according to the present invention, the layer (B) further contains an organic light-emitting material (d) that exhibits light emission with a peak wavelength observed in a region of 500 nm or more and 580 nm or less by using excitation light in a wavelength range of 400 nm or more and 500 nm or less.

In the color conversion sheet according to the present invention, the organic light-emitting material (d) is a compound represented by General Formula (1):

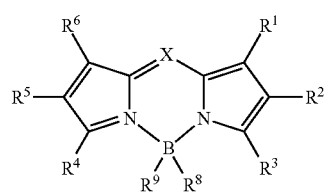

(1)

(where X is C—$R^7$ or N; $R^1$ to $R^9$ are the same as or different from each other and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents).

In the color conversion sheet according to the present invention, in General Formula (1), X is C—$R^7$ and $R^7$ is a group represented by General Formula (2):

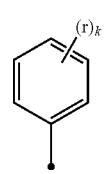

(2)

(where r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group; k is an integer of 1 to 3; when k is 2 or more, rs are the same as or different from each other).

In the color conversion sheet according to the present invention, in General Formula (1), $R^1$, $R^3$, $R^4$, and $R^6$ are the same as or different from each other and are substituted or unsubstituted phenyl groups.

In the color conversion sheet according to the present invention, in General Formula (1), $R^1$, $R^3$, $R^4$, and $R^6$ are the same as or different from each other and are substituted or unsubstituted alkyl groups.

The color conversion sheet according to the present invention further includes a light extraction layer between the layer (A) and the layer (B).

A light source unit according to the present invention includes: a light source; and the color conversion sheet according to any one of the above-mentioned inventions.

In the light source unit according to the present invention, an arrangement of the light source and the following layer (A) and layer (B) included in the color conversion sheet is an arrangement of the light source, the layer (A), and the layer (B) in this order:

the layer (A): a layer containing the organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing the organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin.

In the light source unit according to the present invention, the light source is a light-emitting diode having maximum emission in a wavelength range of 400 nm or more and 500 nm or less.

A display according to the present invention includes the light source unit according to any one of the above-mentioned inventions.

A lighting apparatus according to the present invention includes the light source unit according to any one of the above-mentioned inventions.

The color conversion sheet according to the present invention achieves both light emission with high color purity and a wide color gamut and thus produces an effect of making it possible to achieve high color reproducibility. The light source unit, the display, and the lighting apparatus according to the present invention include such a color conversion sheet and thus produce an effect of making it possible to achieve high color reproducibility.

DETAILED DESCRIPTION OF EMBODIMENTS OF THE INVENTION

Figure 1:
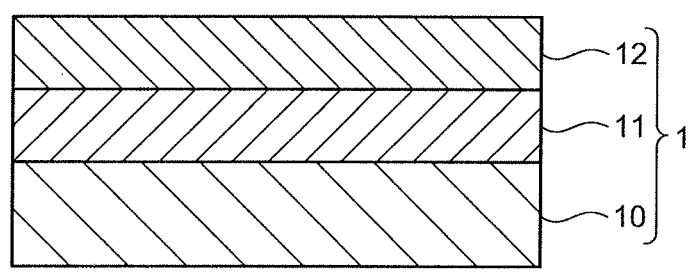
FIG. 1 is a schematic sectional view of an example of a color conversion sheet according to an embodiment of the present invention.

The following specifically describes preferred embodiments of a color conversion sheet, a light source unit including the same, a display, and a lighting apparatus according to the present invention. It should be noted that the present invention is not limited to the following embodiments and can be embodied in a variously modified manner in accordance with objects and uses.

<Color Conversion Sheet>

The color conversion sheet according to the embodiment of the present invention is a color conversion sheet that converts incident light from a light-emitting body such as a light source into light with a wavelength longer than that of the incident light and includes the following layer (A) and layer (B). The layer (A) is a layer containing an organic light-emitting material (a) and a binder resin. The organic light-emitting material (a) is a light-emitting material formed of an organic substance that exhibits light emission with a peak wavelength observed in a region of 500 nm or more and 580 nm or less by using excitation light in a wavelength range of 400 nm or more and 500 nm or less. The layer (B) is a layer containing an organic light-emitting material (b) and a binder resin. The organic light-emitting material (b) is a light-emitting material formed of an organic substance that exhibits light emission with a peak wavelength observed in a region of 580 nm or more and 750 nm or less by being excited by either or both of excitation light in a wavelength region of 400 nm or more and 500 nm or less and light emission from the organic light-emitting material (a).

The peak wavelength of the light emission of an organic light-emitting material (the organic light-emitting material (a) and the organic light-emitting material (b), for example) can be determined by the fluorescence spectral measurement of its solution. A solvent for use in this fluorescence spectral measurement is not limited to a particular solvent; a solvent such as toluene, dichloromethane, or tetrahydrofuran can be suitably used. Toluene is preferably used as this solvent so long as there is no problem about the solubility of the organic light-emitting material.

In the following, the light emission with a peak wavelength in the region of 500 nm or more and 580 nm or less is referred to as "green light emission." The light emission with a peak wavelength observed in the region of 580 nm or more and 750 nm or less is referred to as "red light emission."

In general, the excitation light having larger energy is more likely to cause the decomposition of a material. However, the excitation light in a wavelength range of 400 nm or more and 500 nm or less is relatively small in excitation energy. For this reason, the decomposition of the light-emitting material in the color conversion composition is not caused, and light emission with favorable color purity can be obtained.

Part of the excitation light in a wavelength range of 400 nm or more and 500 nm or less partially passes through the color conversion sheet according to the embodiment of the present invention, and it itself can be used as blue light emission. The color conversion sheet according to the embodiment of the present invention contains the organic light-emitting material (a) that exhibits the green light emission and the organic light-emitting material (b) that exhibits the red light emission. Consequently, when the color conversion sheet according to the embodiment of the present invention is used for a blue LED light source with a sharp emission peak, sharp emission spectra are exhibited in the respective colors of blue, green, and red, and white light with favorable color purity can be obtained. Consequently, in displays in particular, a color gamut that has more vivid colors and is large can be efficiently made. In lighting use, light emission characteristics in the green region and the red region in particular are improved compared with a white LED in which a blue LED and a yellow fluorescent body are combined with each other, which is currently in the mainstream, thus achieving a favorable white light source with improved color rendering.

To expand the color gamut to improve color reproducibility, the overlap of the emission spectra among the respective colors of blue, green, and red is preferably small.

When blue light in a wavelength range of 400 nm or more and 500 nm or less having moderate excitation energy is used as the excitation light, for example, light emission with a peak wavelength observed in a region of 500 nm or more is used as the green light emission. In this case, the overlap of the emission spectra between the excitation light and green light is small, and color reproducibility improves, which is thus preferred. In enhancing the effect, the lower limit value of the peak wavelength of the organic light-emitting material (a) is more preferably 510 nm or more, further preferably 515 nm or more, and particularly preferably 520 nm or more.

To reduce the overlap of the emission spectra between the excitation light and red light, light emission with a peak wavelength observed in a region of 580 nm or less is preferably used as the green light emission. In enhancing the effect, the upper limit value of the peak wavelength of the organic light-emitting material (a) is more preferably 550 nm or less, further preferably 540 nm or less, and particularly preferably 530 nm or less.

When light emission with a peak wavelength observed in a region of 500 nm or more and 580 nm or less is used as the green light emission, light emission with a peak wavelength observed in a region of 580 nm or more is used as the red light emission. In this case, the overlap of the emission spectra between the green light the red light is small, and color reproducibility improves, which is thus preferred. In enhancing the effect, the lower limit value of the peak wavelength of the organic light-emitting material (b) is more preferably 620 nm or more, further preferably 630 nm or more, and particularly preferably 635 nm or more.

The upper limit of the peak wavelength of the red light may be 750 nm, which is near the upper limit of the visible range, or less; when it is 700 nm or less, visibility improves, which is thus more preferred. In enhancing the effect, the upper limit value of the peak wavelength of the organic light-emitting material (b) is further preferably 680 nm or less and particularly preferably 660 nm or less.

In other words, when the blue light in a wavelength range of 400 nm or more and 500 nm or less is used as the excitation light, the peak wavelength of the green light is observed in a region of preferably 500 nm or more and 580 nm or less, more preferably 510 nm or more and 550 nm or less, further preferably 515 nm or more and 540 nm or less, and particularly preferably 520 nm or more and 530 nm or less. The peak wavelength of the red light is observed in a region of preferably 580 nm or more and 750 nm or less, more preferably 620 nm or more and 700 nm or less, further preferably 630 nm or more and 680 nm or less, and particularly preferably 635 nm or more and 660 nm or less.

To reduce the overlap of the emission spectra to improve color reproducibility, the full width at half maximum of the emission spectra of the respective colors of blue, green, and red are preferably small. In particular, that the full width at half maximum of the emission spectra of the green light and the red light are small is effective in improving color reproducibility.

The full width at half maximum of the emission spectrum of the green light is preferably 50 nm or less, more preferably 40 nm or less, further preferably 35 nm or less, and particularly preferably 30 nm or less, for example. The full width at half maximum of the emission spectrum of the red light is preferably 80 nm or less, more preferably 70 nm or less, further preferably 60 nm or less, and particularly preferably 50 nm or less.

The shape of the emission spectra, which is not limited to a particular shape, preferably has a single peak because excitation energy can be efficiently used, and color purity increases. The single peak indicates a state in which in a wavelength region relative to a peak having the highest intensity there is no peak the intensity of which is 5% or more of the highest intensity.

As described above, the color conversion sheet according to the embodiment of the present invention includes two color conversion layers, that is, the layer (A) containing the organic light-emitting material (a) and the layer (B) containing the organic light-emitting material (b). The organic light-emitting material (a) and the organic light-emitting material (b) are contained in different layers, whereby inter-material interaction is reduced, and light emission with higher color purity is exhibited than a case in which they are dispersed in the same layer. The inter-material interaction between the organic light-emitting material (a) and the organic light-emitting material (b) is reduced, whereby the organic light-emitting material (a) and the organic light-emitting material (b) each emit light independently in the respective layers, and thus adjustment of the emission peak wavelength and emission intensity of green and red is made easy.

In other words, the color conversion sheet according to the embodiment of the present invention can design the optimum emission peak wavelength and emission intensity of the respective colors of blue, green, and red without deteriorating the characteristics of the organic light-emitting material such as the organic light-emitting material (a) and the organic light-emitting material (b) exhibiting light emission with high color purity. With this design, white light with good color purity can be obtained.

In the color conversion sheet according to the embodiment of the present invention, at least one organic light-emitting material may be contained in each of the layer (A) and the layer (B); two or more may be contained therein. A plurality of organic light-emitting materials are mixed in at least either the layer (A) or the layer (B), thereby enabling fine adjustment of the emission peak wavelength and emission intensity of the respective colors of blue, green, and red.

As a mixing example of a plurality of organic light-emitting materials, the layer (A) may contain an organic light-emitting material (a') in addition to and different from the organic light-emitting material (a), for example. The organic light-emitting material (a') exhibits light emission with a peak wavelength observed in a region of 500 nm or more and 580 nm or less by using excitation light in a wavelength range of 400 nm or more and 500 nm or less. The layer (B) may contain an organic light-emitting material (b') in addition to and different from the organic light-emitting material (b). The organic light-emitting material (b') exhibits light emission with a peak wavelength observed in a region of 580 nm or more and 750 nm or less by being excited by either or both of excitation light in a wavelength range of 400 nm or more and 500 nm or less and light emission from the organic light-emitting material (a).

The layer (A) preferably further contains an organic light-emitting material (c) in addition to and different from the organic light-emitting material (a). The organic light-emitting material (c) exhibits light emission with a peak wavelength observed in a region of 580 nm or more and 750 nm or less by being excited by either or both of excitation light in a wavelength range of 400 nm or more and 500 nm or less and light emission from the organic light-emitting material (a). The layer (B) preferably further contains an organic light-emitting material (d) in addition to and different from the organic light-emitting material (b). The organic light-emitting material (d) exhibits light emission with a peak wavelength observed in a region of 500 nm or more and 580 nm or less by using excitation light in a wavelength range of 400 nm or more and 500 nm or less.

A plurality of pieces of the layer (A) and the layer (B) may be included in the color conversion sheet according to the embodiment of the present invention. In this case, the compositions and forms of the layers of the pieces of the layer (A) may be the same as or different from each other. Similarly, the compositions and forms of the layers of the pieces of the layer (B) may be the same as or different from each other.

Representative structure examples of the color conversion sheet according to the embodiment of the present invention include ones shown below. FIG. 1 is a schematic sectional view of an example of the color conversion sheet according to the embodiment of the present invention. As illustrated in FIG. 1, this color conversion sheet 1 as an example of the present embodiment is a laminate of a base layer 10, the layer (A) 11, and the layer (B) 12. In the structure example of this color conversion sheet 1, a laminate of the layer (A) 11 and the layer (B) 12 is laminated on the base layer 10 in order of the layer (A) 11 and the layer (B) 12. In other words, the color conversion sheet 1 includes the base layer 10 and includes the layer (A) 11 and the layer (B) 12 with a lamination structure of the layer (B)/the layer (A) on this base layer 10.

Figure 2:
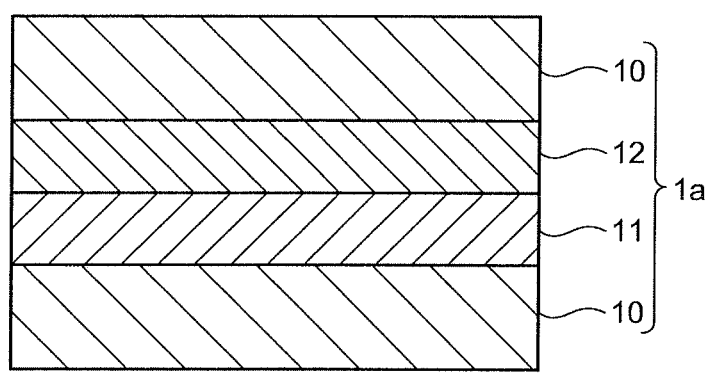
FIG. 2 is a schematic sectional view of another example of the color conversion sheet according to the embodiment of the present invention.

FIG. 2 is a schematic sectional view of another example of the color conversion sheet according to the embodiment of the present invention. As illustrated in FIG. 2, this color conversion sheet 1a as another example of the present embodiment is a laminate with a structure in which the layer (A) 11 and the layer (B) 12 are interposed between a plurality of base layers 10. In the structure example of this color conversion sheet 1a, a laminate of the layer (A) 11 and the layer (B) 12 is laminated on one base layer 10 in order of the layer (A) 11 and the layer (B) 12, and another base layer 10 is laminated on this layer (B) 12. In other words, the color conversion sheet 1a includes a plurality of base layers 10 and includes the layer (A) 11 and the layer (B) 12 with a lamination structure of the layer (B)/the layer (A) in such a manner that they are interposed between these base layers 10.

Structure examples of the color conversion sheet according to the embodiment of the present invention include structures in which the layer (A) 11 or the layer (B) 12 is repeated such as the layer (B)/the layer (A)/the layer (A), the layer (B)/the layer (B)/the layer (A), and the layer (B)/the layer (B)/the layer (A)/the layer (A), in addition to the structure examples exemplified in FIGS. 1 and 2.

These are by way of example, and the specific structures of the color conversion sheet according to the embodiment of the present invention are not limited to these; structures with alterations made as appropriate by matters derived from the following description are also included in the scope of the present invention.

<Color Conversion Layer>

In the color conversion sheet according to the embodiment of the present invention, the color conversion layer is a layer containing a color conversion composition or its cured object. The color conversion composition is a composition containing an organic light-emitting material and a binder resin. The layer (A) and the layer (B) are examples of the color conversion layer.

The thickness of the color conversion layer, which is not limited to a particular thickness, is preferably 1 μm to 1,000 μm and more preferably 10 μm to 1,000 μm. If the thickness of the color conversion layer is smaller than 1 m, the toughness of the color conversion sheet unfortunately reduces. If the thickness of the color conversion layer exceeds 1,000 μm, cracks are likely to occur, and the shaping of the color conversion sheet is difficult. The thickness of the color conversion layer is more preferably 5 μm to 100 μm, further preferably 10 μm to 100 μm, and particularly preferably 15 μm to 100 μm.

A film thickness (the thickness of the layer) in the present invention refers to a film thickness (an average film thickness) measured based on JIS K 7130 (1999) Plastics—Film and sheeting—Method A for measuring thickness by mechanical scanning in method for measuring thickness.

(Organic Light-Emitting Material)

The color conversion sheet according to the embodiment of the present invention contains the organic light-emitting material in the layer (A) and the layer (B). The light-emitting material in the present invention refers to a material that, when being irradiated with some light, emits light with a wavelength different from that of the light. The organic light-emitting material is a light-emitting material formed of an organic substance.

To achieve highly efficient color conversion, the light-emitting material is preferably a material that exhibits light emission characteristics with high emission quantum yield. Examples of the light-emitting material generally include known light-emitting materials such as inorganic fluorescent bodies, fluorescent pigments, fluorescent dyes, and quantum dots; the organic light-emitting material is preferred in view of dispersion uniformity, a reduction in the amount of use, and a reduction in environmental loads.

Examples of the organic light-emitting material include the following ones. Preferred examples of the organic light-emitting material include compounds having a condensed aryl ring such as naphthalene, anthracene, phenanthrene, pyrene, chrysene, naphthacene, triphenylene, perylene, fluoranthene, fluorene, and indene and derivatives thereof. Preferred examples of the organic light-emitting material include compounds having a heteroaryl ring such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyridine, pyrazine, naphthyridine, quinoxaline, and pyrrolopyridine, derivatives thereof, and borane derivatives.

Preferred examples of the organic light-emitting material include stilbene derivatives such as 1,4-distyrylbenzene, 4,4'-bis(2-(4-diphenylaminophenyl)ethenyl)biphenyl, and 4,4'-bis(N-(stilbene-4-yl)-N-phenylamino)stilbene, aromatic acetylene derivatives, tetraphenyl butadiene derivatives, aldazine derivatives, pyrromethene derivatives, and diketopyrrolo[3,4-c]pyrrole derivatives. Preferred examples of the organic light-emitting material include coumarin derivatives such as coumarin 6, coumarin 7, and coumarin 153, azole derivatives such as imidazole, thiazole, thiadiazole, carbazole, oxazole, oxadiazole, and triazole and metal complexes thereof, cyanine-based compounds such as indocyanine green, xanthene-based compounds such as fluorescein, eosine, and rhodamine, and thioxanthene-based compounds.

Preferred examples of the organic light-emitting material include polyphenylene-based compounds, naphthalimide derivatives, phthalocyanine derivatives and metal complexes thereof, porphyrin derivatives and metal complexes thereof, oxazine-based compounds such as Nile Red and Nile Blue, helicene-based compounds, and aromatic amine derivatives such as N,N'-diphenyl-N,N'-di(3-methylphenyl)-4,4'-diphenyl-1,1'-diamine. Preferred examples of the organic light-emitting material include organic metal complex compounds of iridium (Ir), ruthenium (Ru), rhodium (Rh), palladium (Pd), platinum (Pt), osmium (Os), rhenium (Re), and the like. However, the organic light-emitting material of the present invention is not limited to these compounds described above.

The organic light-emitting material may be a fluorescent light-emitting material or a phosphorescent light-emitting material; to achieve high color purity, a fluorescent light-emitting material is preferred. Among these materials, preferred are compounds having a condensed aryl ring or derivatives thereof because of high thermal stability and photostability.

In view of solubility and the versatility of molecular structure, compounds having a coordinated bond are preferred as the organic light-emitting material. In view of being small in full width at half maximum and the capability of giving highly efficient light emission, also preferred are compounds containing boron such as boron fluoride complexes.

Preferred examples of the organic light-emitting material (a) include coumarin derivatives such as coumarin 6, coumarin 7, and coumarin 153; cyanine derivatives such as indocyanine green; fluorescein derivatives such as fluorescein, fluorescein isothiocyanate, and carboxyfluorescein diacetate; phthalocyanine derivatives such as phthalocyanine green, perylene derivatives such as diisobutyl-4,10-dicyanoperylene-3,9-dicarboxylate; pyrromethene derivatives; stilbene derivatives; oxazine derivatives; naphthalimide derivatives; pyrazine derivatives; benzimidazole derivatives; benzoxazole derivatives; benzothiazole derivatives; imidazopyridine derivatives; azole derivatives; compounds having a condensed aryl ring such as anthracene and derivatives thereof; aromatic amine derivatives; and organic metal complex compounds. However, the organic light-emitting material (a) is not limited particularly to these examples.

Among these compounds, pyrromethene derivatives give high emission quantum yield, are favorable in durability, and are thus particularly preferred compounds. Among pyrromethene derivatives, a compound represented by General Formula (1) below, for example, exhibits light emission with high color purity and is thus preferred.

Preferred examples of the organic light-emitting material (a') include light-emitting materials similar to those for the organic light-emitting material (a); the compound represented by General Formula (1) below is particularly preferred. Preferred examples of the organic light-emitting material (d) include light-emitting materials similar to those for the organic light-emitting material (a); the compound represented by General Formula (1) below is particularly preferred.

In the color conversion sheet according to the embodiment of the present invention, when the organic light-emitting material (a) and the organic light-emitting material (d) are contained, both the organic light-emitting material (a) and the organic light-emitting material (d) are preferably the compound represented by General Formula (1) below. In that case, the organic light-emitting material (a) and the organic light-emitting material (d) may be the same compound or different compounds; in view of costs, they are preferably the same compound.

Preferred examples of the organic light-emitting material (b) include cyanine derivatives such as 4-dicyanomethylene-2-methyl-6-(p-dimethylaminostyryl)-4H-pyran; rhodamine derivatives such as rhodamine B, rhodamine 6G, rhodamine 101, and sulforhodamine 101; pyridine derivatives such as 1-ethyl-2-(4-(p-dimethylaminophenyl)-1,3-butadienyl)-pyridinium-perchlorate; perylene derivatives such as N,N'-bis(2,6-diisopropylphenyl)-1,6,7,12-tetraphenoxyperylene-3,4:9,10-bis(dicarboimide); porphyrin derivatives; pyrromethene derivatives; oxazine derivatives; pyrazine derivatives; compounds having a condensed aryl ring such as naphthacene and dibenzodiindenoperylene and derivatives thereof; and organic metal complex compounds. However, the organic light-emitting material (b) is not limited particularly to these examples.

Among these compounds, pyrromethene derivatives give high emission quantum yield, are favorable in durability, and are thus particularly preferred compounds. Among pyrromethene derivatives, the compound represented by General Formula (1) below, for example, exhibits light emission with high color purity and is thus preferred.

Preferred examples of the organic light-emitting material (b') include light-emitting materials similar to those for the organic light-emitting material (b); the compound represented by General Formula (1) below is particularly preferred. Preferred examples of the organic light-emitting material (c) include light-emitting materials similar to those for the organic light-emitting material (b); the compound represented by General Formula (1) below is particularly preferred.

In the color conversion sheet according to the embodiment of the present invention, when the organic light-emitting material (b) and the organic light-emitting material (c) are contained, both the organic light-emitting material (b) and the organic light-emitting material (c) are preferably the compound represented by General Formula (1) below. In that case, the organic light-emitting material (b) and the organic light-emitting material (c) may be the same compound or different compounds; in view of costs, they are preferably the same compound.

(Compound Represented by General Formula (1))

In the color conversion sheet according to the embodiment of the present invention, at least one of the organic light-emitting material (a) and the organic light-emitting material (b) is preferably a compound represented by the following General Formula (1)

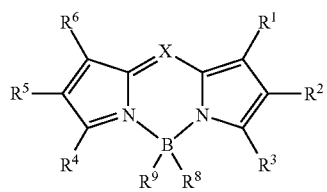

(1)

In General Formula (1), X is C—$R^7$ or N. $R^1$ to $R^9$ may be the same as or different from each other and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

In all the above groups, the hydrogen may be deuterium. This holds true for compounds or partial structures thereof described below. In the following description, a substituted or unsubstituted $C_{6-40}$ aryl group, for example, is an aryl group all the carbon number of which is 6 to 40 including the carbon number included in a substituent by which the aryl group is substituted. This holds true for other substituents defining the carbon number.

In all the above groups, a substituent when they are substituted is preferably an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, or further, a specific substituent described as preferred in the descriptions of the respective substituents. These substituents may be further substituted by the substituents described above.

"Unsubstituted" in "substituted or unsubstituted" means that a hydrogen atom or deuterium atom has substituted. The above holds true for cases described as "substituted or unsubstituted" in the compounds or partial structures thereof described below.

In all the above groups, the alkyl group refers to a saturated aliphatic hydrocarbon group such as a methyl group, an ethyl group, a n-propyl group, an isopropyl group, a n-butyl group, a sec-butyl group, or a tert-butyl group, which optionally has a substituent. An additional substituent when it is substituted is not limited to a particular substituent, and examples thereof include an alkyl group, halogen, an aryl group, and a heteroaryl group, which is common to the following description. The carbon number of the alkyl group, which is not limited to a particular number, is in the range of preferably 1 or more and 20 or less and more preferably 1 or more and 8 or less in view of availability and cost.

The cycloalkyl group refers to a saturated alicyclic hydrocarbon group such as a cyclopropyl group, a cyclohexyl group, a norbornyl group, or an adamantyl group, which optionally has a substituent. The carbon number of the alkyl group part, which is not limited to a particular number, is preferably in the range of 3 or more and 20 or less.

The heterocyclic group refers to an aliphatic ring having an atom other than carbon within its ring such as a pyran ring, a piperidine ring, or a cyclic amide, which optionally has a substituent. The carbon number of the heterocyclic group, which is not limited to a particular number, is preferably in the range of 2 or more and 20 or less.

The alkenyl group refers to an unsaturated aliphatic hydrocarbon group containing a double bond such as a vinyl group, an allyl group, or a butadienyl group, which optionally has a substituent. The carbon number of the alkenyl group, which is not limited to a particular number, is preferably in the range of 2 or more and 20 or less.

The cycloalkenyl group refers to an unsaturated alicyclic hydrocarbon group containing a double bond such as a cyclopentenyl group, a cyclopentadienyl group, or a cyclohexenyl group, which optionally has a substituent.

The alkynyl group refers to an unsaturated aliphatic hydrocarbon group containing a triple bond such as an ethynyl group, which optionally has a substituent. The carbon number of the alkynyl group, which is not limited to a particular number, is preferably in the range of 2 or more and 20 or less.

The alkoxy group refers to a functional group to which an aliphatic hydrocarbon group bonds through an ether bond such as a methoxy group, an ethoxy group, or a propoxy group, and this aliphatic hydrocarbon group optionally has a substituent. The carbon number of the alkoxy group, which is not limited to a particular number, is preferably in the range of 1 or more and 20 or less.

The alkylthio group is a group in which the oxygen atom of the ether bond of the alkoxy group is substituted by a sulfur atom. The hydrocarbon group of the alkylthio group optionally has a substituent. The carbon number of the alkylthio group, which is not limited to a particular number, is preferably in the range of 1 or more and 20 or less.

The aryl ether group refers to a function group to which an aromatic hydrocarbon group bonds through an ether bond such as a phenoxy group, and the aromatic hydrocarbon group optionally has a substituent. The carbon number of the aryl ether group, which is not limited to a particular number, is preferably in the range of 6 or more and 40 or less.

The aryl thioether group is a group in which the oxygen atom of the ether bond of the aryl ether group is substituted by a sulfur atom. The aromatic hydrocarbon group of the aryl thioether group optionally has a substituent. The carbon number of the aryl thioether group, which is not limited to a particular number, is preferably in the range of 6 or more and 40 or less.

The aryl group refers to an aromatic hydrocarbon group such as a phenyl group, a biphenyl group, a terphenyl group, a naphthyl group, a fluorenyl group, a benzofluorenyl group, a dibenzofluorenyl group, a phenanthryl group, an anthracenyl group, a benzophenanthryl group, a benzoanthracenyl group, a crycenyl group, a pyrenyl group, a fluoranthenyl group, a triphenylenyl group, a benzofluoranthenyl group, a dibenzoanthracenyl group, a perylenyl group, or a helicenyl group. Among them, preferred are a phenyl group, a biphenyl group, a terphenyl group, a naphthyl group, a fluorenyl group, a phenanthryl group, an anthracenyl group, a pyrenyl group, a fluoranthenyl group, and a triphenylenyl group. The aryl group optionally has a substituent. The carbon number of the aryl group, which is not limited to a particular number, is in the range of preferably 6 or more and 40 or less and more preferably 6 or more and 30 or less.

When $R^1$ to $R^9$ are each a substituted or unsubstituted aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, further preferably a phenyl group, a biphenyl group, or a terphenyl group, and particularly preferably a phenyl group.

When each of the substituents is further substituted by an aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, and particularly preferably a phenyl group.

The heteroaryl group refers to a cyclic aromatic group having one or more atoms other than carbon within its ring such as a pyridyl group, a furanyl group, a thienyl group, a quinolinyl group, an isoquinolinyl group, a pyrazinyl group, a pyrimidyl group, a pyridazinyl group, a triazinyl group, a naphthyridinyl group, a cinnolinyl group, a phthalazinyl group, a quinoxalinyl group, a quinazolinyl group, a benzofuranyl group, a benzothienyl group, an indolyl group, a dibenzofuranyl group, a dibenzothienyl group, a carbazolyl group, a benzocarbazolyl group, a carbolinyl group, an indolocarbazolyl group, a benzofurocarbazolyl group, a benzothienocarbazolyl group, a dihydroindenocarbazolyl group, a benzoquinolinyl group, an acridinyl group, a dibenzoacridinyl group, a benzimidazolyl group, an imidazopyridyl group, a benzoxazolyl group, a benzothiazolyl group, or a phenanthrolinyl group. The naphthyridinyl group refers to any of a 1,5-naphthyridinyl group, a 1,6-naphthyridinyl group, a 1,7-naphthyridinyl group, a 1,8-naphthyridinyl group, a 2,6-naphthyridinyl group, or a 2,7-naphthyridinyl group. The heteroaryl group optionally has a substituent. The carbon number of the heteroaryl group, which is not limited to a particular number, is in the range of preferably 2 or more and 40 or less and more preferably 2 or more and 30 or less.

When $R^1$ to $R^9$ are each a substituted or unsubstituted heteroaryl group, the heteroaryl group is preferably a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thienyl group, or a quinolinyl group, and particularly preferably a pyridyl group.

When each of the substituents is further substituted by a heteroaryl group, the heteroaryl group is preferably a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thienyl group, or a quinolinyl group, and particularly preferably a pyridyl group.

The halogen refers to an atom selected from fluorine, chlorine, bromine, and iodine. The carbonyl group, the carboxy group, the oxycarbonyl group, and the carbamoyl group each optionally have a substituent. Examples of the substituent include an alkyl group, a cycloalkyl group, an aryl group, and a heteroaryl group, and these substituents may be further substituted.

The amino group is a substituted or unsubstituted amino group. Examples of the substituent when it is substituted include an aryl group, a heteroaryl group, a linear alkyl group, and a branched alkyl group. The aryl group and the heteroaryl group are preferably a phenyl group, a naphthyl group, a pyridyl group, or a quinolinyl group. These substituents may be further substituted. The carbon number, which is not limited to a particular number, is in the range of preferably 2 or more and 50 or less, more preferably 6 or more and 40 or less, and particularly preferably 6 or more and 30 or less.

The silyl group refers to an alkyl silyl group such as a trimethylsilyl group, a triethylsilyl group, a tert-butyl dimethyl silyl group, a propyl dimethyl silyl group, or a vinyl dimethyl silyl group and an aryl silyl group such as a phenyl dimethyl silyl group, a tert-butyl diphenyl silyl group, a triphenyl silyl group, or a trinaphthyl silyl group. The substituent on the silicon may be further substituted. The carbon number of the silyl group, which is not limited to a particular number, is preferably in the range of 1 or more and 30 or less.

The siloxanyl group refers to a silicide group through an ether bond such as trimethylsiloxanyl group. The substituent on the silicon may be further substituted. The boryl group is a substituted or unsubstituted boryl group. Examples of a substituent when it is substituted include an aryl group, a heteroaryl group, a linear alkyl group, a branched alkyl group, an aryl ether group, an alkoxy group, and a hydroxy group. Among them, preferred are an aryl group and an aryl ether group. The phosphine oxide group is a group represented by $-P(=O)R^{10}R^{11}$. $R^{10}$ and $R^{11}$ are each selected from a group similar to that for $R^1$ to $R^9$.

The condensed ring and the alicyclic ring formed between adjacent substituents refers to mutual bonding between any two adjacent substituents ($R^1$ and $R^2$ in General Formula (1), for example) forming a conjugated or non-conjugated cyclic skeleton. As the element of the condensed ring and the alicyclic ring, an element selected from nitrogen, oxygen, sulfur, phosphorous, and silicon, besides carbon, may be contained. The condensed ring and the alicyclic ring may further condense with another ring.

The compound represented by General Formula (1) exhibits high emission quantum yield and is small in the full width at half maximum of an emission spectrum, thus enabling both efficient color conversion and high color purity to be achieved. In addition, the compound represented by General Formula (1), by introducing an appropriate substituent to an appropriate position, enables various characteristics and properties such as emission efficiency, color purity, thermal stability, photostability, and dispersibility to be adjusted. A case in which at least one of $R^1$, $R^3$, $R^4$, and $R^6$ is a substituted or unsubstituted alkyl group, a substituted or unsubstituted aryl group, or a substituted or unsubstituted heteroaryl group exhibits better thermal stability and photostability compared with a case in which all $R^1$, $R^3$, $R^4$, and $R^6$ are hydrogens, for example.

When at least one of $R^1$, $R^3$, $R^4$, and $R^6$ is a substituted or unsubstituted alkyl group, the alkyl group is preferably a $C_{1-6}$ alkyl group such as a methyl group, an ethyl group, a n-propyl group, an isopropyl group, a n-butyl group, a sec-butyl group, a tert-butyl group, a pentyl group, or a hexyl group. In addition, this alkyl group is preferably a methyl group, an ethyl group, a n-propyl group, an isopropyl group, a n-butyl group, a sec-butyl group, or a tert-butyl group in view of being excellent in thermal stability. In view of preventing concentration quenching to improve fluorescence quantum yield, this alkyl group is more preferably a tert-butyl group, which is sterically bulky. In view of the easiness of synthesis and raw material availability, this alkyl group is also preferably a methyl group.

When at least one of $R^1$, $R^3$, $R^4$, and $R^6$ is a substituted or unsubstituted aryl group, the aryl group is preferably a phenyl group, a biphenyl group, a terphenyl group, or a naphthyl group, further preferably a phenyl group or a biphenyl group, and particularly preferably a phenyl group.

When at least one of $R^1$, $R^3$, $R^4$, and $R^6$ is a substituted or unsubstituted heteroaryl group, the heteroaryl group is preferably a pyridyl group, a quinolinyl group, or a thienyl group, further preferably a pyridyl group or a quinolinyl group, and particularly preferably a pyridyl group.

When all $R^1$, $R^3$, $R^4$, and $R^6$ may be the same as or different from each other and are substituted or unsubstituted alkyl groups, solubility to a binder resin or a solvent is favorable, which is preferred. In this case, the alkyl group is preferably a methyl group in view of the easiness of synthesis and raw material availability.

When all $R^1$, $R^3$, $R^4$, and $R^6$, which may be the same as or different from each other, are substituted or unsubstituted aryl groups or substituted or unsubstituted heteroaryl groups, better thermal stability and photostability are exhibited, which is preferred. In this case, all $R^1$, $R^3$, $R^4$, and $R^6$, which may be the same as or different from each other, are more preferably substituted or unsubstituted aryl groups.

Although some substituents improve a plurality of properties, substituents that exhibit sufficient performance in all are limited. In particular, it is difficult to achieve both high emission efficiency and high color purity. Given these circumstances, a plurality of kinds of substituents are introduced to the compound represented by General Formula (1), whereby a compound having a balance among emission characteristics, high color purity, and the like can be obtained.

In particular, when all $R^1$, $R^3$, $R^4$, and $R^6$, which may be the same as or different from each other, are substituted or unsubstituted aryl groups, a plurality of kinds of substituents are preferably introduced, such as $R^1 \neq R^4$, $R^3 \neq R^6$, $R^1 \neq R^3$, or $R^4 \neq R^6$. In this example, "≠" means that they are groups having different structures. $R^1 \neq R^4$ means that $R^1$ and $R^4$ are groups having different structures, for example. A plurality of kinds of substituents are introduced as described above, whereby an aryl group that has an influence on color purity and an aryl group that has an influence on emission efficiency can be simultaneously introduced, and fine adjustment can be made.

Among them, $R^1 \neq R^3$ or $R^4 \neq R^6$ is preferred in view of improving emission efficiency and color purity with a good balance. In this case, to the compound represented by General Formula (1), one or more aryl groups having an influence on color purity can be introduced to both pyrrole rings each, whereas an aryl group having an influence on emission efficiency can be introduced to any other position, and both of these properties can be improved to the maximum. In addition, when $R^1 \neq R^3$ or $R^4 \neq R^6$, in view of improving both heat resistance and color purity, more preferred are $R^1 = R^4$ and $R^3 = R^6$.

The aryl group that has an influence mainly on color purity is preferably an aryl group substituted by an electron donating group. The electron donating group is an atomic group that donates an electron to a substituted atomic group by the inductive effect and/or the resonance effect in the organic electron theory. Examples of the electron donating group include ones having a negative value as a substituent constant (σp (para)) of Hammett's Rule. The substituent constant (σp (para)) of Hammett's Rule can be cited from Kagaku Binran Kiso-Hen Revised 5th Edition (II, p. 380).

Specific examples of the electron donating group include an alkyl group (σp of a methyl group: −0.17), an alkoxy group (σp of a methoxy group=−0.27), and an amino group (σp of —$NH_2$=−0.66). In particular, a $C_{1-8}$ alkyl group or a $C_{1-8}$ alkoxy group is preferred, and more preferred are a methyl group, an ethyl group, a tert-butyl group, and a methoxy group. In view of dispersibility, a tert-butyl group and a methoxy group are particularly preferred; when these substituents are the electron donating group, quenching caused by the flocculation of molecules can be prevented in the compound represented by General Formula (1). Although the substitution position of the substituent is not limited to a particular position, the substituent is preferably bonded to the meta position or the para position relative to the position bonding to the pyrromethene skeleton, because the twist of bonding is required to be inhibited in order to increase the photostability of the compound represented by General Formula (1). Meanwhile, the aryl group that has an influence mainly on emission efficiency is preferably an aryl group having a bulky substituent such as a tert-butyl group, an adamantyl group, or a methoxy group.

When $R^1$, $R^3$, $R^4$, and $R^6$, which may be the same as or different from each other, are substituted or unsubstituted aryl groups, $R^1$, $R^3$, $R^4$, and $R^6$, which may be the same as or different from each other, are preferably substituted or unsubstituted phenyl groups. In this case, $R^1$, $R^3$, $R^4$, and $R^6$ are each more preferably selected from the following Ar-1 to Ar-6. In this case, examples of a preferred combination of $R^1$, $R^3$, $R^4$, and $R^6$ include, but are not limited to, combinations listed in Table 1-1 to Table 1-11.

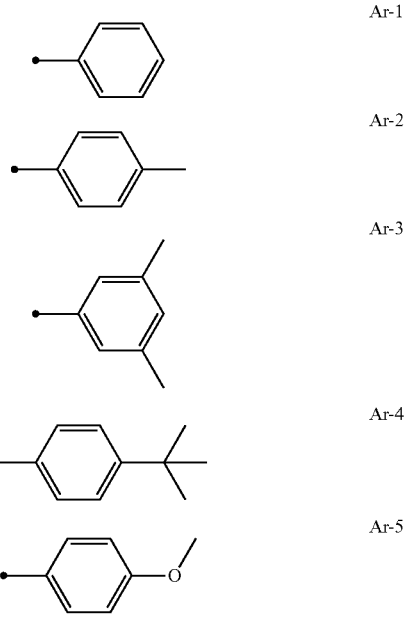

Ar-1

Ar-2

Ar-3

Ar-4

Ar-5

-continued

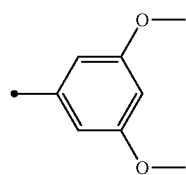
Ar-6

TABLE 1-1

| R1 | R3 | R4 | R6 | R1 | R3 | R4 | R6 |
|---|---|---|---|---|---|---|---|
| Ar-1 | Ar-1 | Ar-1 | Ar-1 | Ar-1 | Ar-1 | Ar-6 | Ar-1 |
| Ar-1 | Ar-1 | Ar-1 | Ar-2 | Ar-1 | Ar-1 | Ar-6 | Ar-2 |
| Ar-1 | Ar-1 | Ar-1 | Ar-3 | Ar-1 | Ar-1 | Ar-6 | Ar-3 |
| Ar-1 | Ar-1 | Ar-1 | Ar-4 | Ar-1 | Ar-1 | Ar-6 | Ar-4 |
| Ar-1 | Ar-1 | Ar-1 | Ar-5 | Ar-1 | Ar-1 | Ar-6 | Ar-5 |
| Ar-1 | Ar-1 | Ar-1 | Ar-6 | Ar-1 | Ar-1 | Ar-6 | Ar-6 |
| Ar-1 | Ar-1 | Ar-2 | Ar-1 | Ar-1 | Ar-2 | Ar-1 | Ar-1 |
| Ar-1 | Ar-1 | Ar-2 | Ar-2 | Ar-1 | Ar-2 | Ar-1 | Ar-2 |
| Ar-1 | Ar-1 | Ar-2 | Ar-3 | Ar-1 | Ar-2 | Ar-1 | Ar-3 |
| Ar-1 | Ar-1 | Ar-2 | Ar-4 | Ar-1 | Ar-2 | Ar-1 | Ar-4 |
| Ar-1 | Ar-1 | Ar-2 | Ar-5 | Ar-1 | Ar-2 | Ar-1 | Ar-5 |
| Ar-1 | Ar-1 | Ar-2 | Ar-6 | Ar-1 | Ar-2 | Ar-1 | Ar-6 |
| Ar-1 | Ar-1 | Ar-3 | Ar-1 | Ar-1 | Ar-2 | Ar-2 | Ar-1 |
| Ar-1 | Ar-1 | Ar-3 | Ar-2 | Ar-1 | Ar-2 | Ar-2 | Ar-2 |
| Ar-1 | Ar-1 | Ar-3 | Ar-3 | Ar-1 | Ar-2 | Ar-2 | Ar-3 |
| Ar-1 | Ar-1 | Ar-3 | Ar-4 | Ar-1 | Ar-2 | Ar-2 | Ar-4 |
| Ar-1 | Ar-1 | Ar-3 | Ar-5 | Ar-1 | Ar-2 | Ar-2 | Ar-5 |
| Ar-1 | Ar-1 | Ar-3 | Ar-6 | Ar-1 | Ar-2 | Ar-2 | Ar-6 |
| Ar-1 | Ar-1 | Ar-4 | Ar-1 | Ar-1 | Ar-2 | Ar-3 | Ar-1 |
| Ar-1 | Ar-1 | Ar-4 | Ar-2 | Ar-1 | Ar-2 | Ar-3 | Ar-2 |
| Ar-1 | Ar-1 | Ar-4 | Ar-3 | Ar-1 | Ar-2 | Ar-3 | Ar-3 |
| Ar-1 | Ar-1 | Ar-4 | Ar-4 | Ar-1 | Ar-2 | Ar-3 | Ar-4 |
| Ar-1 | Ar-1 | Ar-4 | Ar-5 | Ar-1 | Ar-2 | Ar-3 | Ar-5 |
| Ar-1 | Ar-1 | Ar-4 | Ar-6 | Ar-1 | Ar-2 | Ar-3 | Ar-6 |
| Ar-1 | Ar-1 | Ar-5 | Ar-1 | Ar-1 | Ar-2 | Ar-4 | Ar-1 |
| Ar-1 | Ar-1 | Ar-5 | Ar-2 | Ar-1 | Ar-2 | Ar-4 | Ar-2 |
| Ar-1 | Ar-1 | Ar-5 | Ar-3 | Ar-1 | Ar-2 | Ar-4 | Ar-3 |
| Ar-1 | Ar-1 | Ar-5 | Ar-4 | Ar-1 | Ar-2 | Ar-4 | Ar-4 |
| Ar-1 | Ar-1 | Ar-5 | Ar-5 | Ar-1 | Ar-2 | Ar-4 | Ar-5 |
| Ar-1 | Ar-1 | Ar-5 | Ar-6 | Ar-1 | Ar-2 | Ar-4 | Ar-6 |
| Ar-1 | Ar-1 | Ar-5 | Ar-6 | | | | |

TABLE 1-2

| R1 | R3 | R4 | R6 | R1 | R3 | R4 | R6 |
|---|---|---|---|---|---|---|---|
| Ar-1 | Ar-2 | Ar-5 | Ar-1 | Ar-1 | Ar-3 | Ar-4 | Ar-4 |
| Ar-1 | Ar-2 | Ar-5 | Ar-2 | Ar-1 | Ar-3 | Ar-4 | Ar-5 |
| Ar-1 | Ar-2 | Ar-5 | Ar-3 | Ar-1 | Ar-3 | Ar-4 | Ar-6 |
| Ar-1 | Ar-2 | Ar-5 | Ar-4 | Ar-1 | Ar-3 | Ar-5 | Ar-1 |
| Ar-1 | Ar-2 | Ar-5 | Ar-5 | Ar-1 | Ar-3 | Ar-5 | Ar-2 |
| Ar-1 | Ar-2 | Ar-5 | Ar-6 | Ar-1 | Ar-3 | Ar-5 | Ar-3 |
| Ar-1 | Ar-2 | Ar-6 | Ar-1 | Ar-1 | Ar-3 | Ar-5 | Ar-4 |
| Ar-1 | Ar-2 | Ar-6 | Ar-2 | Ar-1 | Ar-3 | Ar-5 | Ar-5 |
| Ar-1 | Ar-2 | Ar-6 | Ar-3 | Ar-1 | Ar-3 | Ar-5 | Ar-6 |
| Ar-1 | Ar-2 | Ar-6 | Ar-4 | Ar-1 | Ar-3 | Ar-6 | Ar-1 |
| Ar-1 | Ar-2 | Ar-6 | Ar-5 | Ar-1 | Ar-3 | Ar-6 | Ar-2 |
| Ar-1 | Ar-2 | Ar-6 | Ar-6 | Ar-1 | Ar-3 | Ar-6 | Ar-3 |
| Ar-1 | Ar-3 | Ar-1 | Ar-2 | Ar-1 | Ar-3 | Ar-6 | Ar-4 |
| Ar-1 | Ar-3 | Ar-1 | Ar-3 | Ar-1 | Ar-3 | Ar-6 | Ar-5 |
| Ar-1 | Ar-3 | Ar-1 | Ar-4 | Ar-1 | Ar-3 | Ar-6 | Ar-6 |
| Ar-1 | Ar-3 | Ar-1 | Ar-5 | Ar-1 | Ar-4 | Ar-1 | Ar-2 |
| Ar-1 | Ar-3 | Ar-1 | Ar-6 | Ar-1 | Ar-4 | Ar-1 | Ar-3 |
| Ar-1 | Ar-3 | Ar-2 | Ar-2 | Ar-1 | Ar-4 | Ar-1 | Ar-4 |
| Ar-1 | Ar-3 | Ar-2 | Ar-3 | Ar-1 | Ar-4 | Ar-1 | Ar-5 |
| Ar-1 | Ar-3 | Ar-2 | Ar-4 | Ar-1 | Ar-4 | Ar-1 | Ar-6 |
| Ar-1 | Ar-3 | Ar-2 | Ar-5 | Ar-1 | Ar-4 | Ar-2 | Ar-2 |
| Ar-1 | Ar-3 | Ar-2 | Ar-6 | Ar-1 | Ar-4 | Ar-2 | Ar-3 |
| Ar-1 | Ar-3 | Ar-3 | Ar-2 | Ar-1 | Ar-4 | Ar-2 | Ar-4 |
| Ar-1 | Ar-3 | Ar-3 | Ar-3 | Ar-1 | Ar-4 | Ar-2 | Ar-5 |
| Ar-1 | Ar-3 | Ar-3 | Ar-4 | Ar-1 | Ar-4 | Ar-3 | Ar-2 |
| Ar-1 | Ar-3 | Ar-3 | Ar-5 | Ar-1 | Ar-4 | Ar-3 | Ar-3 |

TABLE 1-2-continued

| R1 | R3 | R4 | R6 | R1 | R3 | R4 | R6 |
|---|---|---|---|---|---|---|---|
| Ar-1 | Ar-3 | Ar-3 | Ar-6 | Ar-1 | Ar-4 | Ar-3 | Ar-4 |
| Ar-1 | Ar-3 | Ar-4 | Ar-1 | Ar-1 | Ar-4 | Ar-3 | Ar-5 |
| Ar-1 | Ar-3 | Ar-4 | Ar-2 | Ar-1 | Ar-4 | Ar-3 | Ar-6 |
| Ar-1 | Ar-3 | Ar-4 | Ar-3 | | | | |

TABLE 1-3

| R1 | R3 | R4 | R6 | R1 | R3 | R4 | R6 |
|---|---|---|---|---|---|---|---|
| Ar-1 | Ar-4 | Ar-4 | Ar-1 | Ar-1 | Ar-5 | Ar-3 | Ar-4 |
| Ar-1 | Ar-4 | Ar-4 | Ar-2 | Ar-1 | Ar-5 | Ar-3 | Ar-5 |
| Ar-1 | Ar-4 | Ar-4 | Ar-3 | Ar-1 | Ar-5 | Ar-3 | Ar-6 |
| Ar-1 | Ar-4 | Ar-4 | Ar-4 | Ar-1 | Ar-5 | Ar-4 | Ar-2 |
| Ar-1 | Ar-4 | Ar-4 | Ar-5 | Ar-1 | Ar-5 | Ar-4 | Ar-3 |
| Ar-1 | Ar-4 | Ar-4 | Ar-6 | Ar-1 | Ar-5 | Ar-4 | Ar-4 |
| Ar-1 | Ar-4 | Ar-5 | Ar-1 | Ar-1 | Ar-5 | Ar-4 | Ar-5 |
| Ar-1 | Ar-4 | Ar-5 | Ar-2 | Ar-1 | Ar-5 | Ar-4 | Ar-6 |
| Ar-1 | Ar-4 | Ar-5 | Ar-3 | Ar-1 | Ar-5 | Ar-5 | Ar-1 |
| Ar-1 | Ar-4 | Ar-5 | Ar-4 | Ar-1 | Ar-5 | Ar-5 | Ar-2 |
| Ar-1 | Ar-4 | Ar-5 | Ar-5 | Ar-1 | Ar-5 | Ar-5 | Ar-3 |
| Ar-1 | Ar-4 | Ar-5 | Ar-6 | Ar-1 | Ar-5 | Ar-5 | Ar-4 |
| Ar-1 | Ar-4 | Ar-6 | Ar-1 | Ar-1 | Ar-5 | Ar-5 | Ar-5 |
| Ar-1 | Ar-4 | Ar-6 | Ar-2 | Ar-1 | Ar-5 | Ar-5 | Ar-6 |
| Ar-1 | Ar-4 | Ar-6 | Ar-3 | Ar-1 | Ar-5 | Ar-6 | Ar-1 |
| Ar-1 | Ar-4 | Ar-6 | Ar-4 | Ar-1 | Ar-5 | Ar-6 | Ar-2 |
| Ar-1 | Ar-4 | Ar-6 | Ar-5 | Ar-1 | Ar-5 | Ar-6 | Ar-3 |
| Ar-1 | Ar-4 | Ar-6 | Ar-6 | Ar-1 | Ar-5 | Ar-6 | Ar-4 |
| Ar-1 | Ar-5 | Ar-1 | Ar-2 | Ar-1 | Ar-5 | Ar-6 | Ar-5 |
| Ar-1 | Ar-5 | Ar-1 | Ar-3 | Ar-1 | Ar-5 | Ar-6 | Ar-6 |
| Ar-1 | Ar-5 | Ar-1 | Ar-4 | Ar-1 | Ar-6 | Ar-1 | Ar-2 |
| Ar-1 | Ar-5 | Ar-1 | Ar-5 | Ar-1 | Ar-6 | Ar-1 | Ar-3 |
| Ar-1 | Ar-5 | Ar-1 | Ar-6 | Ar-1 | Ar-6 | Ar-1 | Ar-4 |
| Ar-1 | Ar-5 | Ar-2 | Ar-2 | Ar-1 | Ar-6 | Ar-1 | Ar-5 |
| Ar-1 | Ar-5 | Ar-2 | Ar-3 | Ar-1 | Ar-6 | Ar-1 | Ar-6 |
| Ar-1 | Ar-5 | Ar-2 | Ar-4 | Ar-1 | Ar-6 | Ar-2 | Ar-2 |
| Ar-1 | Ar-5 | Ar-2 | Ar-5 | Ar-1 | Ar-6 | Ar-2 | Ar-3 |
| Ar-1 | Ar-5 | Ar-2 | Ar-6 | Ar-1 | Ar-6 | Ar-2 | Ar-4 |
| Ar-1 | Ar-5 | Ar-3 | Ar-2 | Ar-1 | Ar-6 | Ar-2 | Ar-5 |
| Ar-1 | Ar-5 | Ar-3 | Ar-3 | Ar-1 | Ar-6 | Ar-2 | Ar-6 |

TABLE 1-4

| R1 | R3 | R4 | R6 | R1 | R3 | R4 | R6 |
|---|---|---|---|---|---|---|---|
| Ar-1 | Ar-6 | Ar-3 | Ar-2 | Ar-2 | Ar-1 | Ar-2 | Ar-6 |
| Ar-1 | Ar-6 | Ar-3 | Ar-3 | Ar-2 | Ar-1 | Ar-3 | Ar-2 |
| Ar-1 | Ar-6 | Ar-3 | Ar-4 | Ar-2 | Ar-1 | Ar-3 | Ar-3 |
| Ar-1 | Ar-6 | Ar-3 | Ar-5 | Ar-2 | Ar-1 | Ar-3 | Ar-4 |
| Ar-1 | Ar-6 | Ar-3 | Ar-6 | Ar-2 | Ar-1 | Ar-3 | Ar-5 |
| Ar-1 | Ar-6 | Ar-4 | Ar-2 | Ar-2 | Ar-1 | Ar-3 | Ar-6 |
| Ar-1 | Ar-6 | Ar-4 | Ar-3 | Ar-2 | Ar-1 | Ar-4 | Ar-2 |
| Ar-1 | Ar-6 | Ar-4 | Ar-4 | Ar-2 | Ar-1 | Ar-4 | Ar-3 |
| Ar-1 | Ar-6 | Ar-4 | Ar-5 | Ar-2 | Ar-1 | Ar-4 | Ar-4 |
| Ar-1 | Ar-6 | Ar-4 | Ar-6 | Ar-2 | Ar-1 | Ar-4 | Ar-5 |
| Ar-1 | Ar-6 | Ar-5 | Ar-2 | Ar-2 | Ar-1 | Ar-4 | Ar-6 |
| Ar-1 | Ar-6 | Ar-5 | Ar-3 | Ar-2 | Ar-1 | Ar-5 | Ar-2 |
| Ar-1 | Ar-6 | Ar-5 | Ar-4 | Ar-2 | Ar-1 | Ar-5 | Ar-3 |
| Ar-1 | Ar-6 | Ar-5 | Ar-5 | Ar-2 | Ar-1 | Ar-5 | Ar-4 |
| Ar-1 | Ar-6 | Ar-5 | Ar-6 | Ar-2 | Ar-1 | Ar-5 | Ar-5 |
| Ar-1 | Ar-6 | Ar-6 | Ar-1 | Ar-2 | Ar-1 | Ar-5 | Ar-6 |
| Ar-1 | Ar-6 | Ar-6 | Ar-2 | Ar-2 | Ar-1 | Ar-6 | Ar-2 |
| Ar-1 | Ar-6 | Ar-6 | Ar-3 | Ar-2 | Ar-1 | Ar-6 | Ar-3 |
| Ar-1 | Ar-6 | Ar-6 | Ar-4 | Ar-2 | Ar-1 | Ar-6 | Ar-4 |
| Ar-1 | Ar-6 | Ar-6 | Ar-5 | Ar-2 | Ar-1 | Ar-6 | Ar-5 |
| Ar-1 | Ar-6 | Ar-6 | Ar-6 | Ar-2 | Ar-1 | Ar-6 | Ar-6 |
| Ar-2 | Ar-1 | Ar-1 | Ar-2 | Ar-2 | Ar-2 | Ar-1 | Ar-3 |
| Ar-2 | Ar-1 | Ar-1 | Ar-3 | Ar-2 | Ar-2 | Ar-1 | Ar-4 |
| Ar-2 | Ar-1 | Ar-1 | Ar-4 | Ar-2 | Ar-2 | Ar-1 | Ar-5 |
| Ar-2 | Ar-1 | Ar-1 | Ar-5 | Ar-2 | Ar-2 | Ar-1 | Ar-6 |
| Ar-2 | Ar-1 | Ar-1 | Ar-6 | Ar-2 | Ar-2 | Ar-2 | Ar-2 |
| Ar-2 | Ar-1 | Ar-2 | Ar-2 | Ar-2 | Ar-2 | Ar-2 | Ar-3 |

TABLE 1-4-continued

| R1 | R3 | R4 | R6 | R1 | R3 | R4 | R6 |
|---|---|---|---|---|---|---|---|
| Ar-2 | Ar-1 | Ar-2 | Ar-3 | Ar-2 | Ar-2 | Ar-2 | Ar-4 |
| Ar-2 | Ar-1 | Ar-2 | Ar-4 | Ar-2 | Ar-2 | Ar-2 | Ar-5 |
| Ar-2 | Ar-1 | Ar-2 | Ar-5 | Ar-2 | Ar-2 | Ar-2 | Ar-6 |

TABLE 1-5

| R1 | R3 | R4 | R6 | R1 | R3 | R4 | R6 |
|---|---|---|---|---|---|---|---|
| Ar-2 | Ar-2 | Ar-3 | Ar-2 | Ar-2 | Ar-3 | Ar-3 | Ar-4 |
| Ar-2 | Ar-2 | Ar-3 | Ar-3 | Ar-2 | Ar-3 | Ar-3 | Ar-5 |
| Ar-2 | Ar-2 | Ar-3 | Ar-4 | Ar-2 | Ar-3 | Ar-3 | Ar-6 |
| Ar-2 | Ar-2 | Ar-3 | Ar-5 | Ar-2 | Ar-3 | Ar-4 | Ar-2 |
| Ar-2 | Ar-2 | Ar-3 | Ar-6 | Ar-2 | Ar-3 | Ar-4 | Ar-3 |
| Ar-2 | Ar-2 | Ar-4 | Ar-2 | Ar-2 | Ar-3 | Ar-4 | Ar-4 |
| Ar-2 | Ar-2 | Ar-4 | Ar-3 | Ar-2 | Ar-3 | Ar-4 | Ar-5 |
| Ar-2 | Ar-2 | Ar-4 | Ar-4 | Ar-2 | Ar-3 | Ar-4 | Ar-6 |
| Ar-2 | Ar-2 | Ar-4 | Ar-5 | Ar-2 | Ar-3 | Ar-5 | Ar-2 |
| Ar-2 | Ar-2 | Ar-4 | Ar-6 | Ar-2 | Ar-3 | Ar-5 | Ar-3 |
| Ar-2 | Ar-2 | Ar-5 | Ar-2 | Ar-2 | Ar-3 | Ar-5 | Ar-4 |
| Ar-2 | Ar-2 | Ar-5 | Ar-3 | Ar-2 | Ar-3 | Ar-5 | Ar-5 |
| Ar-2 | Ar-2 | Ar-5 | Ar-4 | Ar-2 | Ar-3 | Ar-5 | Ar-6 |
| Ar-2 | Ar-2 | Ar-5 | Ar-5 | Ar-2 | Ar-3 | Ar-6 | Ar-2 |
| Ar-2 | Ar-2 | Ar-5 | Ar-6 | Ar-2 | Ar-3 | Ar-6 | Ar-3 |
| Ar-2 | Ar-2 | Ar-6 | Ar-2 | Ar-2 | Ar-3 | Ar-6 | Ar-4 |
| Ar-2 | Ar-2 | Ar-6 | Ar-3 | Ar-2 | Ar-3 | Ar-6 | Ar-5 |
| Ar-2 | Ar-2 | Ar-6 | Ar-4 | Ar-2 | Ar-3 | Ar-6 | Ar-6 |
| Ar-2 | Ar-2 | Ar-6 | Ar-5 | Ar-2 | Ar-4 | Ar-1 | Ar-3 |
| Ar-2 | Ar-2 | Ar-6 | Ar-6 | Ar-2 | Ar-4 | Ar-1 | Ar-4 |
| Ar-2 | Ar-3 | Ar-1 | Ar-3 | Ar-2 | Ar-4 | Ar-1 | Ar-5 |
| Ar-2 | Ar-3 | Ar-1 | Ar-4 | Ar-2 | Ar-4 | Ar-1 | Ar-6 |
| Ar-2 | Ar-3 | Ar-1 | Ar-5 | Ar-2 | Ar-4 | Ar-2 | Ar-3 |
| Ar-2 | Ar-3 | Ar-1 | Ar-6 | Ar-2 | Ar-4 | Ar-2 | Ar-4 |
| Ar-2 | Ar-3 | Ar-2 | Ar-3 | Ar-2 | Ar-4 | Ar-2 | Ar-5 |
| Ar-2 | Ar-3 | Ar-2 | Ar-4 | Ar-2 | Ar-4 | Ar-2 | Ar-6 |
| Ar-2 | Ar-3 | Ar-2 | Ar-5 | Ar-2 | Ar-4 | Ar-3 | Ar-3 |
| Ar-2 | Ar-3 | Ar-2 | Ar-6 | Ar-2 | Ar-4 | Ar-3 | Ar-4 |
| Ar-2 | Ar-3 | Ar-3 | Ar-2 | Ar-2 | Ar-4 | Ar-3 | Ar-5 |
| Ar-2 | Ar-3 | Ar-3 | Ar-3 | Ar-2 | Ar-4 | Ar-3 | Ar-6 |

TABLE 1-6

| R1 | R3 | R4 | R6 | R1 | R3 | R4 | R6 |
|---|---|---|---|---|---|---|---|
| Ar-2 | Ar-4 | Ar-4 | Ar-2 | Ar-2 | Ar-5 | Ar-5 | Ar-2 |
| Ar-2 | Ar-4 | Ar-4 | Ar-3 | Ar-2 | Ar-5 | Ar-5 | Ar-3 |
| Ar-2 | Ar-4 | Ar-4 | Ar-4 | Ar-2 | Ar-5 | Ar-5 | Ar-4 |
| Ar-2 | Ar-4 | Ar-4 | Ar-5 | Ar-2 | Ar-5 | Ar-5 | Ar-5 |
| Ar-2 | Ar-4 | Ar-4 | Ar-6 | Ar-2 | Ar-5 | Ar-5 | Ar-6 |
| Ar-2 | Ar-4 | Ar-5 | Ar-2 | Ar-2 | Ar-5 | Ar-6 | Ar-2 |
| Ar-2 | Ar-4 | Ar-5 | Ar-3 | Ar-2 | Ar-5 | Ar-6 | Ar-3 |
| Ar-2 | Ar-4 | Ar-5 | Ar-4 | Ar-2 | Ar-5 | Ar-6 | Ar-4 |
| Ar-2 | Ar-4 | Ar-5 | Ar-5 | Ar-2 | Ar-5 | Ar-6 | Ar-5 |
| Ar-2 | Ar-4 | Ar-5 | Ar-6 | Ar-2 | Ar-5 | Ar-6 | Ar-6 |
| Ar-2 | Ar-4 | Ar-6 | Ar-2 | Ar-2 | Ar-6 | Ar-1 | Ar-3 |
| Ar-2 | Ar-4 | Ar-6 | Ar-3 | Ar-2 | Ar-6 | Ar-1 | Ar-4 |
| Ar-2 | Ar-4 | Ar-6 | Ar-4 | Ar-2 | Ar-6 | Ar-1 | Ar-5 |
| Ar-2 | Ar-4 | Ar-6 | Ar-5 | Ar-2 | Ar-6 | Ar-1 | Ar-6 |
| Ar-2 | Ar-4 | Ar-6 | Ar-6 | Ar-2 | Ar-6 | Ar-2 | Ar-3 |
| Ar-2 | Ar-5 | Ar-1 | Ar-3 | Ar-2 | Ar-6 | Ar-2 | Ar-4 |
| Ar-2 | Ar-5 | Ar-1 | Ar-4 | Ar-2 | Ar-6 | Ar-2 | Ar-5 |
| Ar-2 | Ar-5 | Ar-1 | Ar-5 | Ar-2 | Ar-6 | Ar-2 | Ar-6 |
| Ar-2 | Ar-5 | Ar-1 | Ar-6 | Ar-2 | Ar-6 | Ar-3 | Ar-3 |
| Ar-2 | Ar-5 | Ar-2 | Ar-3 | Ar-2 | Ar-6 | Ar-3 | Ar-4 |
| Ar-2 | Ar-5 | Ar-2 | Ar-4 | Ar-2 | Ar-6 | Ar-3 | Ar-5 |
| Ar-2 | Ar-5 | Ar-2 | Ar-5 | Ar-2 | Ar-6 | Ar-3 | Ar-6 |
| Ar-2 | Ar-5 | Ar-2 | Ar-6 | Ar-2 | Ar-6 | Ar-4 | Ar-3 |
| Ar-2 | Ar-5 | Ar-3 | Ar-3 | Ar-2 | Ar-6 | Ar-4 | Ar-4 |
| Ar-2 | Ar-5 | Ar-3 | Ar-4 | Ar-2 | Ar-6 | Ar-4 | Ar-5 |
| Ar-2 | Ar-5 | Ar-3 | Ar-5 | Ar-2 | Ar-6 | Ar-4 | Ar-6 |
| Ar-2 | Ar-5 | Ar-3 | Ar-6 | Ar-2 | Ar-6 | Ar-5 | Ar-4 |
| Ar-2 | Ar-5 | Ar-4 | Ar-3 | Ar-2 | Ar-6 | Ar-5 | Ar-5 |

TABLE 1-6-continued

| R1 | R3 | R4 | R6 | R1 | R3 | R4 | R6 |
|---|---|---|---|---|---|---|---|
| Ar-2 | Ar-5 | Ar-4 | Ar-4 | Ar-2 | Ar-6 | Ar-5 | Ar-5 |
| Ar-2 | Ar-5 | Ar-4 | Ar-5 | Ar-2 | Ar-6 | Ar-5 | Ar-6 |
| Ar-2 | Ar-5 | Ar-4 | Ar-6 | | | | |

TABLE 1-7

| R1 | R3 | R4 | R6 | R1 | R3 | R4 | R6 |
|---|---|---|---|---|---|---|---|
| Ar-2 | Ar-6 | Ar-6 | Ar-2 | Ar-3 | Ar-2 | Ar-1 | Ar-6 |
| Ar-2 | Ar-6 | Ar-6 | Ar-3 | Ar-3 | Ar-2 | Ar-2 | Ar-3 |
| Ar-2 | Ar-6 | Ar-6 | Ar-4 | Ar-3 | Ar-2 | Ar-2 | Ar-4 |
| Ar-2 | Ar-6 | Ar-6 | Ar-5 | Ar-3 | Ar-2 | Ar-2 | Ar-5 |
| Ar-2 | Ar-6 | Ar-6 | Ar-6 | Ar-3 | Ar-2 | Ar-2 | Ar-6 |
| Ar-3 | Ar-1 | Ar-1 | Ar-3 | Ar-3 | Ar-2 | Ar-3 | Ar-3 |
| Ar-3 | Ar-1 | Ar-1 | Ar-4 | Ar-3 | Ar-2 | Ar-3 | Ar-4 |
| Ar-3 | Ar-1 | Ar-1 | Ar-5 | Ar-3 | Ar-2 | Ar-3 | Ar-5 |
| Ar-3 | Ar-1 | Ar-1 | Ar-6 | Ar-3 | Ar-2 | Ar-3 | Ar-6 |
| Ar-3 | Ar-1 | Ar-2 | Ar-3 | Ar-3 | Ar-2 | Ar-4 | Ar-3 |
| Ar-3 | Ar-1 | Ar-2 | Ar-4 | Ar-3 | Ar-2 | Ar-4 | Ar-4 |
| Ar-3 | Ar-1 | Ar-2 | Ar-5 | Ar-3 | Ar-2 | Ar-4 | Ar-5 |
| Ar-3 | Ar-1 | Ar-2 | Ar-6 | Ar-3 | Ar-2 | Ar-4 | Ar-6 |
| Ar-3 | Ar-1 | Ar-3 | Ar-3 | Ar-3 | Ar-2 | Ar-5 | Ar-3 |
| Ar-3 | Ar-1 | Ar-3 | Ar-4 | Ar-3 | Ar-2 | Ar-5 | Ar-4 |
| Ar-3 | Ar-1 | Ar-3 | Ar-5 | Ar-3 | Ar-2 | Ar-5 | Ar-5 |
| Ar-3 | Ar-1 | Ar-3 | Ar-6 | Ar-3 | Ar-2 | Ar-5 | Ar-6 |
| Ar-3 | Ar-1 | Ar-4 | Ar-3 | Ar-3 | Ar-2 | Ar-6 | Ar-3 |
| Ar-3 | Ar-1 | Ar-4 | Ar-4 | Ar-3 | Ar-2 | Ar-6 | Ar-4 |
| Ar-3 | Ar-1 | Ar-4 | Ar-5 | Ar-3 | Ar-2 | Ar-6 | Ar-5 |
| Ar-3 | Ar-1 | Ar-4 | Ar-6 | Ar-3 | Ar-2 | Ar-6 | Ar-6 |
| Ar-3 | Ar-1 | Ar-5 | Ar-3 | Ar-3 | Ar-3 | Ar-1 | Ar-4 |
| Ar-3 | Ar-1 | Ar-5 | Ar-4 | Ar-3 | Ar-3 | Ar-1 | Ar-5 |
| Ar-3 | Ar-1 | Ar-5 | Ar-5 | Ar-3 | Ar-3 | Ar-1 | Ar-6 |
| Ar-3 | Ar-1 | Ar-5 | Ar-6 | Ar-3 | Ar-3 | Ar-2 | Ar-4 |
| Ar-3 | Ar-1 | Ar-6 | Ar-3 | Ar-3 | Ar-3 | Ar-2 | Ar-5 |
| Ar-3 | Ar-1 | Ar-6 | Ar-4 | Ar-3 | Ar-3 | Ar-2 | Ar-6 |
| Ar-3 | Ar-1 | Ar-6 | Ar-5 | Ar-3 | Ar-3 | Ar-3 | Ar-3 |
| Ar-3 | Ar-1 | Ar-6 | Ar-6 | Ar-3 | Ar-3 | Ar-3 | Ar-4 |
| Ar-3 | Ar-2 | Ar-1 | Ar-4 | Ar-3 | Ar-3 | Ar-3 | Ar-5 |
| Ar-3 | Ar-2 | Ar-1 | Ar-5 | | | | |

TABLE 1-8

| R1 | R3 | R4 | R6 | R1 | R3 | R4 | R6 |
|---|---|---|---|---|---|---|---|
| Ar-3 | Ar-3 | Ar-3 | Ar-6 | Ar-3 | Ar-4 | Ar-6 | Ar-3 |
| Ar-3 | Ar-3 | Ar-4 | Ar-3 | Ar-3 | Ar-4 | Ar-6 | Ar-4 |
| Ar-3 | Ar-3 | Ar-4 | Ar-4 | Ar-3 | Ar-4 | Ar-6 | Ar-5 |
| Ar-3 | Ar-3 | Ar-4 | Ar-5 | Ar-3 | Ar-4 | Ar-6 | Ar-6 |
| Ar-3 | Ar-3 | Ar-4 | Ar-6 | Ar-3 | Ar-5 | Ar-1 | Ar-4 |
| Ar-3 | Ar-3 | Ar-5 | Ar-3 | Ar-3 | Ar-5 | Ar-1 | Ar-5 |
| Ar-3 | Ar-3 | Ar-5 | Ar-4 | Ar-3 | Ar-5 | Ar-1 | Ar-6 |
| Ar-3 | Ar-3 | Ar-5 | Ar-5 | Ar-3 | Ar-5 | Ar-2 | Ar-4 |
| Ar-3 | Ar-3 | Ar-5 | Ar-6 | Ar-3 | Ar-5 | Ar-2 | Ar-5 |
| Ar-3 | Ar-3 | Ar-6 | Ar-3 | Ar-3 | Ar-5 | Ar-2 | Ar-6 |
| Ar-3 | Ar-3 | Ar-6 | Ar-4 | Ar-3 | Ar-5 | Ar-3 | Ar-4 |
| Ar-3 | Ar-3 | Ar-6 | Ar-5 | Ar-3 | Ar-5 | Ar-3 | Ar-5 |
| Ar-3 | Ar-3 | Ar-6 | Ar-6 | Ar-3 | Ar-5 | Ar-3 | Ar-6 |
| Ar-3 | Ar-4 | Ar-1 | Ar-4 | Ar-3 | Ar-5 | Ar-4 | Ar-4 |
| Ar-3 | Ar-4 | Ar-1 | Ar-5 | Ar-3 | Ar-5 | Ar-4 | Ar-5 |
| Ar-3 | Ar-4 | Ar-1 | Ar-6 | Ar-3 | Ar-5 | Ar-4 | Ar-6 |
| Ar-3 | Ar-4 | Ar-2 | Ar-4 | Ar-3 | Ar-5 | Ar-5 | Ar-3 |
| Ar-3 | Ar-4 | Ar-2 | Ar-5 | Ar-3 | Ar-5 | Ar-5 | Ar-4 |
| Ar-3 | Ar-4 | Ar-2 | Ar-6 | Ar-3 | Ar-5 | Ar-5 | Ar-5 |
| Ar-3 | Ar-4 | Ar-3 | Ar-4 | Ar-3 | Ar-5 | Ar-5 | Ar-6 |
| Ar-3 | Ar-4 | Ar-3 | Ar-5 | Ar-3 | Ar-5 | Ar-6 | Ar-3 |
| Ar-3 | Ar-4 | Ar-3 | Ar-6 | Ar-3 | Ar-5 | Ar-6 | Ar-4 |
| Ar-3 | Ar-4 | Ar-4 | Ar-4 | Ar-3 | Ar-5 | Ar-6 | Ar-5 |
| Ar-3 | Ar-4 | Ar-4 | Ar-5 | Ar-3 | Ar-5 | Ar-6 | Ar-6 |
| Ar-3 | Ar-4 | Ar-4 | Ar-6 | Ar-3 | Ar-6 | Ar-1 | Ar-4 |
| Ar-3 | Ar-4 | Ar-5 | Ar-3 | Ar-3 | Ar-6 | Ar-1 | Ar-5 |
| Ar-3 | Ar-4 | Ar-5 | Ar-4 | Ar-3 | Ar-6 | Ar-1 | Ar-6 |

TABLE 1-8-continued

| R1 | R3 | R4 | R6 | R1 | R3 | R4 | R6 |
|---|---|---|---|---|---|---|---|
| Ar-3 | Ar-4 | Ar-5 | Ar-4 | Ar-3 | Ar-6 | Ar-2 | Ar-4 |
| Ar-3 | Ar-4 | Ar-5 | Ar-5 | Ar-3 | Ar-6 | Ar-2 | Ar-5 |
| Ar-3 | Ar-4 | Ar-5 | Ar-6 | Ar-3 | Ar-6 | Ar-2 | Ar-6 |

TABLE 1-9

| R1 | R3 | R4 | R6 | R1 | R3 | R4 | R6 |
|---|---|---|---|---|---|---|---|
| Ar-3 | Ar-6 | Ar-3 | Ar-4 | Ar-4 | Ar-2 | Ar-1 | Ar-5 |
| Ar-3 | Ar-6 | Ar-3 | Ar-5 | Ar-4 | Ar-2 | Ar-1 | Ar-6 |
| Ar-3 | Ar-6 | Ar-3 | Ar-6 | Ar-4 | Ar-2 | Ar-2 | Ar-4 |
| Ar-3 | Ar-6 | Ar-4 | Ar-4 | Ar-4 | Ar-2 | Ar-2 | Ar-5 |
| Ar-3 | Ar-6 | Ar-4 | Ar-5 | Ar-4 | Ar-2 | Ar-2 | Ar-6 |
| Ar-3 | Ar-6 | Ar-4 | Ar-6 | Ar-4 | Ar-2 | Ar-3 | Ar-4 |
| Ar-3 | Ar-6 | Ar-5 | Ar-4 | Ar-4 | Ar-2 | Ar-3 | Ar-5 |
| Ar-3 | Ar-6 | Ar-5 | Ar-5 | Ar-4 | Ar-2 | Ar-3 | Ar-6 |
| Ar-3 | Ar-6 | Ar-5 | Ar-6 | Ar-4 | Ar-2 | Ar-4 | Ar-4 |
| Ar-3 | Ar-6 | Ar-6 | Ar-3 | Ar-4 | Ar-2 | Ar-4 | Ar-5 |
| Ar-3 | Ar-6 | Ar-6 | Ar-4 | Ar-4 | Ar-2 | Ar-4 | Ar-6 |
| Ar-3 | Ar-6 | Ar-6 | Ar-5 | Ar-4 | Ar-2 | Ar-5 | Ar-4 |
| Ar-3 | Ar-6 | Ar-6 | Ar-6 | Ar-4 | Ar-2 | Ar-5 | Ar-5 |
| Ar-4 | Ar-1 | Ar-1 | Ar-4 | Ar-4 | Ar-2 | Ar-5 | Ar-6 |
| Ar-4 | Ar-1 | Ar-1 | Ar-5 | Ar-4 | Ar-2 | Ar-6 | Ar-4 |
| Ar-4 | Ar-1 | Ar-1 | Ar-6 | Ar-4 | Ar-2 | Ar-6 | Ar-5 |
| Ar-4 | Ar-1 | Ar-2 | Ar-4 | Ar-4 | Ar-2 | Ar-6 | Ar-6 |
| Ar-4 | Ar-1 | Ar-2 | Ar-5 | Ar-4 | Ar-3 | Ar-1 | Ar-5 |
| Ar-4 | Ar-1 | Ar-2 | Ar-6 | Ar-4 | Ar-3 | Ar-1 | Ar-6 |
| Ar-4 | Ar-1 | Ar-3 | Ar-4 | Ar-4 | Ar-3 | Ar-2 | Ar-5 |
| Ar-4 | Ar-1 | Ar-3 | Ar-5 | Ar-4 | Ar-3 | Ar-2 | Ar-6 |
| Ar-4 | Ar-1 | Ar-3 | Ar-6 | Ar-4 | Ar-3 | Ar-3 | Ar-4 |
| Ar-4 | Ar-1 | Ar-4 | Ar-4 | Ar-4 | Ar-3 | Ar-3 | Ar-5 |
| Ar-4 | Ar-1 | Ar-4 | Ar-5 | Ar-4 | Ar-3 | Ar-3 | Ar-6 |
| Ar-4 | Ar-1 | Ar-4 | Ar-6 | Ar-4 | Ar-3 | Ar-4 | Ar-4 |
| Ar-4 | Ar-1 | Ar-5 | Ar-4 | Ar-4 | Ar-3 | Ar-4 | Ar-5 |
| Ar-4 | Ar-1 | Ar-5 | Ar-5 | Ar-4 | Ar-3 | Ar-4 | Ar-6 |
| Ar-4 | Ar-1 | Ar-5 | Ar-6 | Ar-4 | Ar-3 | Ar-5 | Ar-4 |
| Ar-4 | Ar-1 | Ar-6 | Ar-4 | Ar-4 | Ar-3 | Ar-5 | Ar-5 |
| Ar-4 | Ar-1 | Ar-6 | Ar-5 | Ar-4 | Ar-3 | Ar-5 | Ar-6 |
| Ar-4 | Ar-1 | Ar-6 | Ar-6 | | | | |

TABLE 1-10

| R1 | R3 | R4 | R6 | R1 | R3 | R4 | R6 |
|---|---|---|---|---|---|---|---|
| Ar-4 | Ar-3 | Ar-6 | Ar-4 | Ar-4 | Ar-5 | Ar-6 | Ar-6 |
| Ar-4 | Ar-3 | Ar-6 | Ar-5 | Ar-4 | Ar-6 | Ar-1 | Ar-5 |
| Ar-4 | Ar-3 | Ar-6 | Ar-6 | Ar-4 | Ar-6 | Ar-1 | Ar-6 |
| Ar-4 | Ar-4 | Ar-1 | Ar-5 | Ar-4 | Ar-6 | Ar-2 | Ar-5 |
| Ar-4 | Ar-4 | Ar-1 | Ar-6 | Ar-4 | Ar-6 | Ar-2 | Ar-6 |
| Ar-4 | Ar-4 | Ar-2 | Ar-5 | Ar-4 | Ar-6 | Ar-3 | Ar-5 |
| Ar-4 | Ar-4 | Ar-2 | Ar-6 | Ar-4 | Ar-6 | Ar-3 | Ar-6 |
| Ar-4 | Ar-4 | Ar-3 | Ar-5 | Ar-4 | Ar-6 | Ar-4 | Ar-5 |
| Ar-4 | Ar-4 | Ar-3 | Ar-6 | Ar-4 | Ar-6 | Ar-4 | Ar-6 |
| Ar-4 | Ar-4 | Ar-4 | Ar-4 | Ar-4 | Ar-6 | Ar-5 | Ar-5 |
| Ar-4 | Ar-4 | Ar-4 | Ar-5 | Ar-4 | Ar-6 | Ar-5 | Ar-6 |
| Ar-4 | Ar-4 | Ar-4 | Ar-6 | Ar-4 | Ar-6 | Ar-6 | Ar-4 |
| Ar-4 | Ar-4 | Ar-5 | Ar-4 | Ar-4 | Ar-6 | Ar-6 | Ar-5 |
| Ar-4 | Ar-4 | Ar-5 | Ar-5 | Ar-4 | Ar-6 | Ar-6 | Ar-6 |
| Ar-4 | Ar-4 | Ar-5 | Ar-6 | Ar-5 | Ar-1 | Ar-1 | Ar-5 |
| Ar-4 | Ar-4 | Ar-6 | Ar-4 | Ar-5 | Ar-1 | Ar-1 | Ar-6 |
| Ar-4 | Ar-4 | Ar-6 | Ar-5 | Ar-5 | Ar-1 | Ar-2 | Ar-5 |
| Ar-4 | Ar-4 | Ar-6 | Ar-6 | Ar-5 | Ar-1 | Ar-2 | Ar-6 |
| Ar-4 | Ar-5 | Ar-1 | Ar-5 | Ar-5 | Ar-1 | Ar-3 | Ar-5 |
| Ar-4 | Ar-5 | Ar-1 | Ar-6 | Ar-5 | Ar-1 | Ar-3 | Ar-6 |
| Ar-4 | Ar-5 | Ar-2 | Ar-5 | Ar-5 | Ar-1 | Ar-4 | Ar-5 |
| Ar-4 | Ar-5 | Ar-2 | Ar-6 | Ar-5 | Ar-1 | Ar-4 | Ar-6 |
| Ar-4 | Ar-5 | Ar-3 | Ar-5 | Ar-5 | Ar-1 | Ar-5 | Ar-5 |
| Ar-4 | Ar-5 | Ar-3 | Ar-6 | Ar-5 | Ar-1 | Ar-5 | Ar-6 |
| Ar-4 | Ar-5 | Ar-4 | Ar-5 | Ar-5 | Ar-1 | Ar-6 | Ar-5 |
| Ar-4 | Ar-5 | Ar-4 | Ar-6 | Ar-5 | Ar-1 | Ar-6 | Ar-6 |
| Ar-4 | Ar-5 | Ar-5 | Ar-4 | Ar-5 | Ar-2 | Ar-1 | Ar-6 |
| Ar-4 | Ar-5 | Ar-5 | Ar-5 | Ar-5 | Ar-2 | Ar-2 | Ar-5 |
| Ar-4 | Ar-5 | Ar-5 | Ar-6 | Ar-5 | Ar-2 | Ar-2 | Ar-6 |

TABLE 1-10-continued

| R1 | R3 | R4 | R6 | R1 | R3 | R4 | R6 |
|---|---|---|---|---|---|---|---|
| Ar-4 | Ar-5 | Ar-6 | Ar-4 | Ar-5 | Ar-2 | Ar-3 | Ar-5 |
| Ar-4 | Ar-5 | Ar-6 | Ar-5 | Ar-5 | Ar-2 | Ar-3 | Ar-6 |

TABLE 1-11

| R1 | R3 | R4 | R6 | R1 | R3 | R4 | R6 |
|---|---|---|---|---|---|---|---|
| Ar-5 | Ar-2 | Ar-4 | Ar-5 | Ar-5 | Ar-5 | Ar-6 | Ar-5 |
| Ar-5 | Ar-2 | Ar-4 | Ar-6 | Ar-5 | Ar-5 | Ar-6 | Ar-6 |
| Ar-5 | Ar-2 | Ar-5 | Ar-5 | Ar-5 | Ar-6 | Ar-1 | Ar-6 |
| Ar-5 | Ar-2 | Ar-5 | Ar-6 | Ar-5 | Ar-6 | Ar-2 | Ar-6 |
| Ar-5 | Ar-2 | Ar-6 | Ar-5 | Ar-5 | Ar-6 | Ar-3 | Ar-6 |
| Ar-5 | Ar-2 | Ar-6 | Ar-6 | Ar-5 | Ar-6 | Ar-4 | Ar-6 |
| Ar-5 | Ar-3 | Ar-1 | Ar-6 | Ar-5 | Ar-6 | Ar-5 | Ar-6 |
| Ar-5 | Ar-3 | Ar-2 | Ar-6 | Ar-5 | Ar-6 | Ar-6 | Ar-5 |
| Ar-5 | Ar-3 | Ar-3 | Ar-5 | Ar-5 | Ar-6 | Ar-6 | Ar-6 |
| Ar-5 | Ar-3 | Ar-3 | Ar-6 | Ar-6 | Ar-1 | Ar-1 | Ar-6 |
| Ar-5 | Ar-3 | Ar-4 | Ar-5 | Ar-6 | Ar-1 | Ar-2 | Ar-6 |
| Ar-5 | Ar-3 | Ar-4 | Ar-6 | Ar-6 | Ar-1 | Ar-3 | Ar-6 |
| Ar-5 | Ar-3 | Ar-5 | Ar-5 | Ar-6 | Ar-1 | Ar-4 | Ar-6 |
| Ar-5 | Ar-3 | Ar-5 | Ar-6 | Ar-6 | Ar-1 | Ar-5 | Ar-6 |
| Ar-5 | Ar-3 | Ar-6 | Ar-5 | Ar-6 | Ar-1 | Ar-6 | Ar-6 |
| Ar-5 | Ar-3 | Ar-6 | Ar-6 | Ar-6 | Ar-2 | Ar-2 | Ar-6 |
| Ar-5 | Ar-4 | Ar-1 | Ar-6 | Ar-6 | Ar-2 | Ar-3 | Ar-6 |
| Ar-5 | Ar-4 | Ar-2 | Ar-6 | Ar-6 | Ar-2 | Ar-4 | Ar-6 |
| Ar-5 | Ar-4 | Ar-3 | Ar-6 | Ar-6 | Ar-2 | Ar-5 | Ar-6 |
| Ar-5 | Ar-4 | Ar-4 | Ar-5 | Ar-6 | Ar-2 | Ar-6 | Ar-6 |
| Ar-5 | Ar-4 | Ar-4 | Ar-6 | Ar-6 | Ar-3 | Ar-3 | Ar-6 |
| Ar-5 | Ar-4 | Ar-5 | Ar-5 | Ar-6 | Ar-3 | Ar-4 | Ar-6 |
| Ar-5 | Ar-4 | Ar-5 | Ar-6 | Ar-6 | Ar-3 | Ar-5 | Ar-6 |
| Ar-5 | Ar-4 | Ar-6 | Ar-5 | Ar-6 | Ar-3 | Ar-6 | Ar-6 |
| Ar-5 | Ar-4 | Ar-6 | Ar-6 | Ar-6 | Ar-4 | Ar-4 | Ar-6 |
| Ar-5 | Ar-5 | Ar-1 | Ar-6 | Ar-6 | Ar-4 | Ar-5 | Ar-6 |
| Ar-5 | Ar-5 | Ar-2 | Ar-6 | Ar-6 | Ar-4 | Ar-6 | Ar-6 |
| Ar-5 | Ar-5 | Ar-3 | Ar-6 | Ar-6 | Ar-5 | Ar-5 | Ar-6 |
| Ar-5 | Ar-5 | Ar-4 | Ar-6 | Ar-6 | Ar-5 | Ar-6 | Ar-6 |
| Ar-5 | Ar-5 | Ar-5 | Ar-5 | Ar-6 | Ar-6 | Ar-6 | Ar-6 |
| Ar-5 | Ar-5 | Ar-5 | Ar-6 | | | | |

$R^2$ and $R^5$ are each preferably any of hydrogen, an alkyl group, a carbonyl group, an oxycarbonyl group, and an aryl group. Among them, hydrogen and an alkyl group are preferred in view of thermal stability, and hydrogen is more preferred in view of the easiness of obtaining a narrow full width at half maximum in an emission spectrum.

$R^8$ and $R^9$ are each preferably an alkyl group, an aryl group, a heteroaryl group, fluorine, a fluorine-containing alkyl group, a fluorine-containing heteroaryl group, or a fluorine-containing aryl group. In particular, because of being stable against excitation light and the capability of obtaining higher emission quantum yield, $R^8$ and $R^9$ are each more preferably fluorine or a fluorine-containing aryl group. In addition, $R^8$ and $R^9$ are each still more preferably fluorine in view of the easiness of synthesis.

The fluorine-containing aryl group is an aryl group containing fluorine; examples thereof include a fluorophenyl group, a trifluoromethylphenyl group, and pentafluorophenyl group. The fluorine-containing heteroaryl group is a heteroaryl group containing fluorine; examples thereof include a fluoropyridyl group, a trifluoromethylpyridyl group, and trifluoropyridyl group. The fluorine-containing alkyl group is an alkyl group containing fluorine; examples thereof include a trifluoromethyl group and a pentafluoroethyl group.

In General Formula (1), X is preferably C—$R^7$ in view of photostability. When X is C—$R^7$, the substituent $R^7$ has a great influence on the durability of the compound represented by General Formula (1), that is, a temporal reduction in the emission intensity of this compound. Specifically, when $R^7$ is hydrogen, the reactivity of this part is high, and this part and water and oxygen in the air easily react with each other. This phenomenon causes the decomposition of the compound represented by General Formula (1). When $R^7$ is a substituent having a large degree of freedom of the motion of a molecular chain such as an alkyl group, although the reactivity indeed reduces, the compounds flocculate with the lapse of time in the color conversion sheet, resulting in a reduction in emission intensity caused by concentration quenching. Thus, $R^7$ is preferably a group that is rigid, is small in the degree of freedom of motion, and is difficult to cause flocculation, and specifically preferably any of a substituted or unsubstituted aryl group and a substituted or unsubstituted heteroaryl group.

In view of giving higher emission quantum yield, being more resistant to thermal decomposition, and photostability, X is preferably C—$R^7$ in which $R^7$ is a substituted or unsubstituted aryl group. In view of not impairing emission wavelength, the aryl group is preferably a phenyl group, a biphenyl group, a terphenyl group, a naphthyl group, a fluorenyl group, a phenanthryl group, or an anthracenyl group.

In addition, to increase the photostability of the compound represented by General Formula (1), the twist of the carbon-carbon bond between $R^7$ and the pyrromethene skeleton is required to be appropriately reduced, because an excessively large twist causes a reduction in photostability, such as an increase in reactivity against the excitation light. Given these circumstances, $R^7$ is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, and particularly preferably a substituted or unsubstituted phenyl group.

$R^7$ is preferably a moderately bulky substituent. $R^7$ has bulkiness to some extent, whereby the flocculation of molecules can be prevented. Consequently, the emission efficiency and durability of the compound represented by General Formula (1) further improve.

A further preferred example of the bulky substituent is the structure of $R^7$ represented by the following General Formula (2).

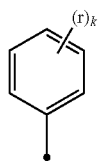

(2)

In General Formula (2), r is selected from the group consisting of hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group. The symbol k is an integer of 1 to 3. When k is 2 or more, rs may be the same as or different from each other.

In view of the capability of giving higher emission quantum yield, r is preferably a substituted or unsubstituted aryl group. Preferred examples of the aryl group include a phenyl group and a naphthyl group in particular. When r is an aryl group, k in General Formula (2) is preferably 1 or 2 and more preferably 2 in view of preventing the flocculation of molecules. In addition, when k is 2 or more, at least one of rs is preferably substituted by an alkyl group. Particularly preferred examples of the alkyl group in this case include a methyl group, an ethyl group, and a tert-butyl group in view of thermal stability.

In view of controlling fluorescence wavelength and absorption wavelength and increasing compatibility with the solvent, r is preferably a substituted or unsubstituted alkyl group, a substituted or unsubstituted alkoxy group, or halogen and more preferably a methyl group, an ethyl group, a tert-butyl group, or a methoxy group. In view of dispersibility, r is particularly preferably a tert-butyl group or a methoxy group. The fact that r is a tert-butyl group or a methoxy group is more effective for the prevention of quenching caused by the flocculation of molecules.

As another mode of the compound represented by General Formula (1), at least one of $R^1$ to $R^7$ is preferably an electron withdrawing group. In particular, preferred is (1) at least one of $R^1$ to $R^6$ being an electron withdrawing group, (2) $R^7$ being an electron withdrawing group, or (3) at least one of $R^1$ to $R^6$ being an electron withdrawing group and $R^7$ being an electron withdrawing group. The electron withdrawing group is thus introduced to the pyrromethene skeleton of the compound, whereby the electron density of the pyrromethene skeleton can be greatly reduced. With this reduction in electron density, the stability of the compound against oxygen further improves, and consequently, the durability of the compound can be further improved.

The electron withdrawing group is called also an electron accepting group and is an atomic group that attracts an electron from a substituted atomic group by the inductive effect and/or the resonance effect in the organic electron theory. Examples of the electron withdrawing group include ones having a positive value as a substituent constant (σp (para)) of Hammett's Rule. The substituent constant (p (para)) of Hammett's Rule can be cited from Kagaku Binran Kiso-Hen Revised 5th Edition (II, p. 380). Although the phenyl group has an example taking a positive value as in the above, the electron withdrawing group does not include the phenyl group in the present invention.

Examples of the electron withdrawing group include —F (σp: +0.06), —Cl (σp: +0.23), —Br (σp: +0.23), —I (σp: +0.18), —$CO_2R^{12}$ (σp: +0.45 when $R^{12}$ is an ethyl group), —$CONH_2$ (σp: +0.38), —$COR^{12}$ (σp: +0.49 when $R^{12}$ is a methyl group), —$CF_3$ (σp: +0.50), —$SO_2R^2$ (σp: +0.69 when $R^{12}$ is a methyl group), and —$NO_2$ (σp: +0.81). $R^{12}$s each independently represent a hydrogen atom, a substituted or unsubstituted aromatic hydrocarbon group with a ring-forming carbon number of 6 o 30, a substituted or unsubstituted heterocyclic group with a ring-forming carbon number of 5 o 30, a substituted or unsubstituted $C_{1-30}$ alkyl group, or a substituted or unsubstituted $C_{1-30}$ cycloalkyl group. Specific examples of these groups include examples similar to those described above.

Preferred examples of the electron withdrawing group include fluorine, a fluorine-containing aryl group, a fluorine-containing heteroaryl group, a fluorine-containing alkyl group, a substituted or unsubstituted acyl group, a substituted or unsubstituted ester group, a substituted or unsubstituted amide group, a substituted or unsubstituted sulfonyl group, and a cyano group; this is because they are resistant to chemical decomposition.

More preferred examples of the electron withdrawing group include a fluorine-containing alkyl group, a substituted or unsubstituted acyl group, a substituted or unsubstituted ester group, and a cyano group; this is because they prevent concentration quenching, leading to an effect of improving emission quantum yield. A particularly preferred electron withdrawing group is a substituted or unsubstituted ester group.

One preferred example of the compound represented by General Formula (1) suitably used as the organic light-emitting material (a), the organic light-emitting material (a'), and the organic light-emitting material (d) is a case in which all $R^1$, $R^3$, $R^4$, and $R^6$ may be the same as or different from each other and are substituted or unsubstituted alkyl groups, X is C—$R^7$, and $R^7$ is the group represented by General Formula (2). In this case, $R^7$ is particularly preferably the group represented by General Formula (2) in which r is contained as a substituted or unsubstituted phenyl group.

Another preferred example of the compound represented by General Formula (1) suitably used as the organic light-emitting material (b), the organic light-emitting material (b'), and the organic light-emitting material (c) is a case in which all $R^1$, $R^3$, $R^4$, and $R^6$ may be the same as or different from each other and are selected from Ar-1 to Ar-6 described above, X is C—$R^7$, and $R^7$ is the group represented by General Formula (2). In this case, $R^7$ is more preferably the group represented by General Formula (2) in which r is contained as a tert-butyl group or a methoxy group and particularly preferably the group represented by General Formula (2) in which r is contained as a methoxy group.

The following shows examples of the compound represented by General Formula (1); this compound is not limited to these examples.

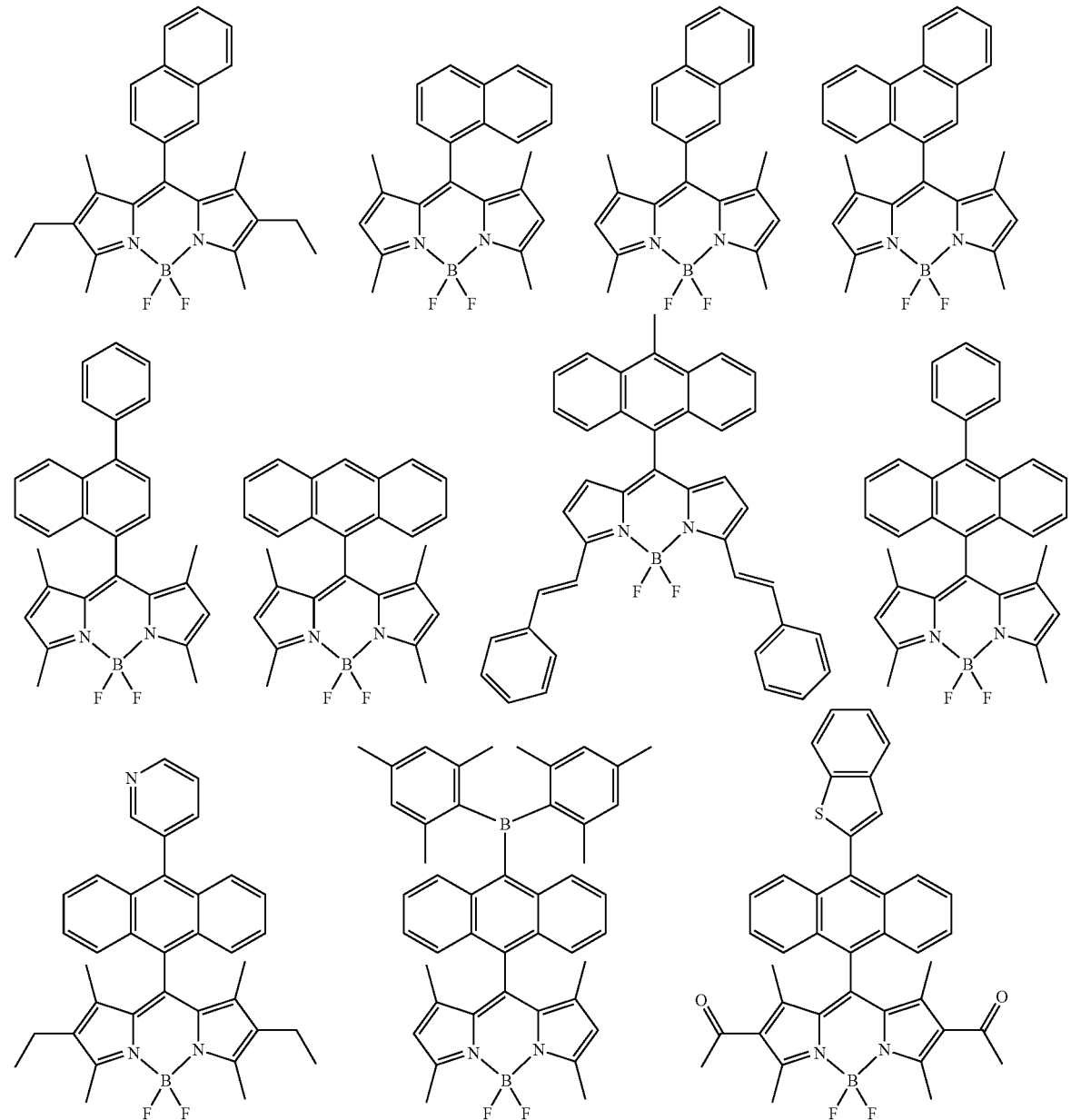

-continued
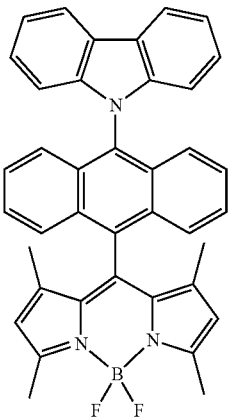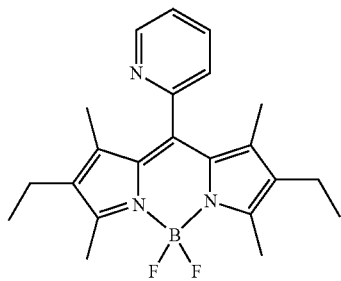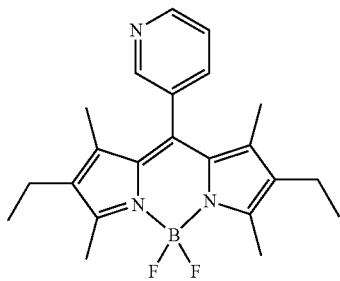
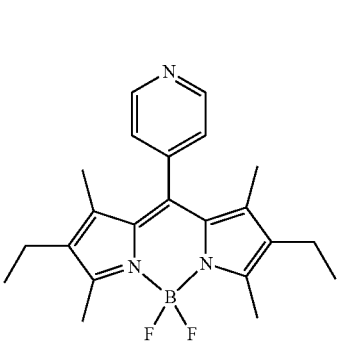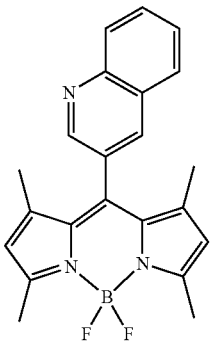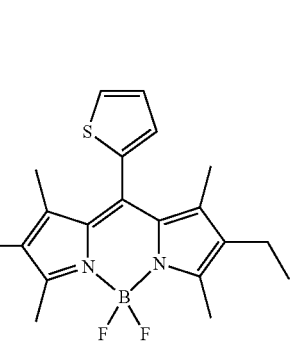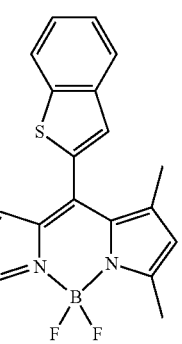
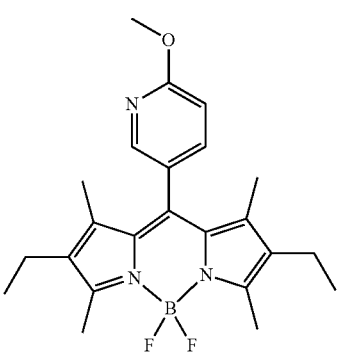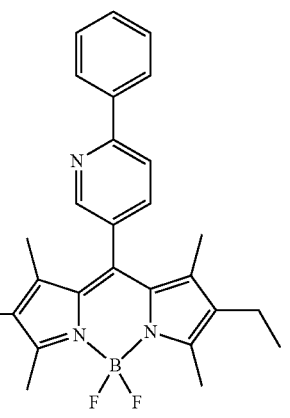
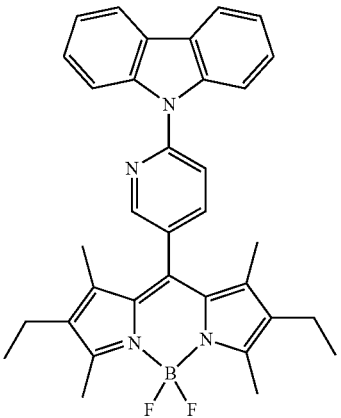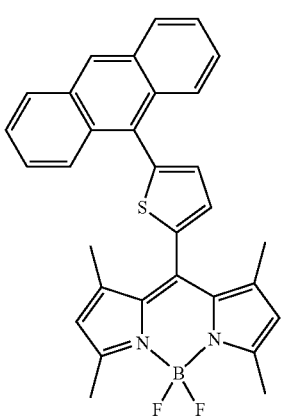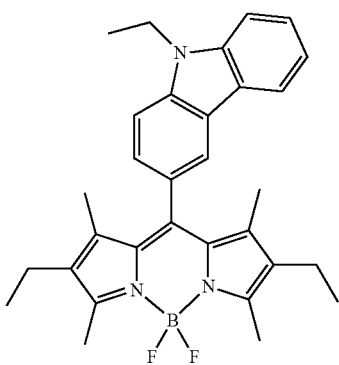

31
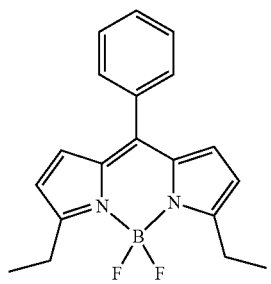
-continued
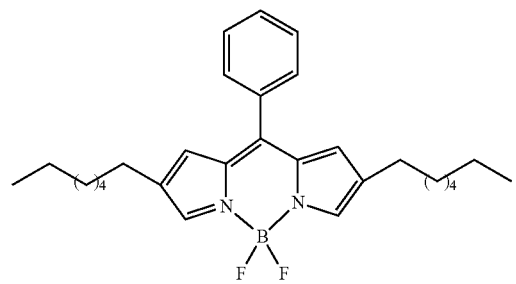
32
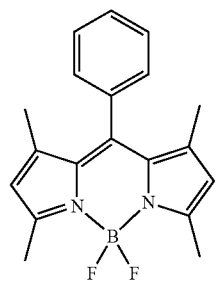
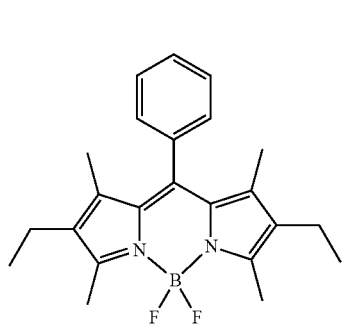
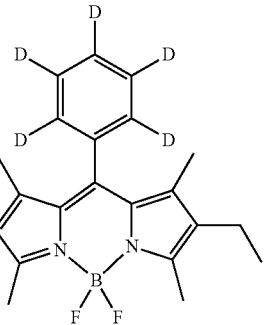
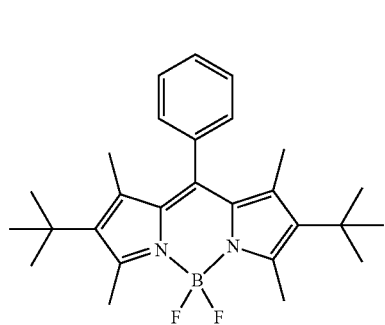
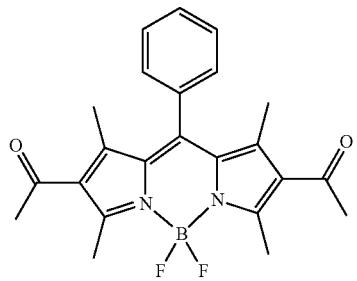
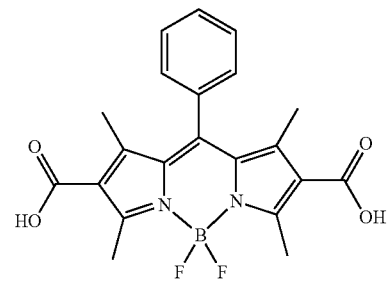
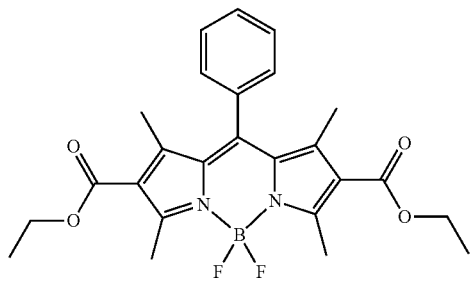
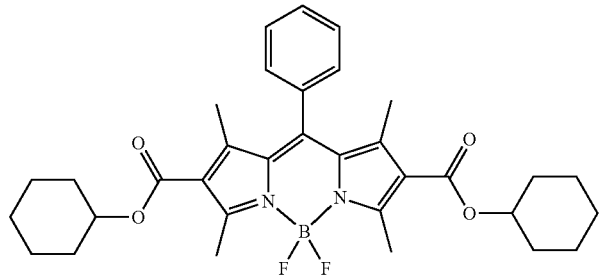
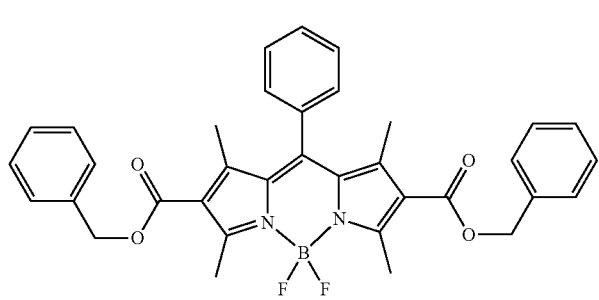
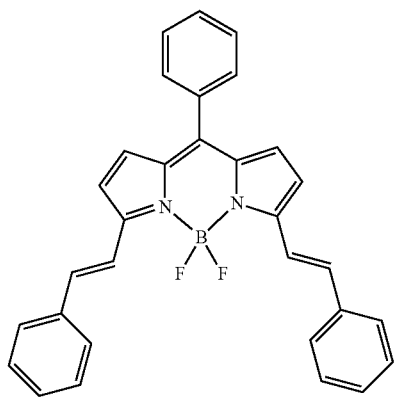

-continued
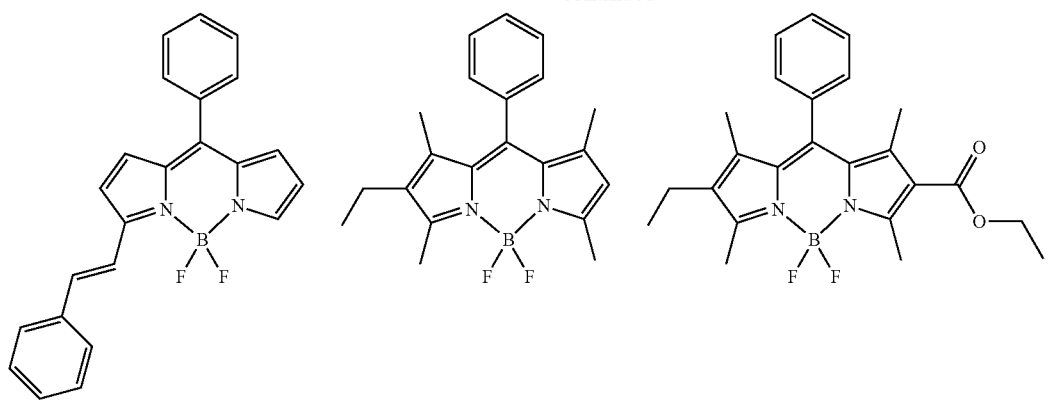
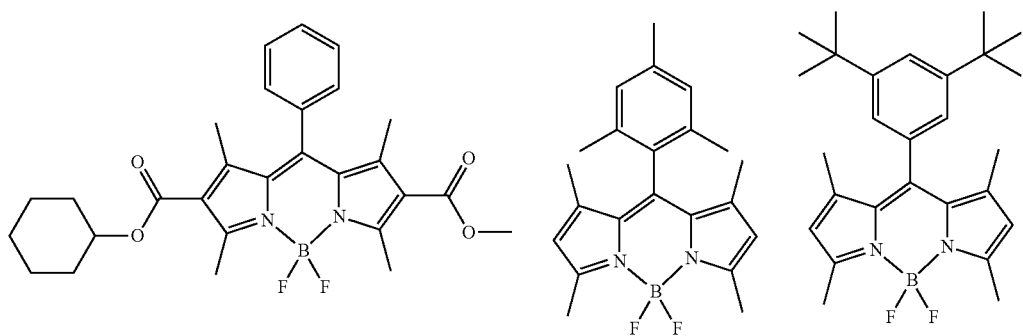
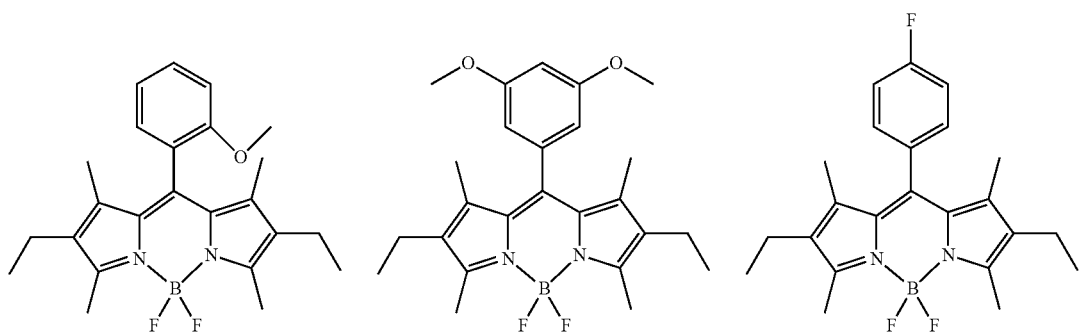
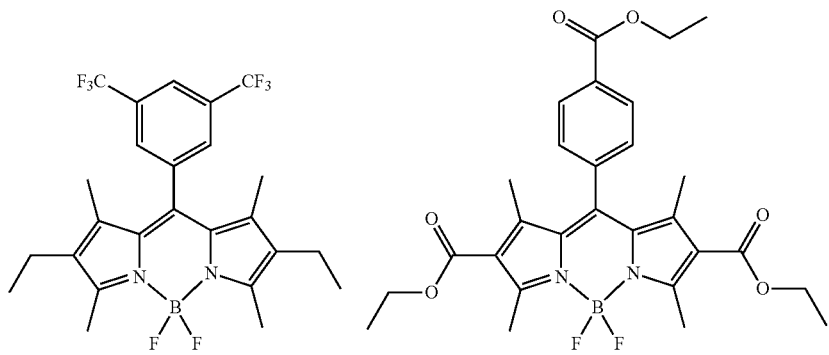

-continued
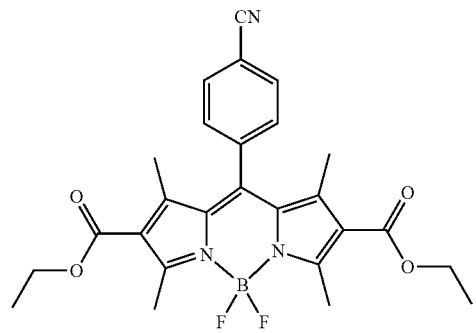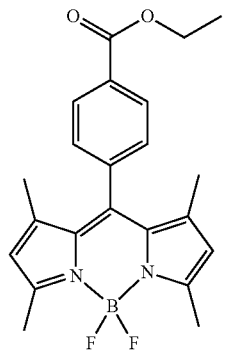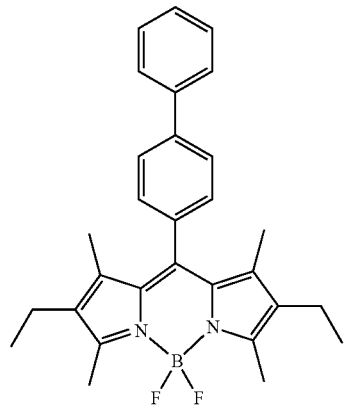
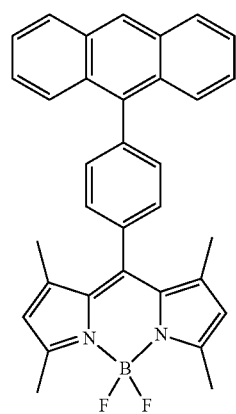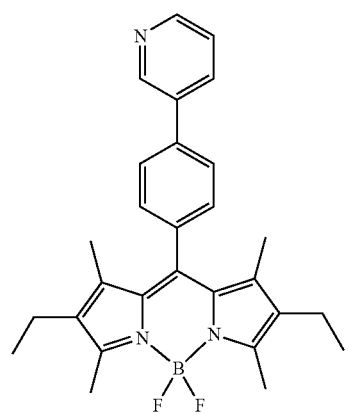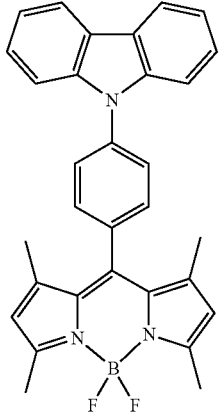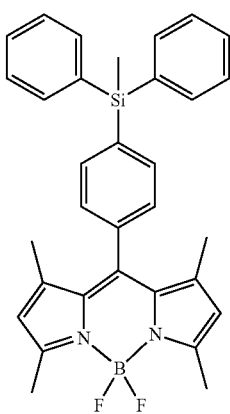
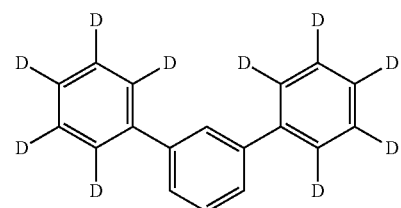
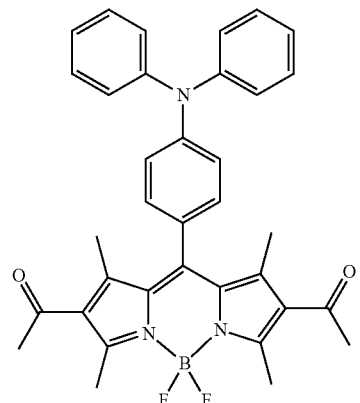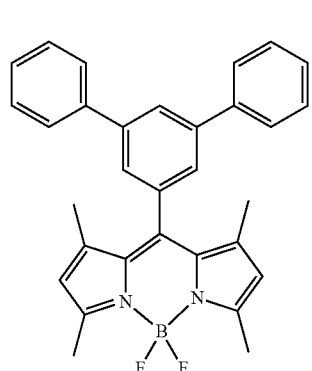
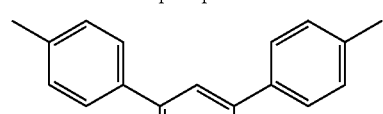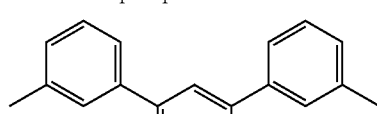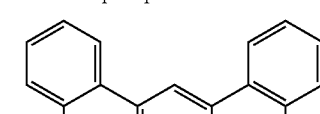
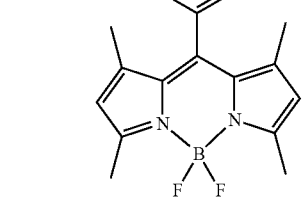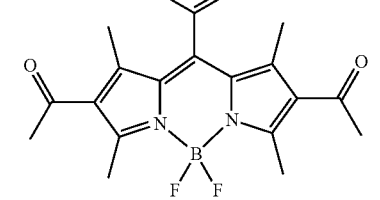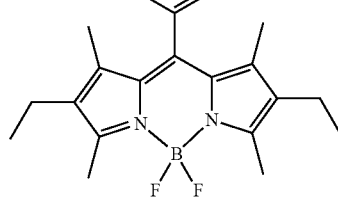

-continued
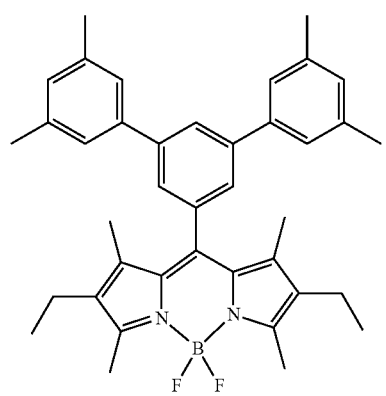
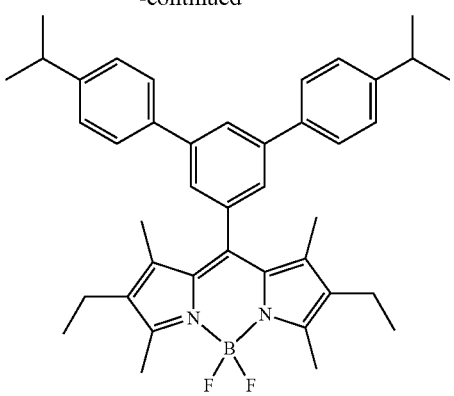
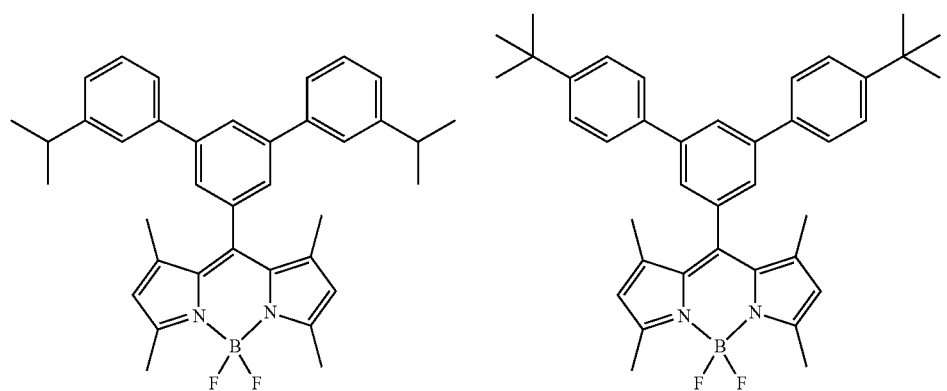
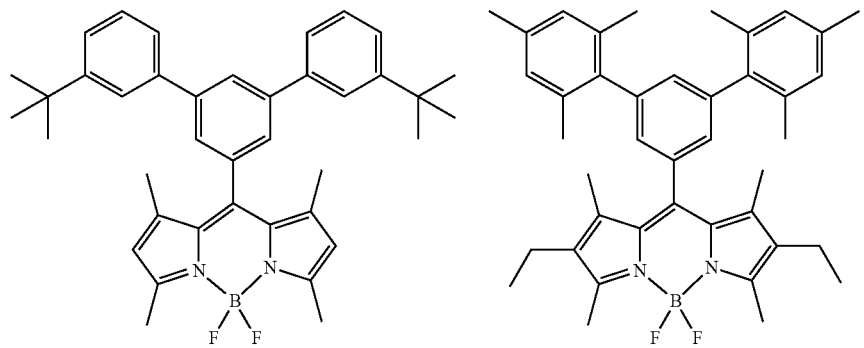
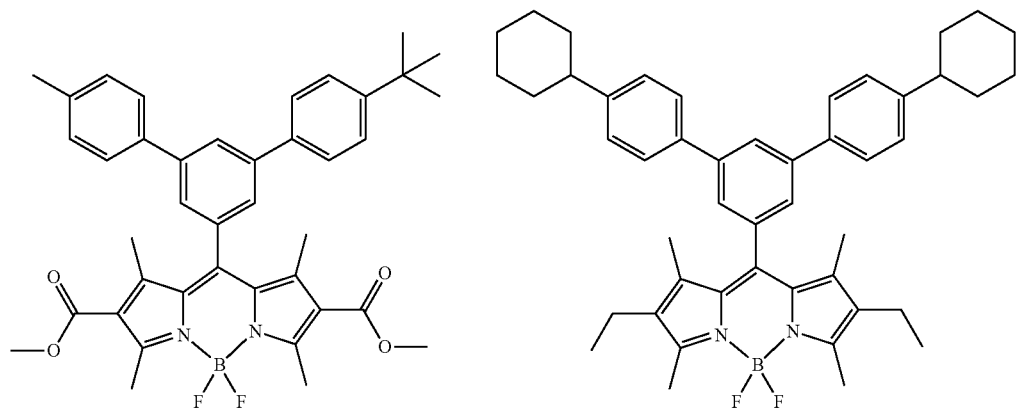

-continued
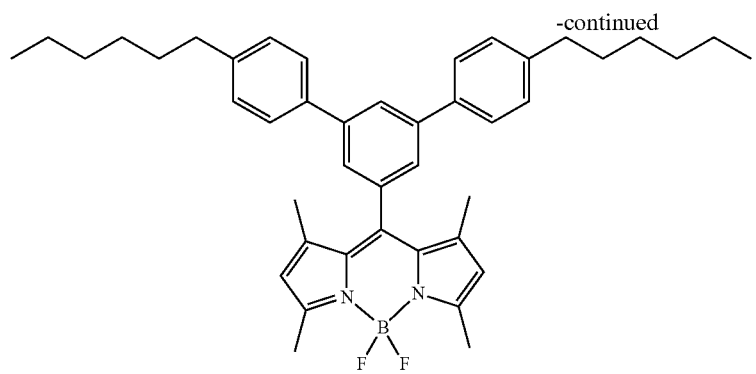
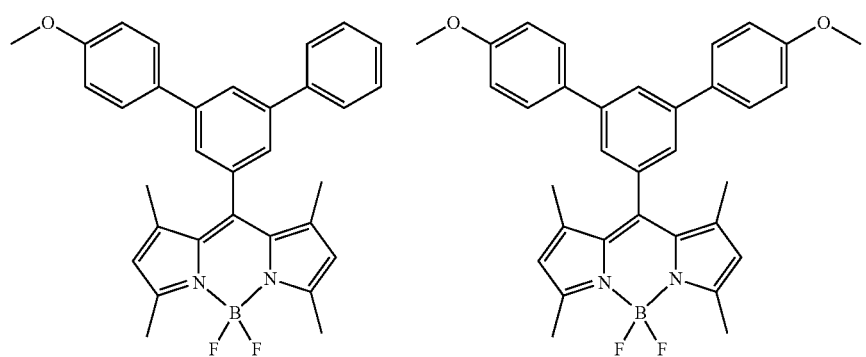
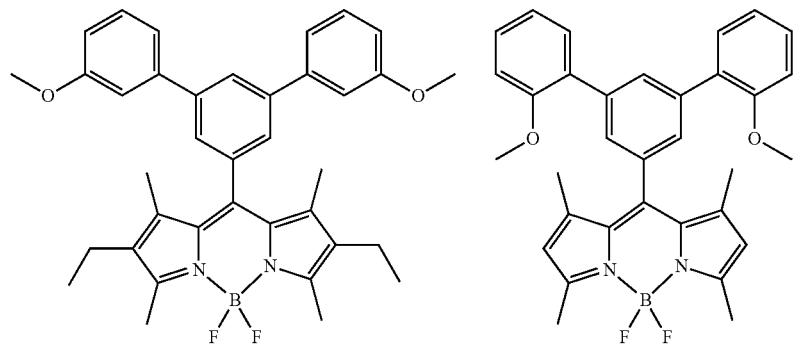
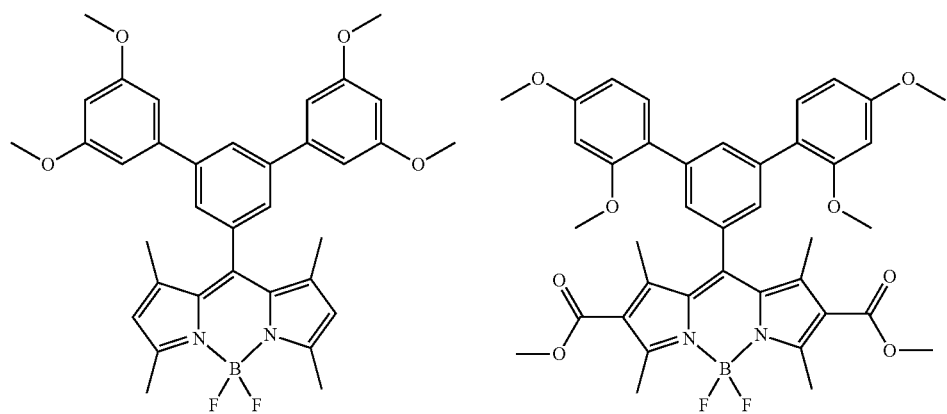

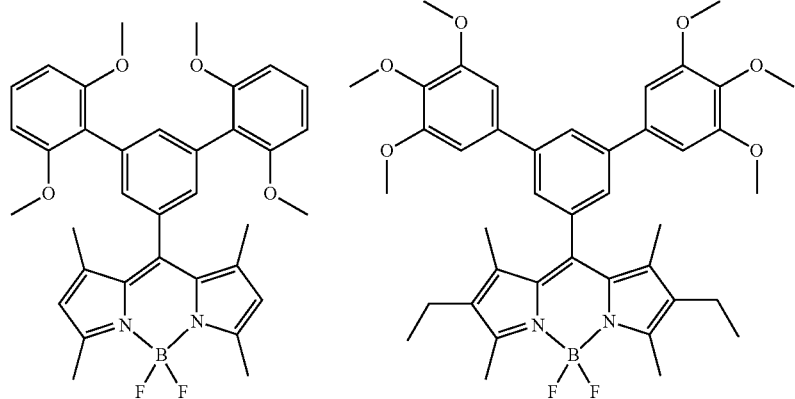
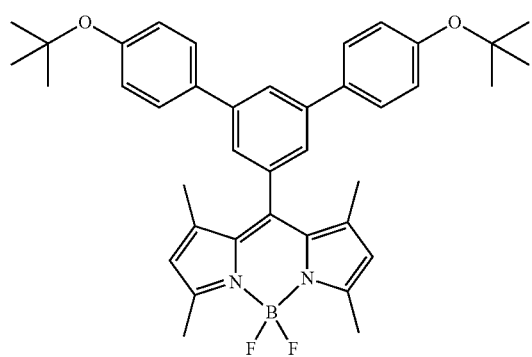
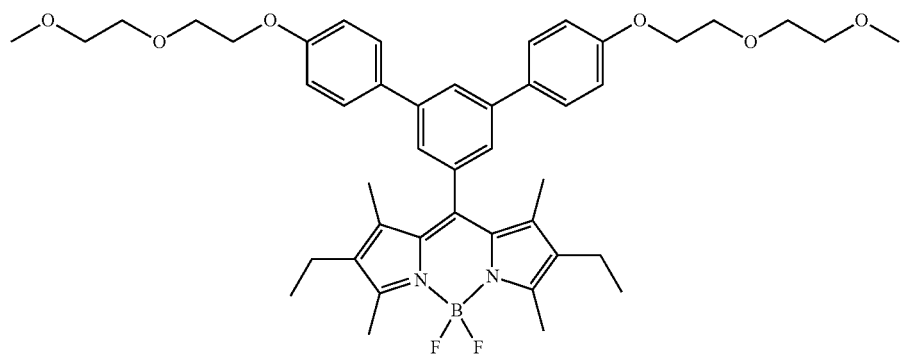
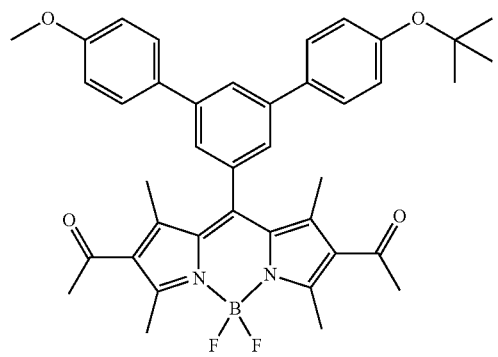

-continued
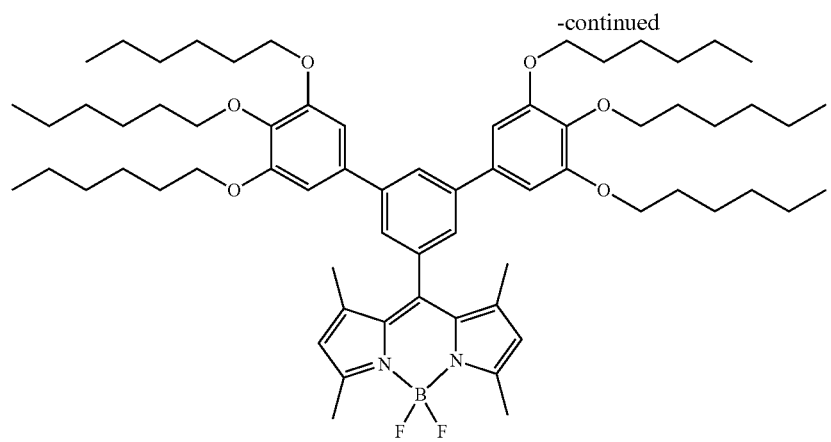
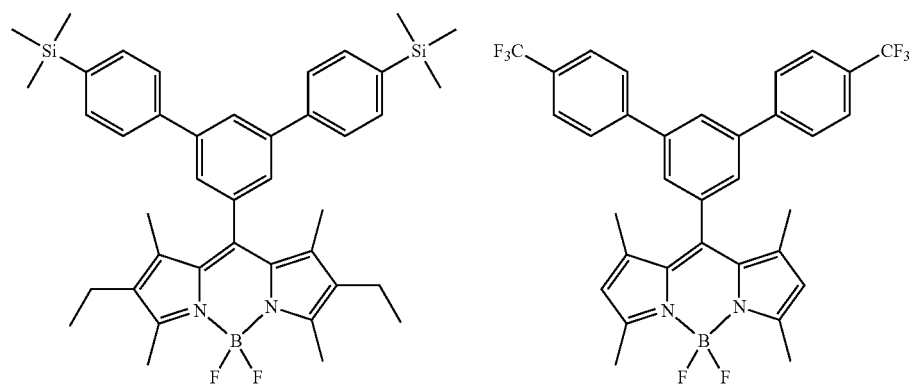
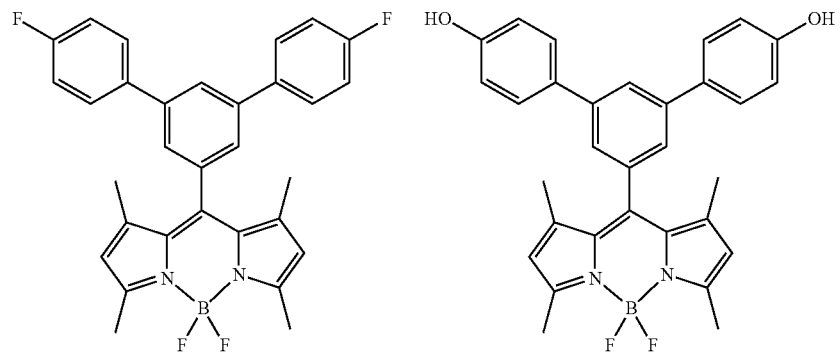
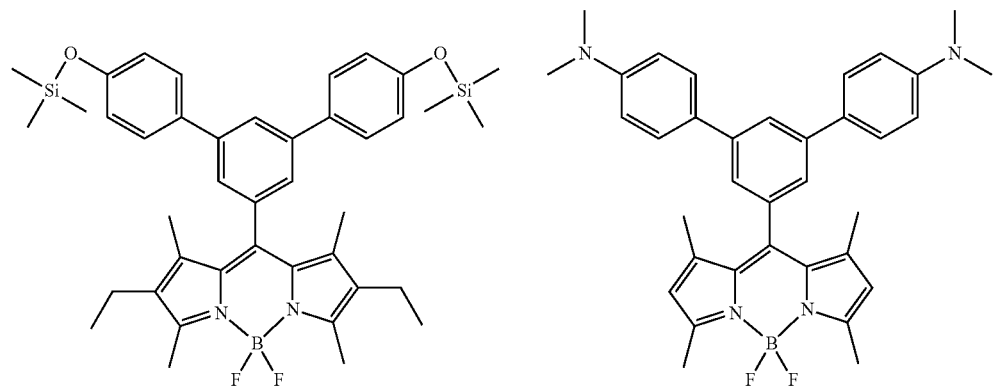

-continued
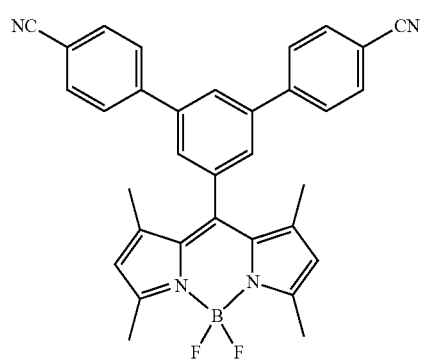
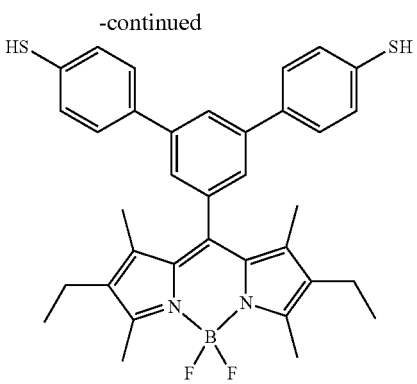
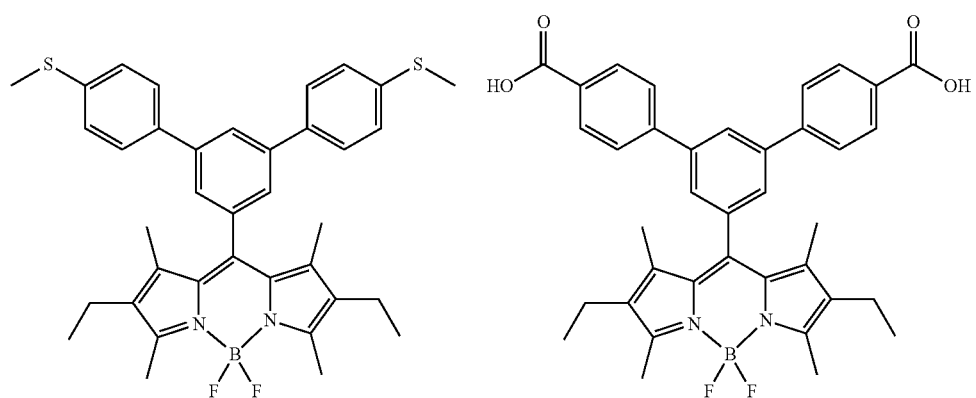
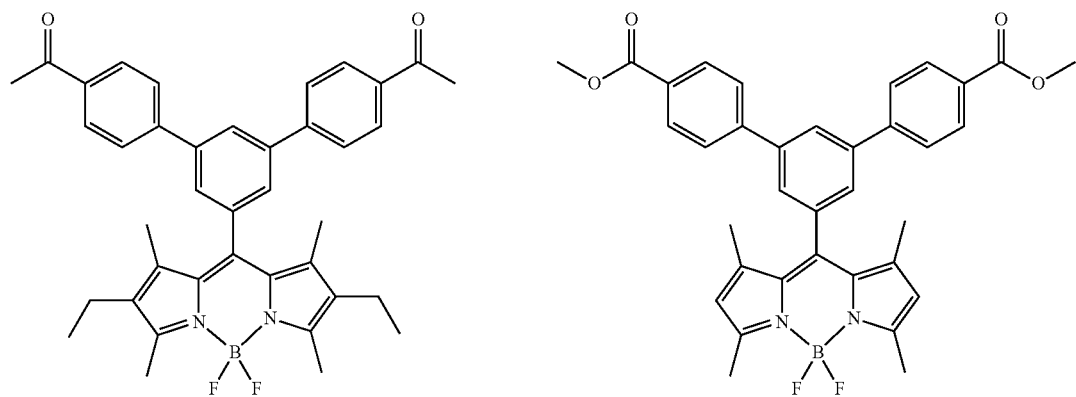
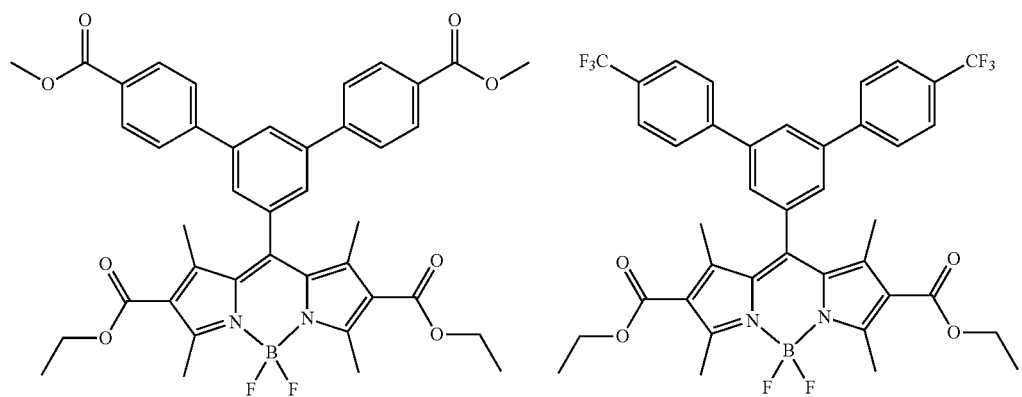

-continued
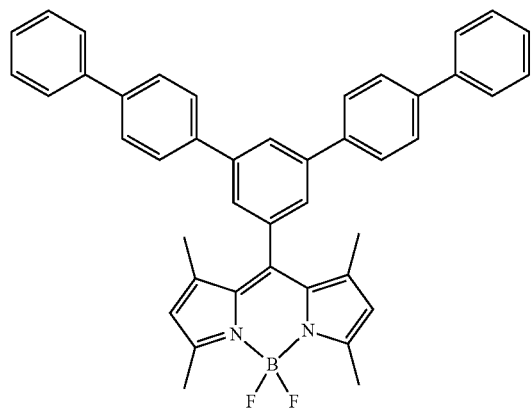
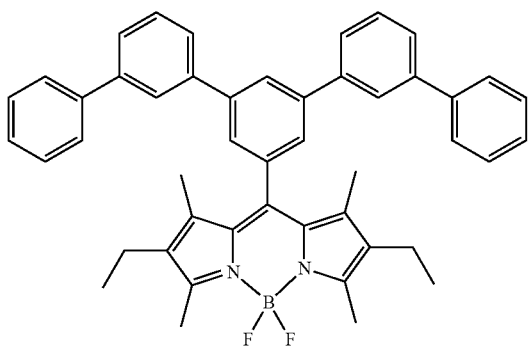
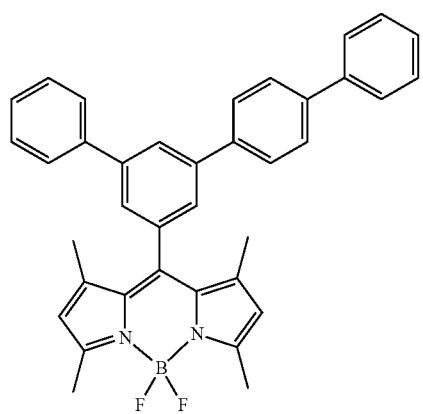
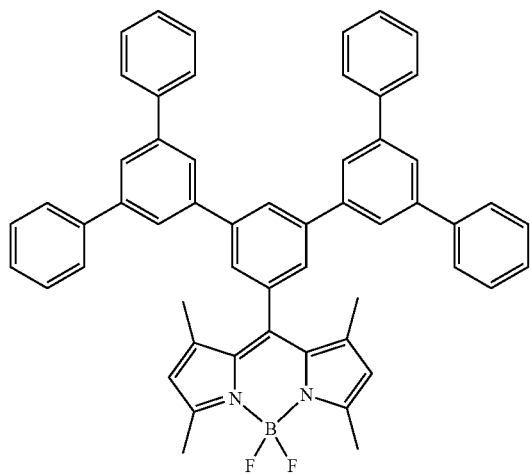
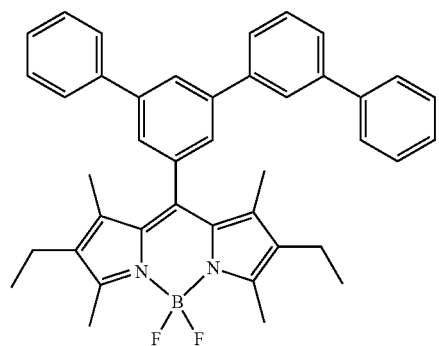
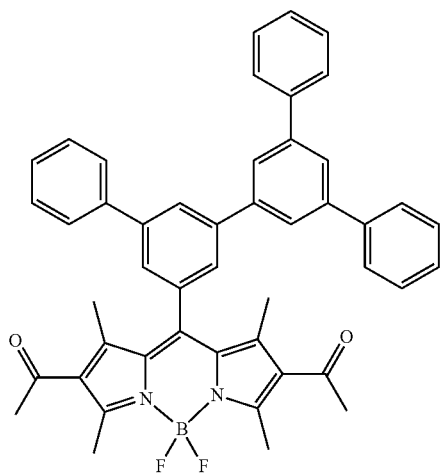

-continued
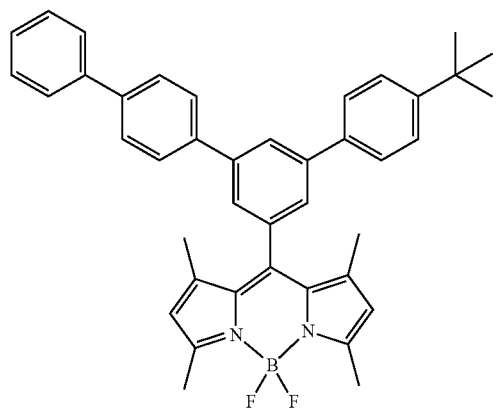
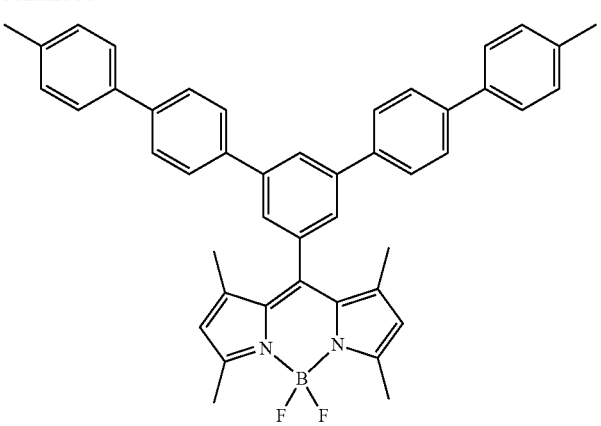
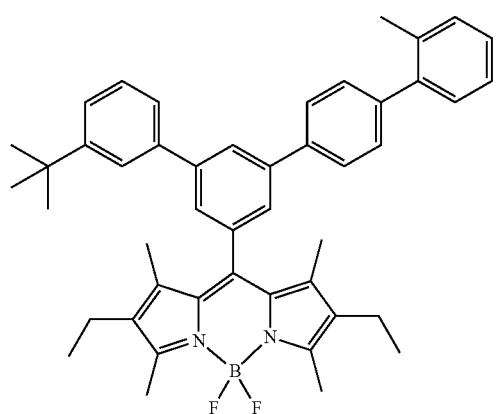
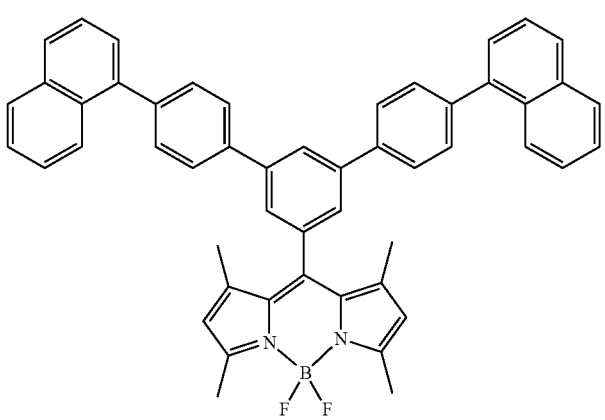
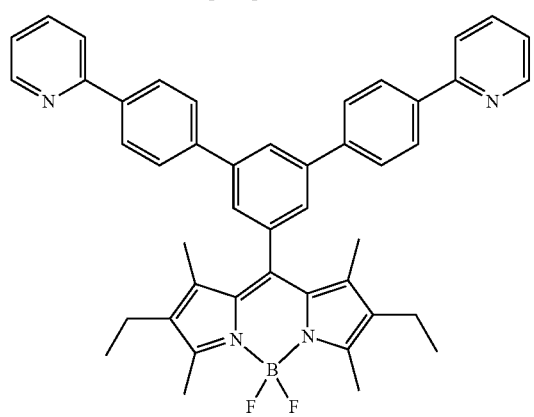
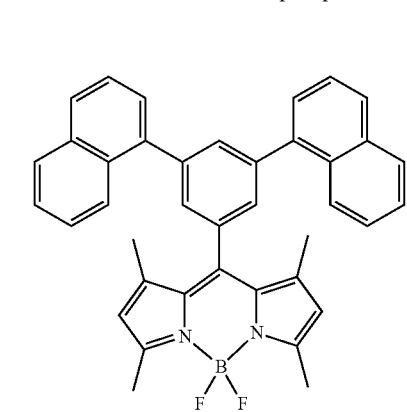
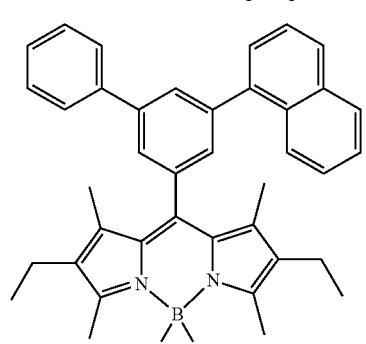
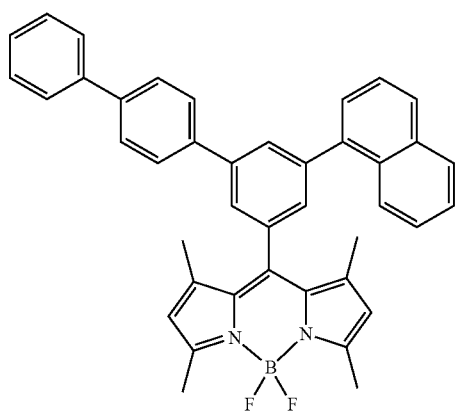

-continued
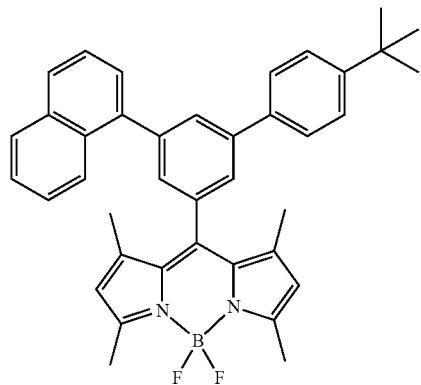
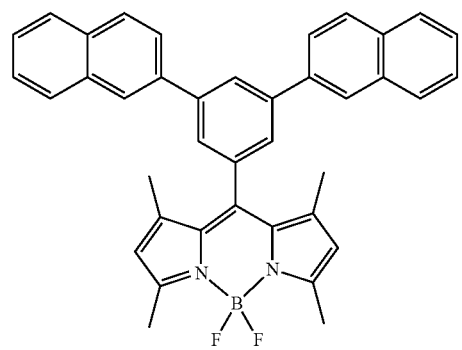
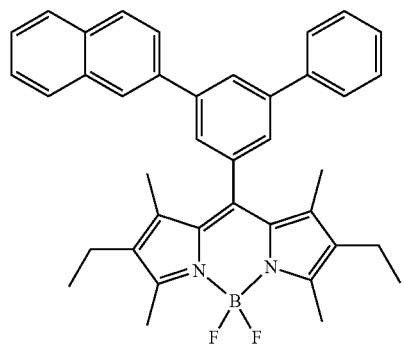
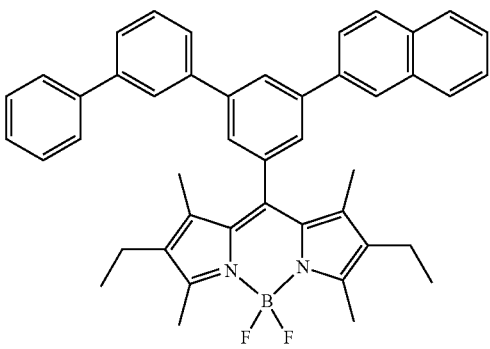
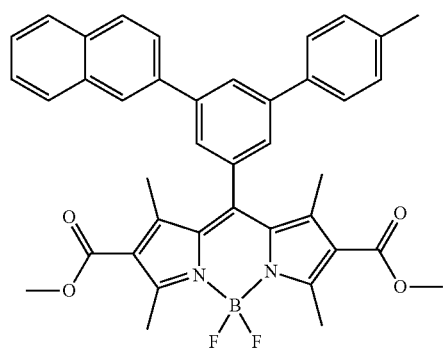
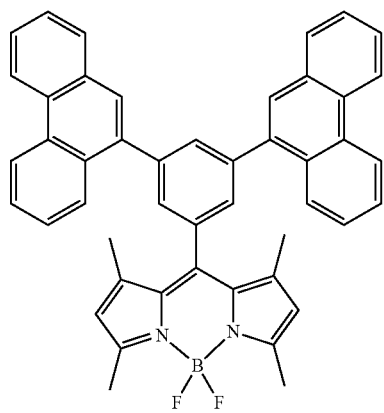
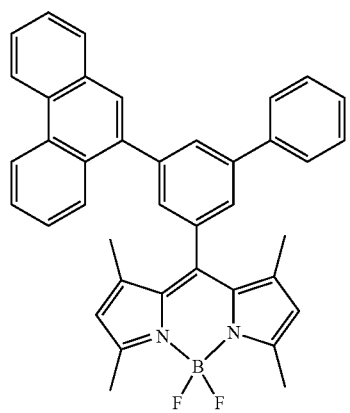
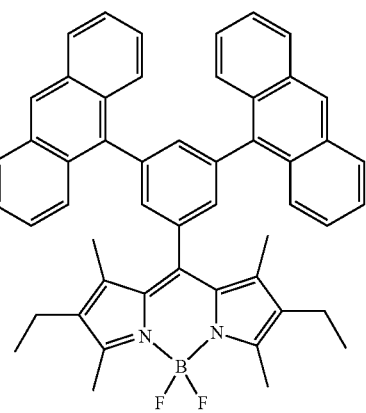
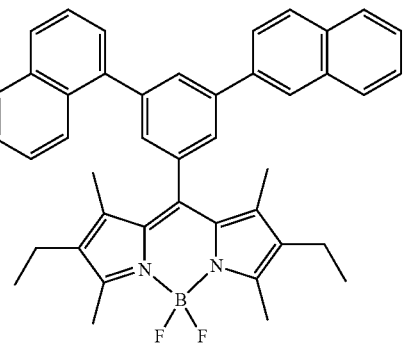

-continued
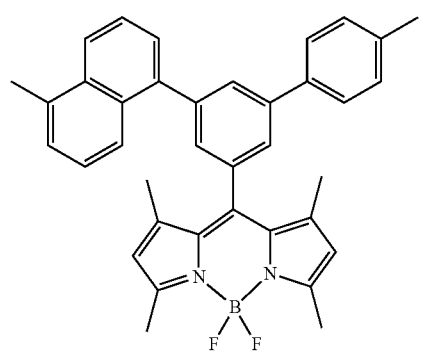
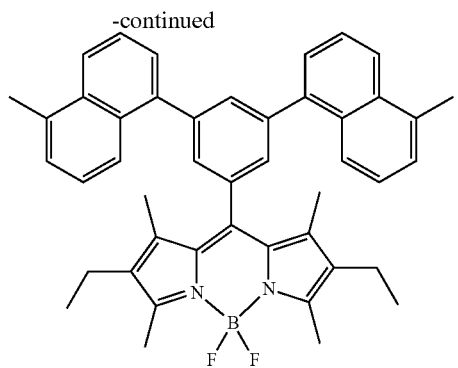
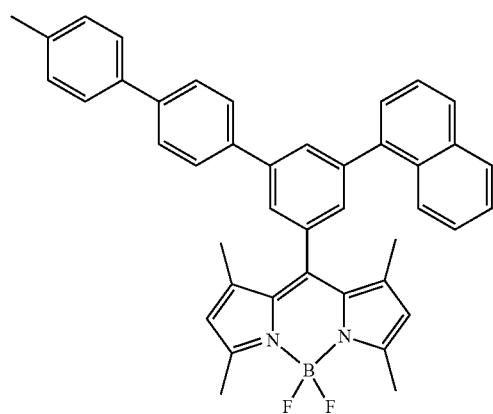
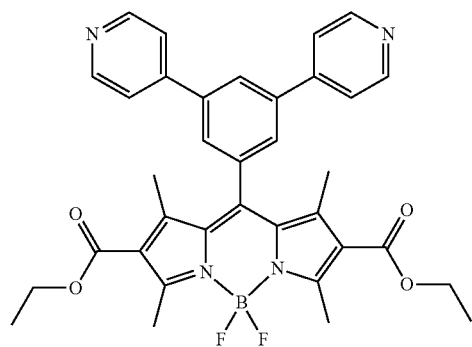
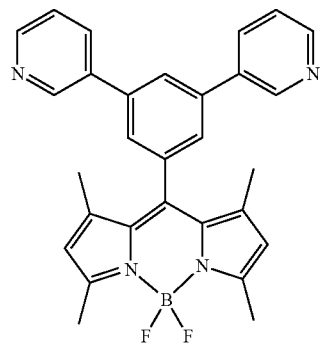
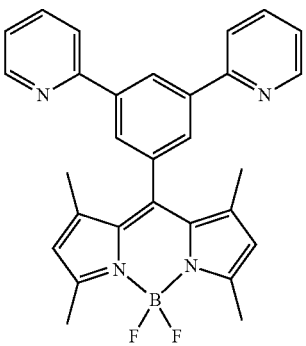
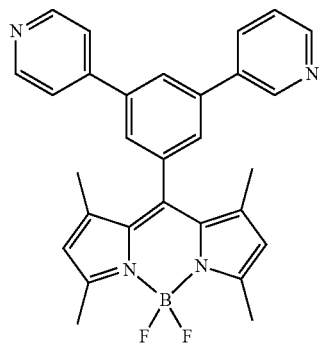
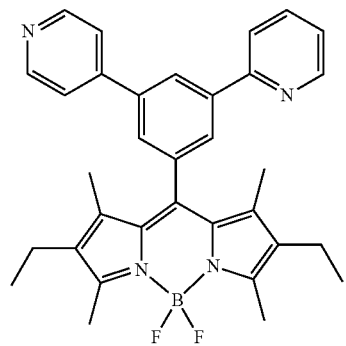
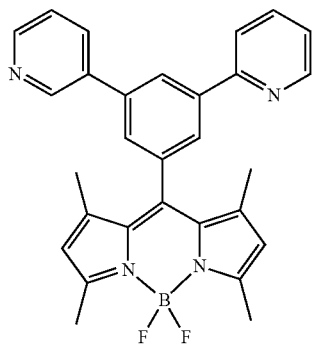
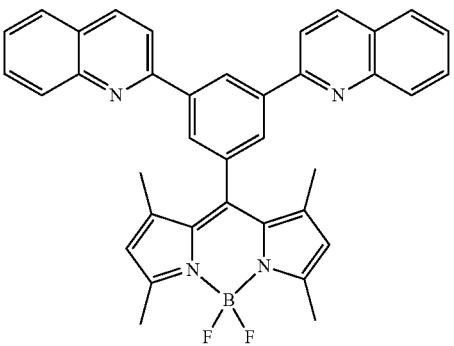

55  56
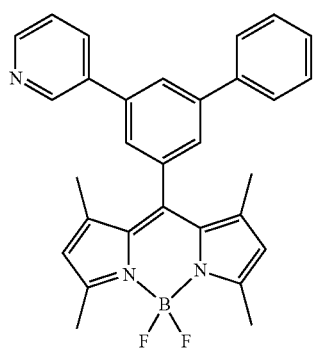 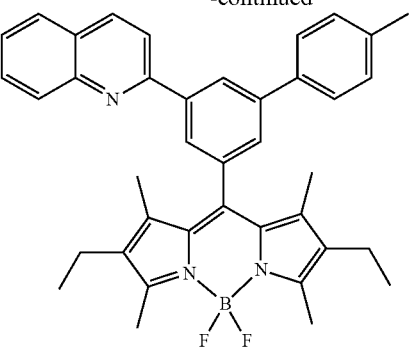 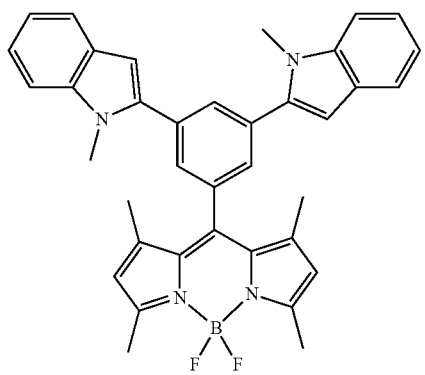
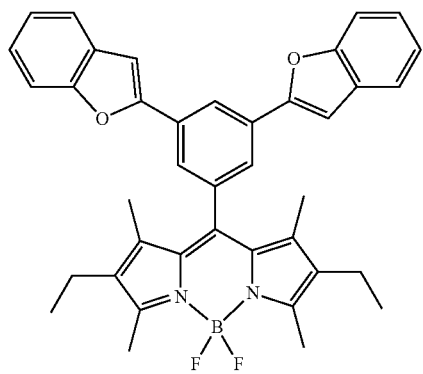 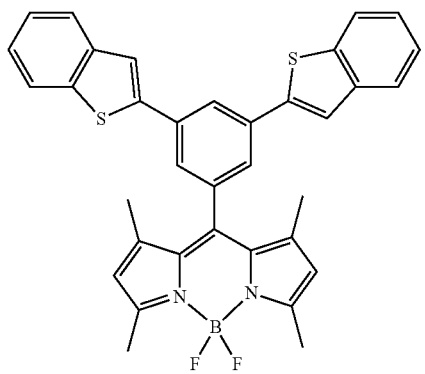
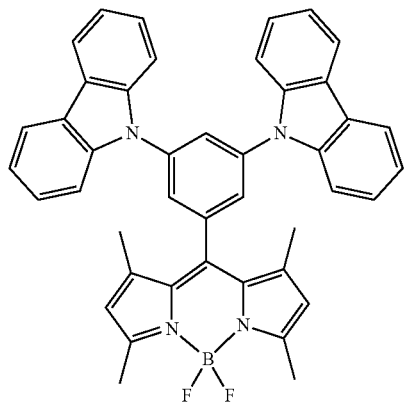 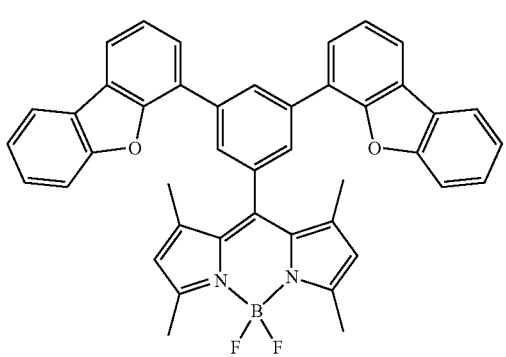
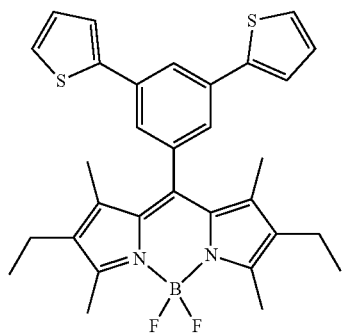 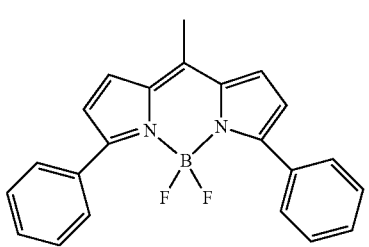 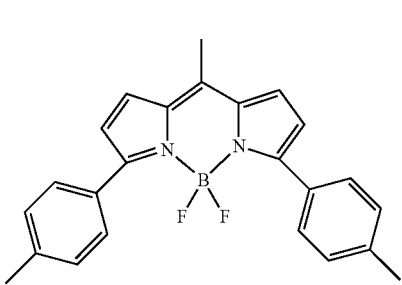

-continued
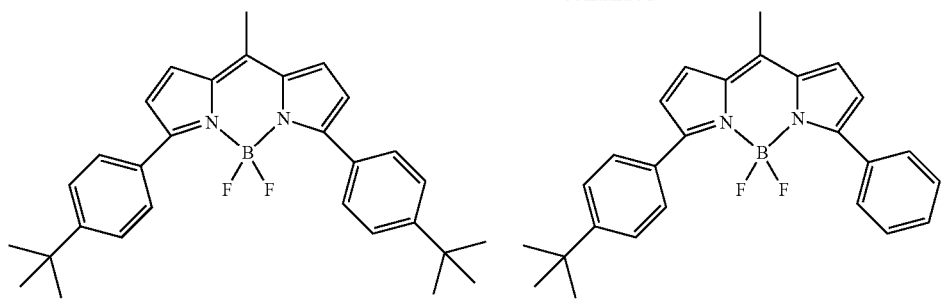
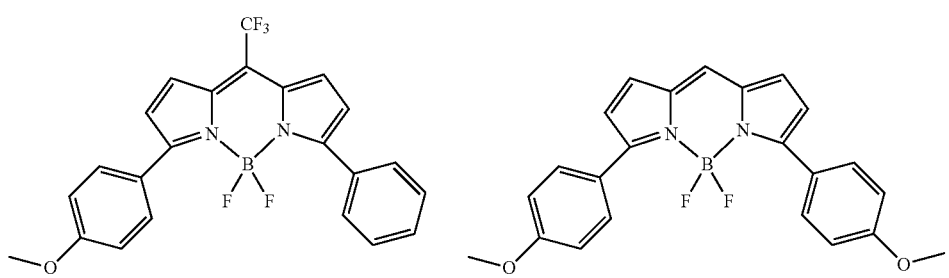
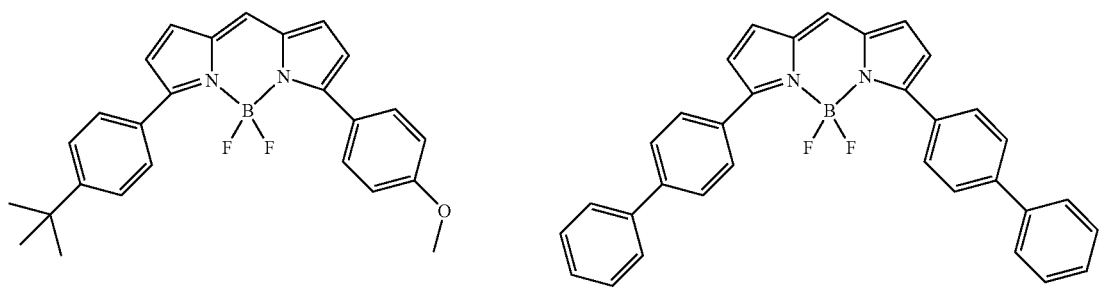
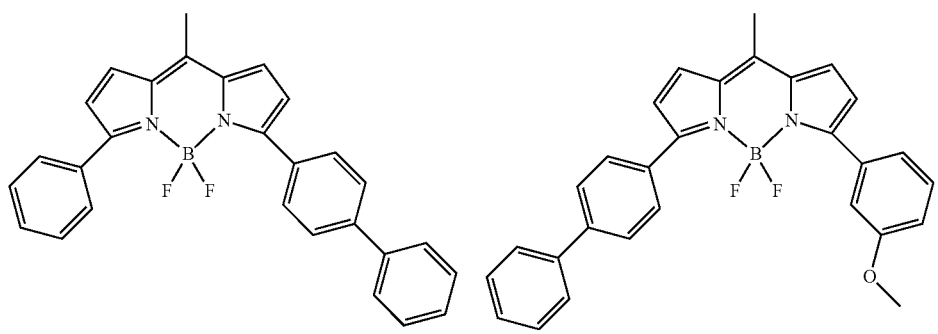
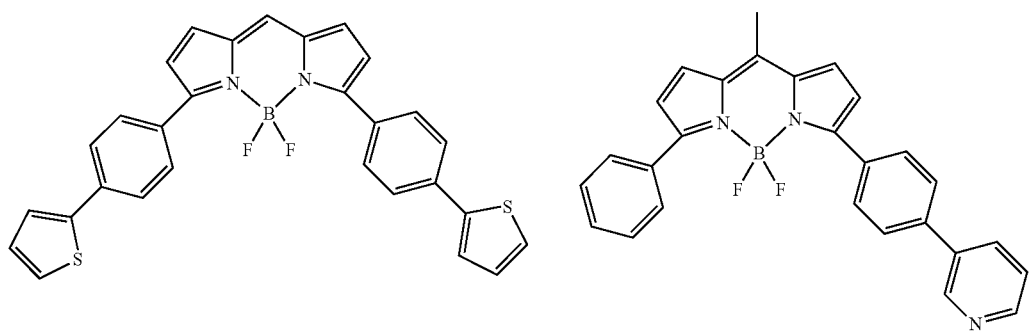

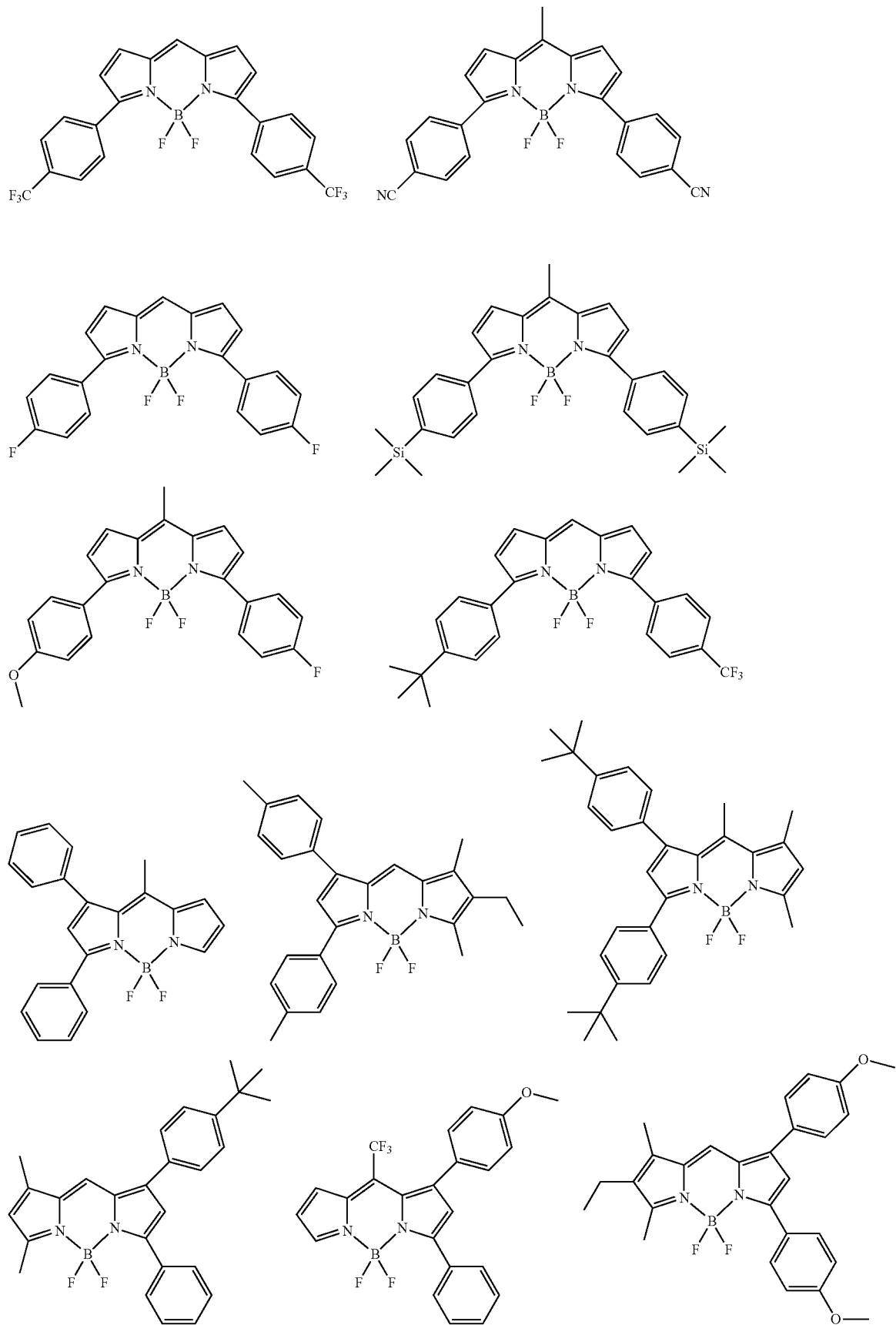

-continued
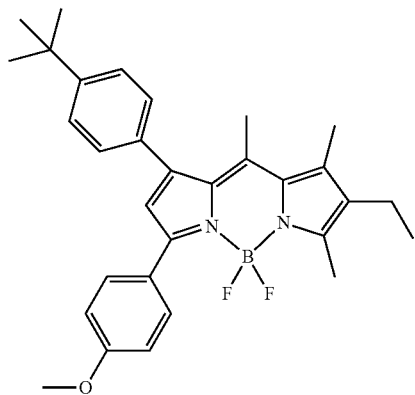
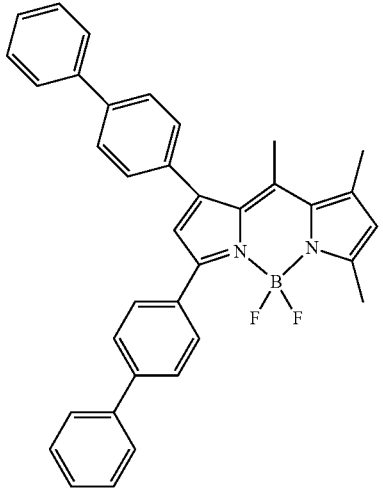
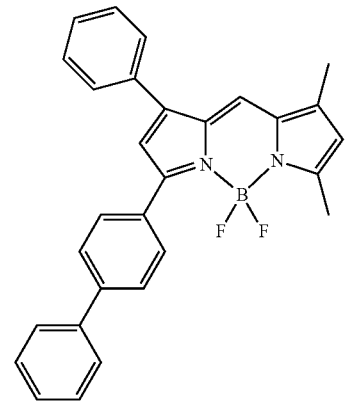
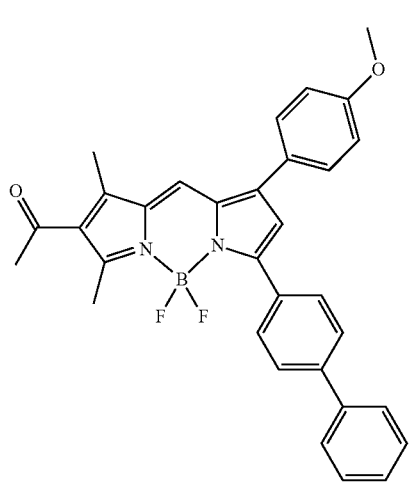
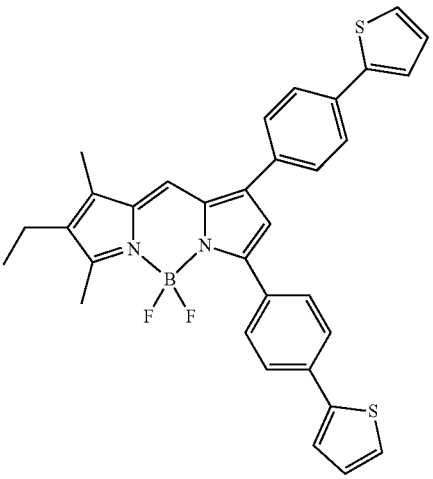
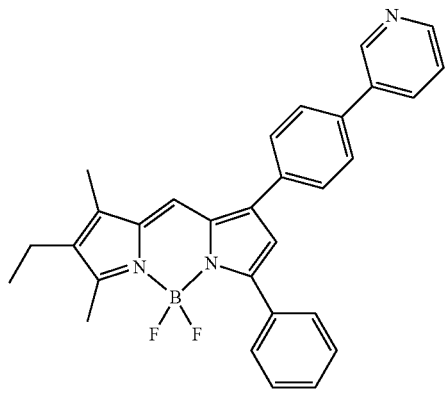
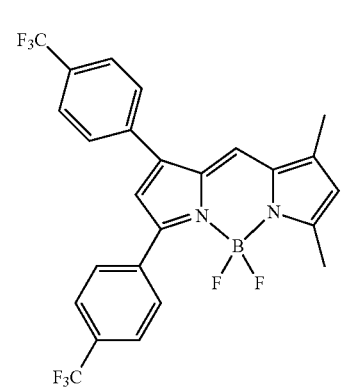
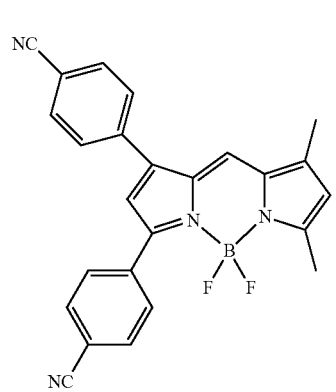

-continued
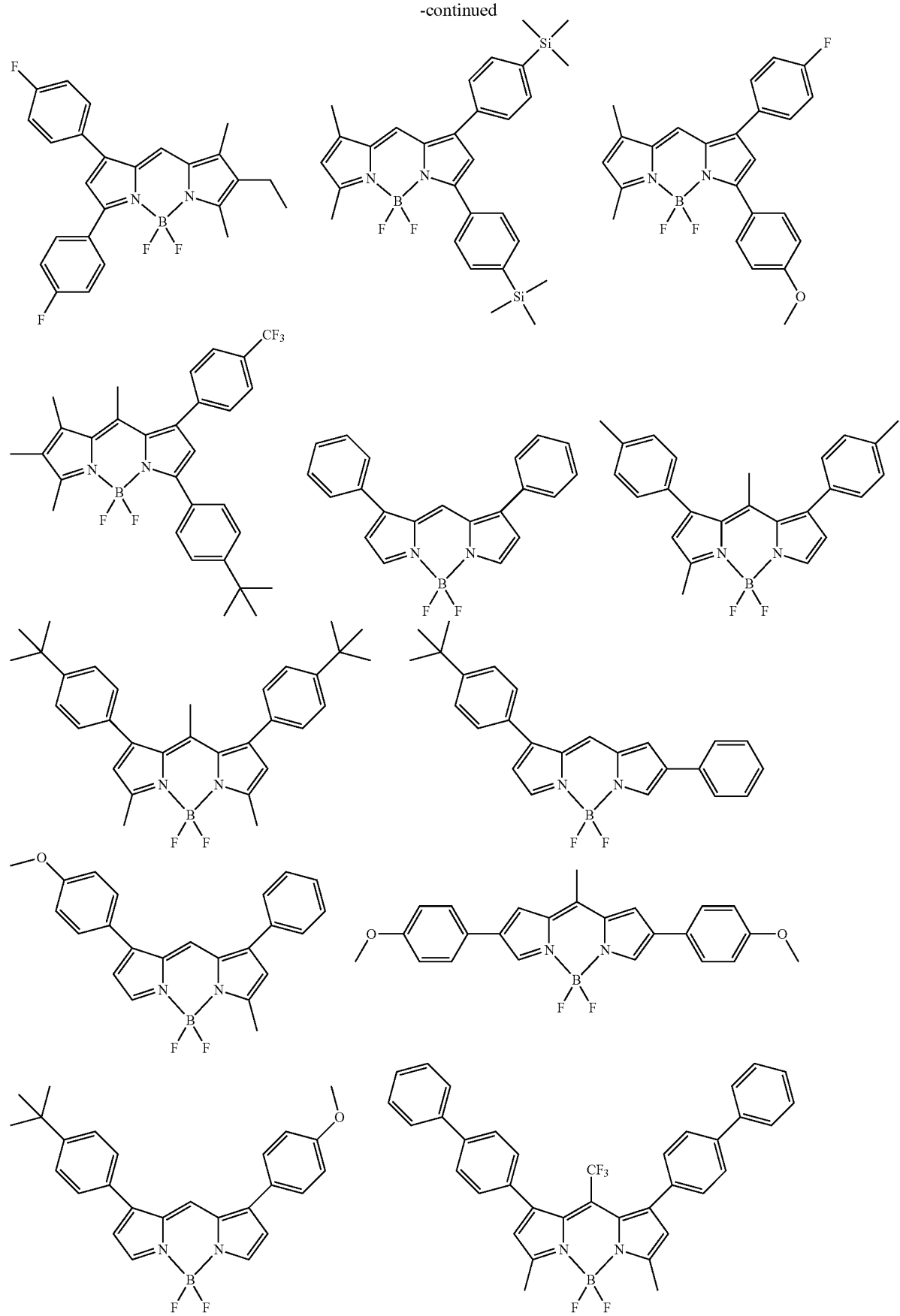

-continued
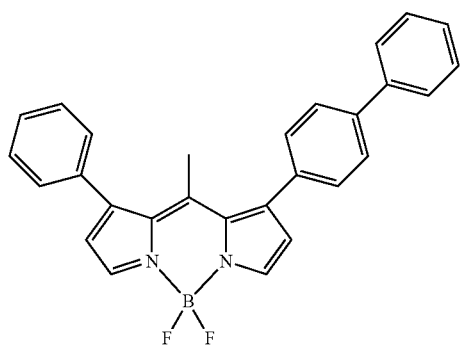
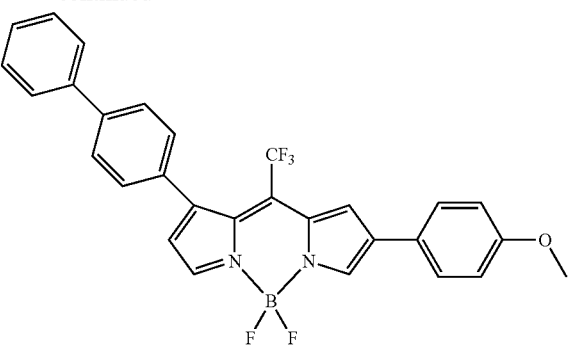
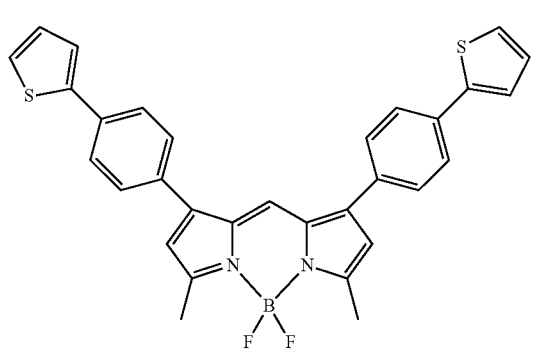
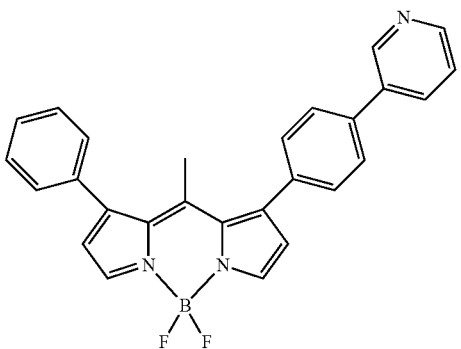
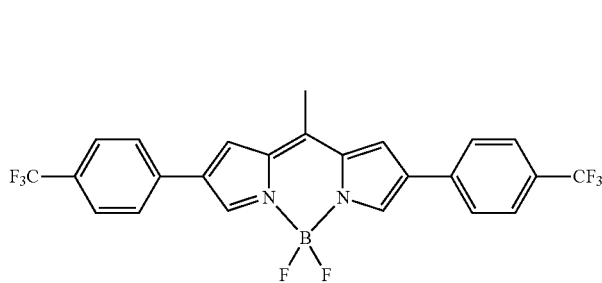
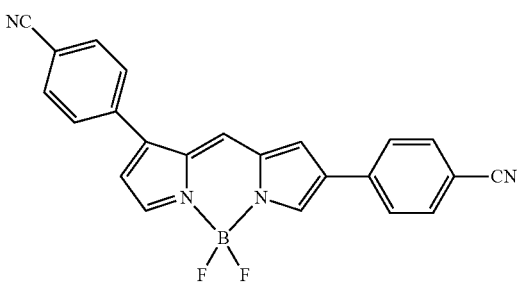
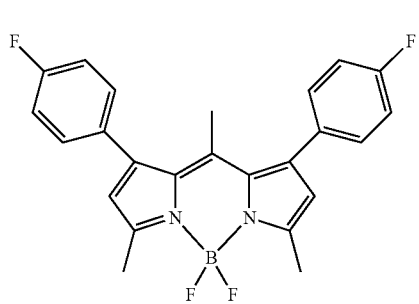
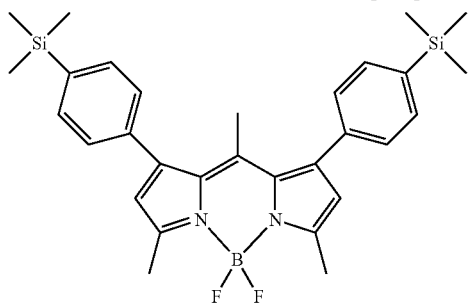
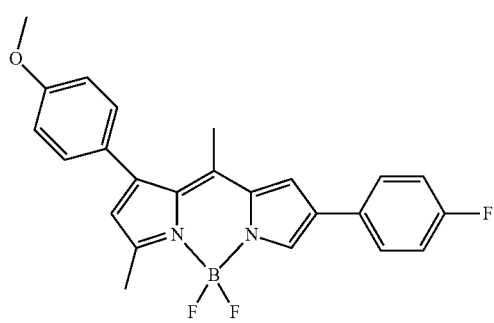
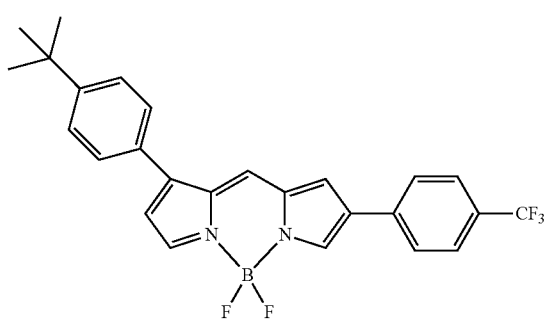

-continued
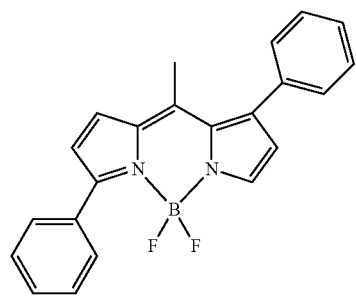
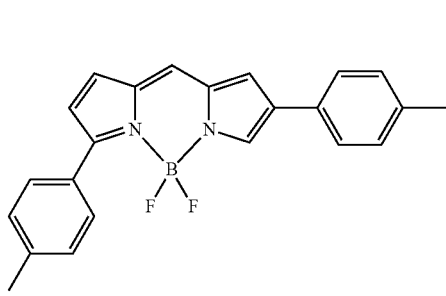
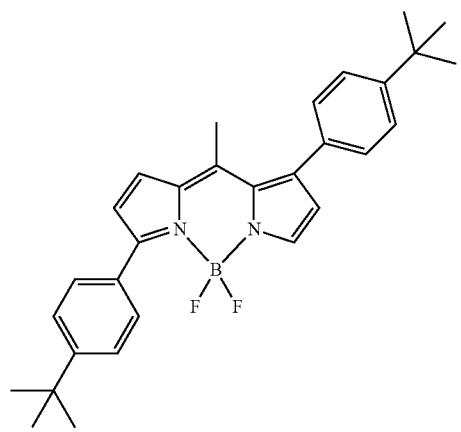
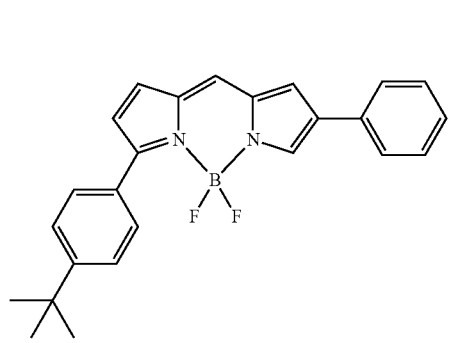
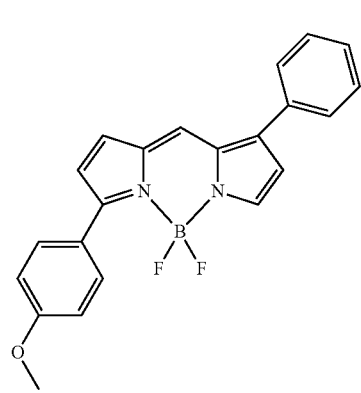
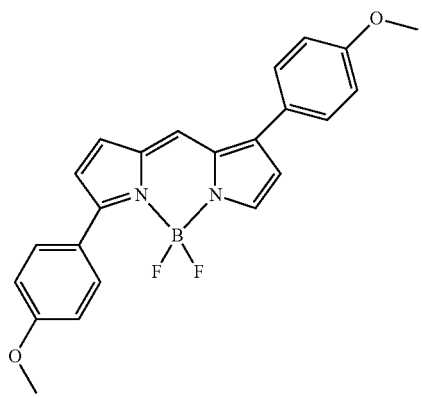
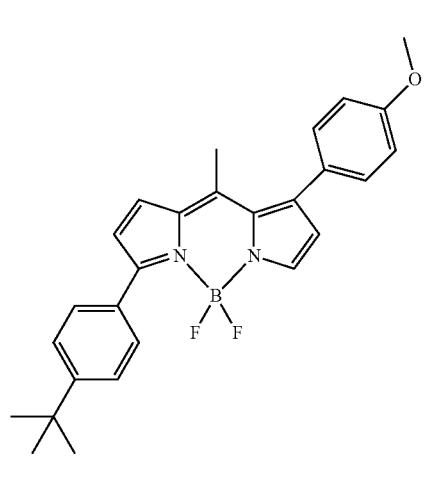
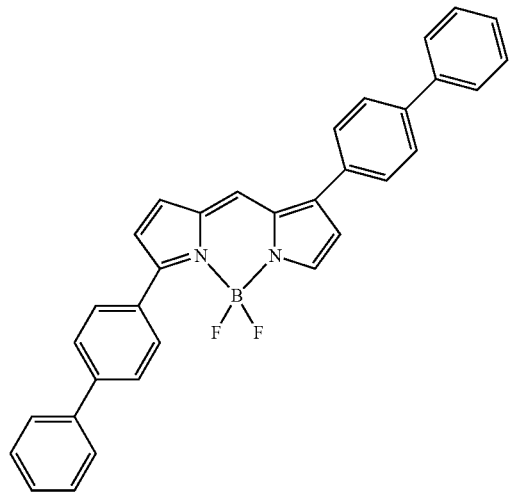

-continued
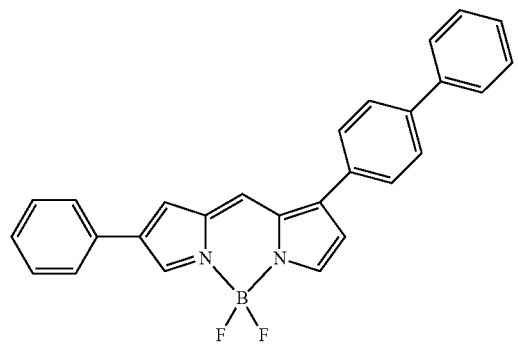
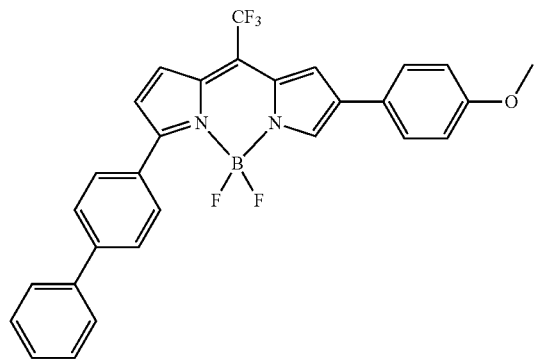
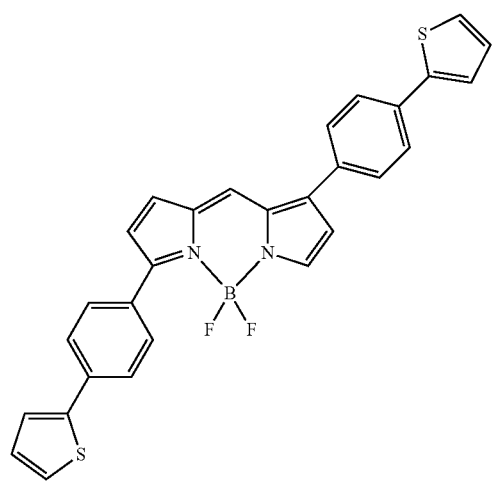
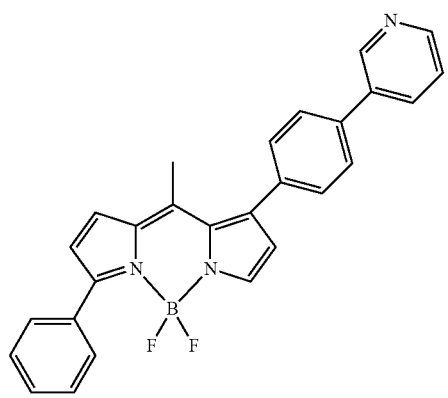
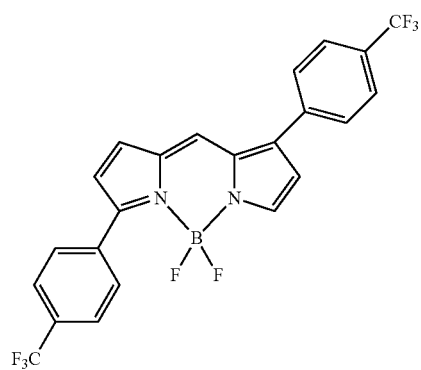
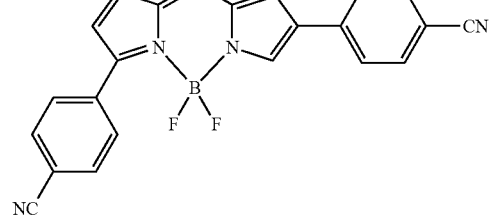
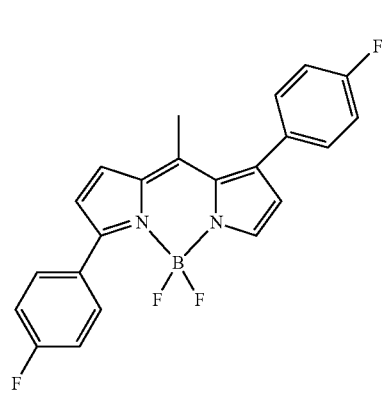
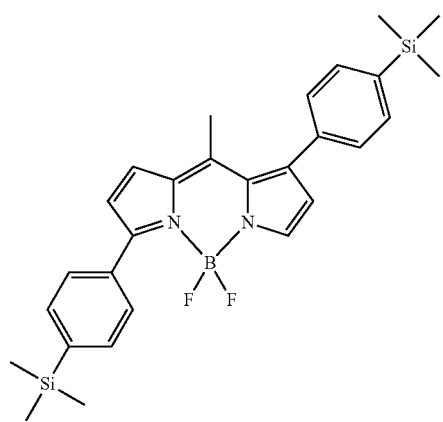

-continued
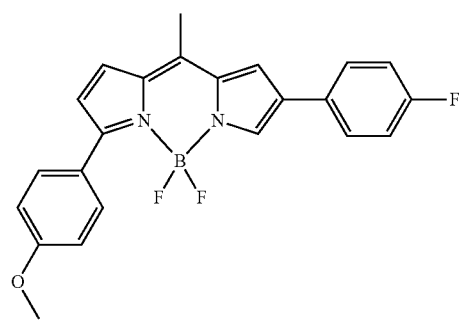
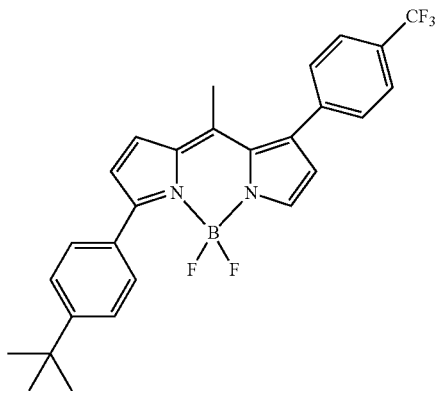
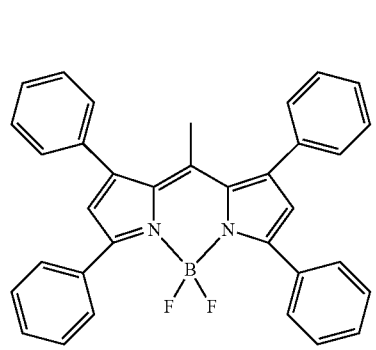
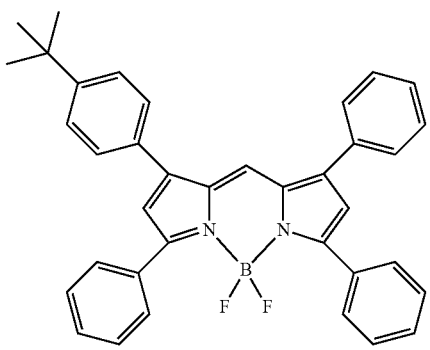
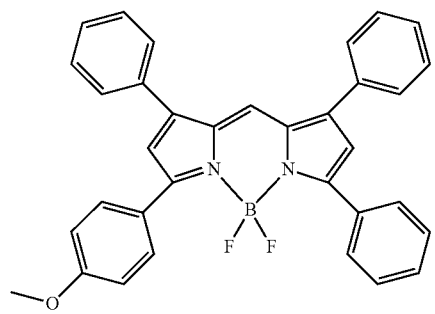
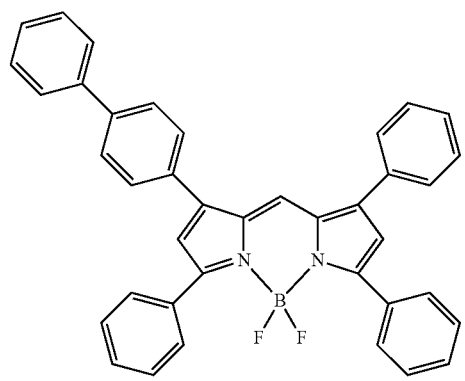
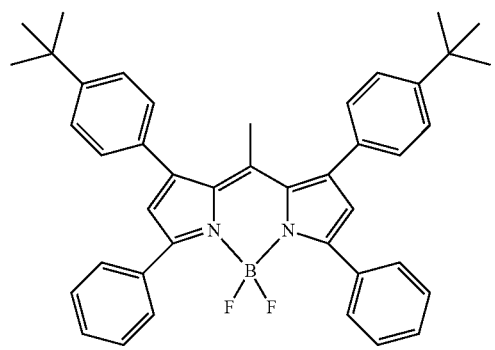
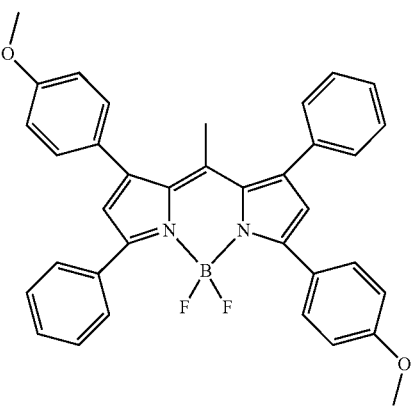

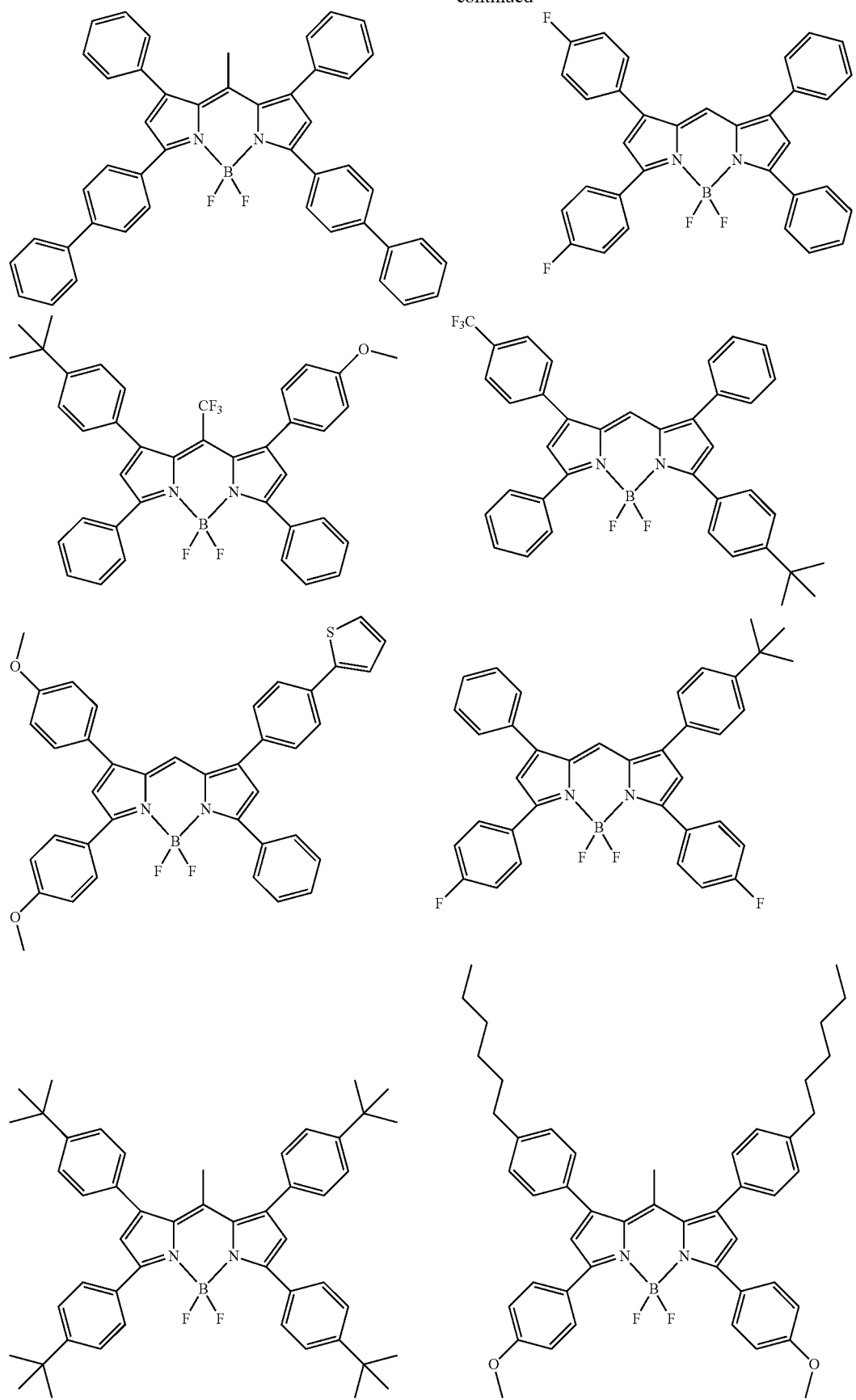

-continued
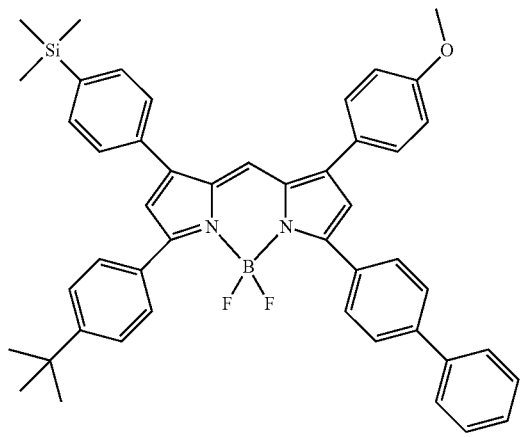
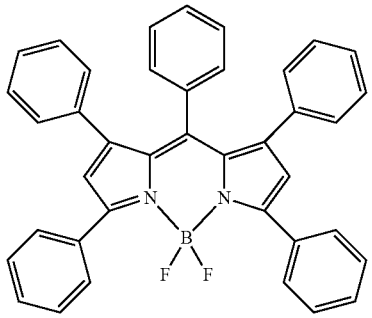
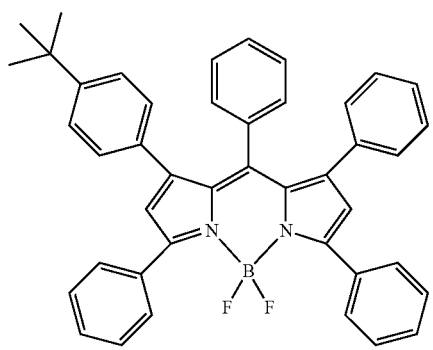
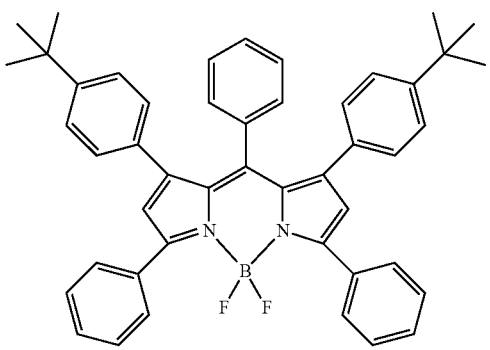
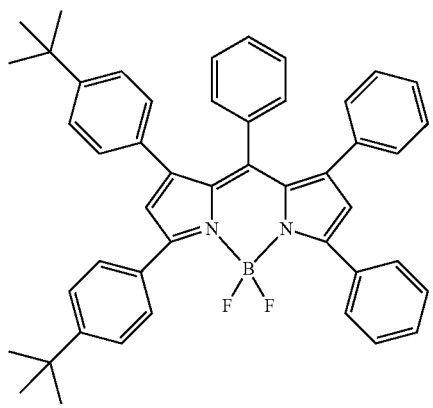
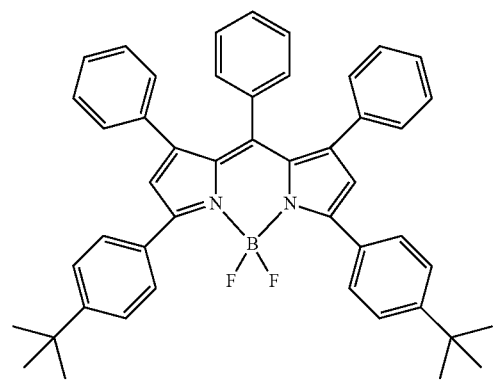
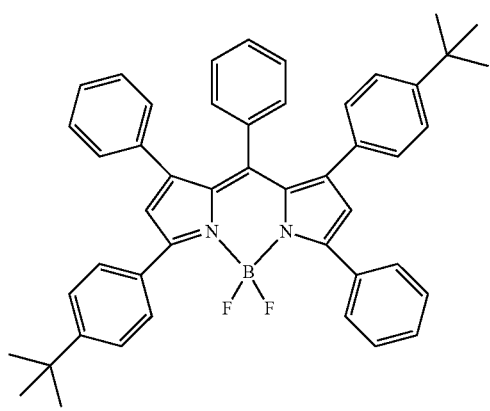
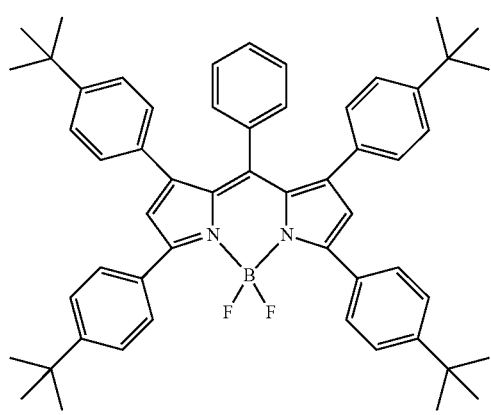

-continued
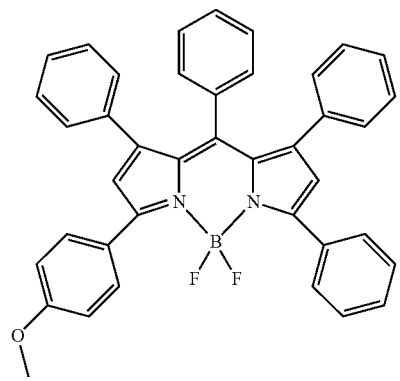
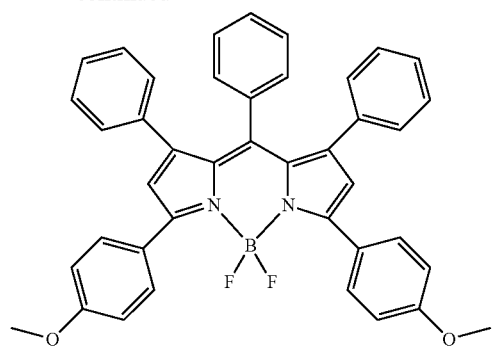
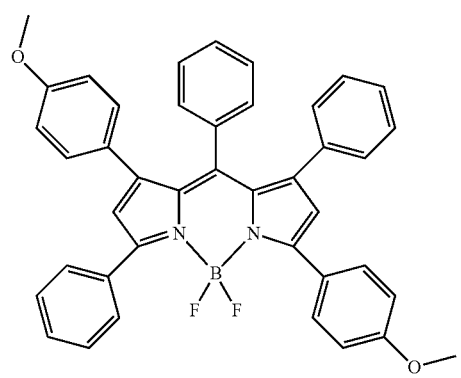
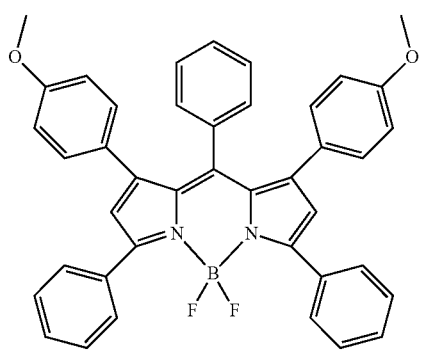
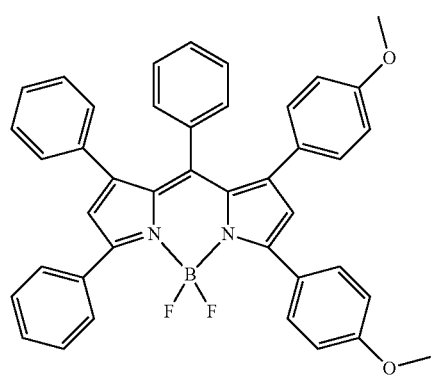
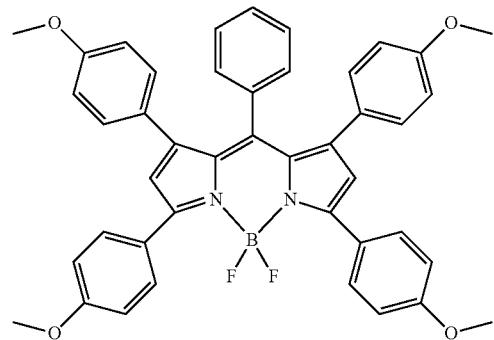
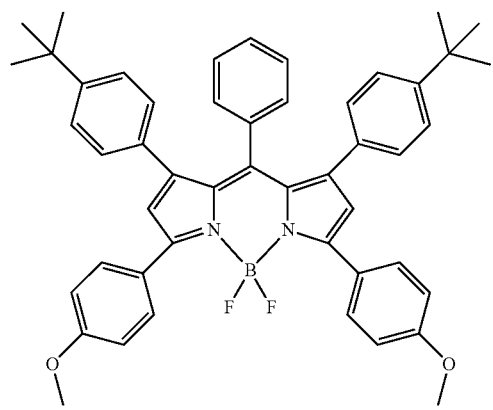
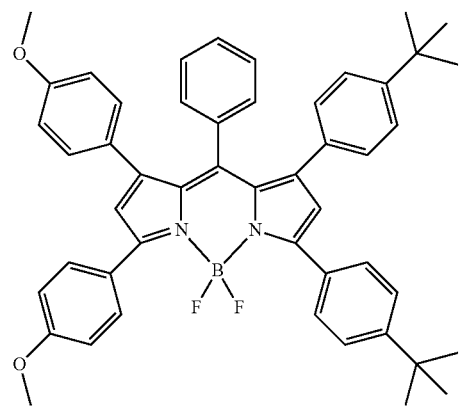

-continued
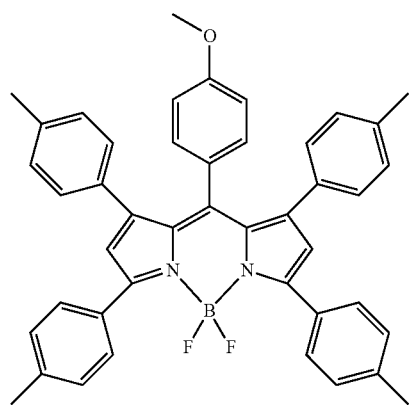
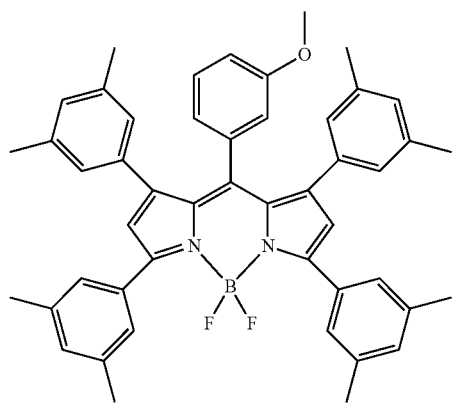
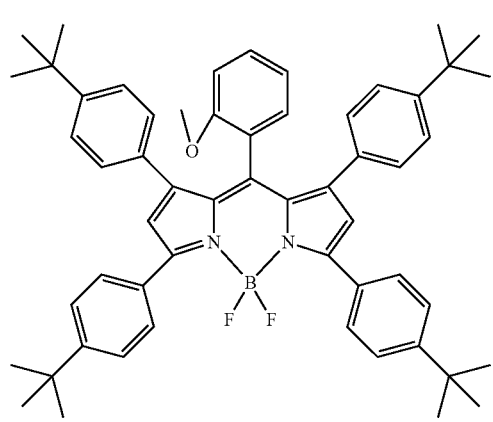
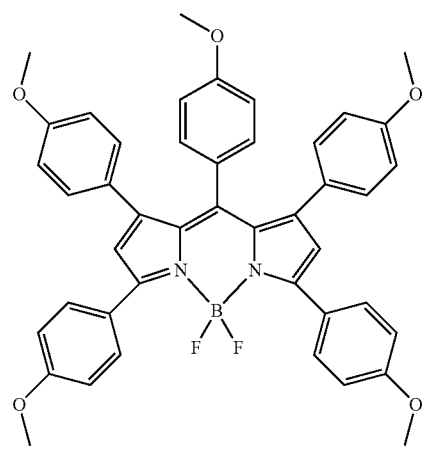
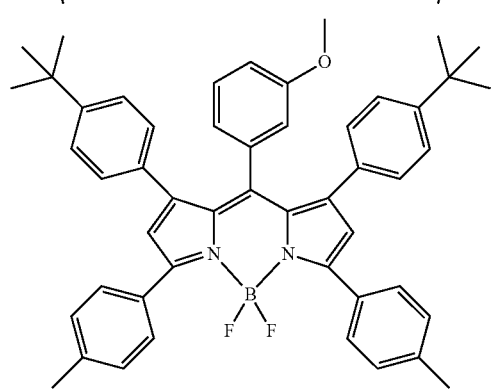
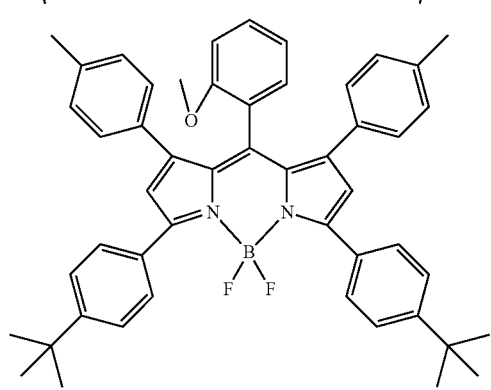
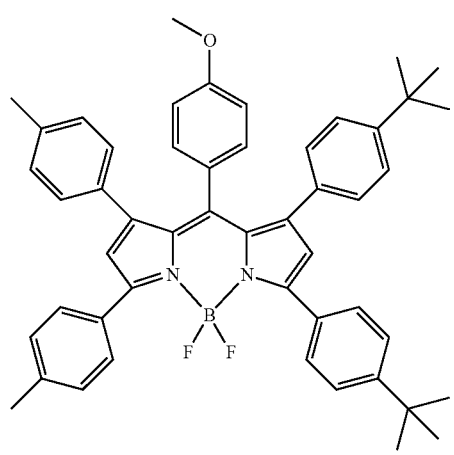
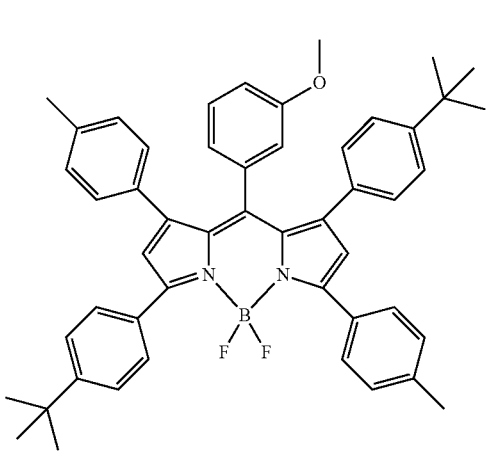

-continued
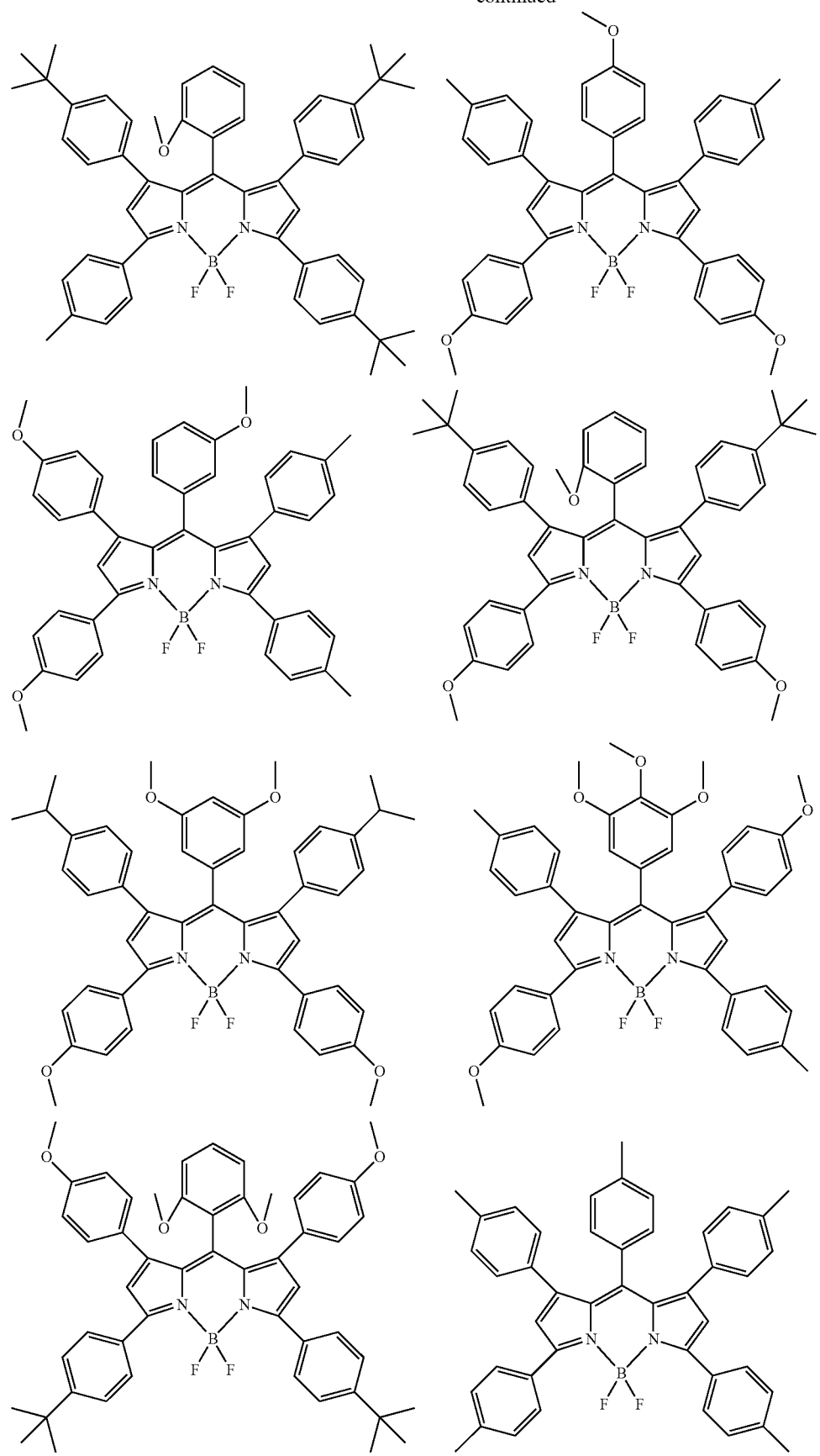

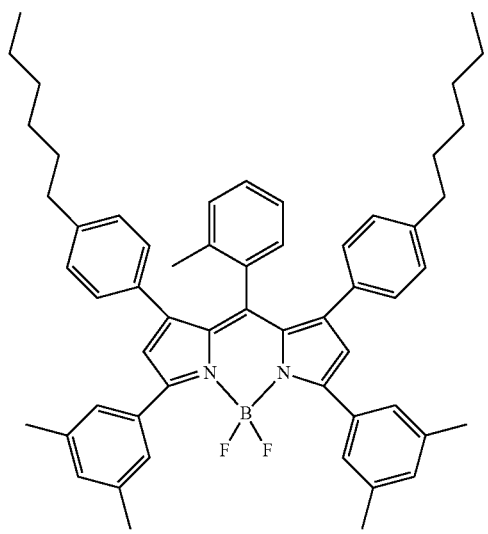
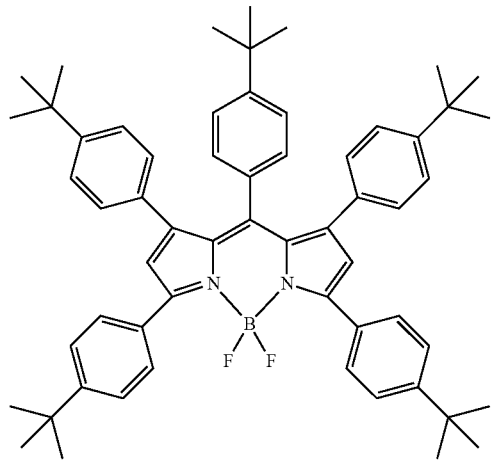
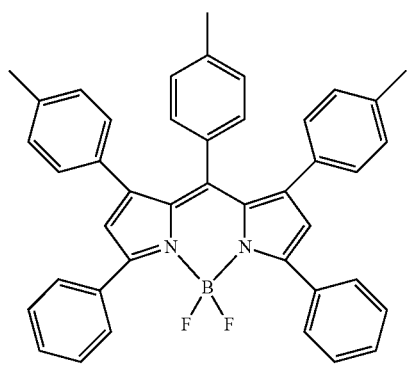
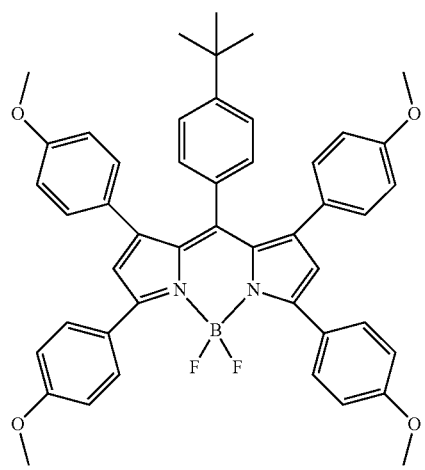
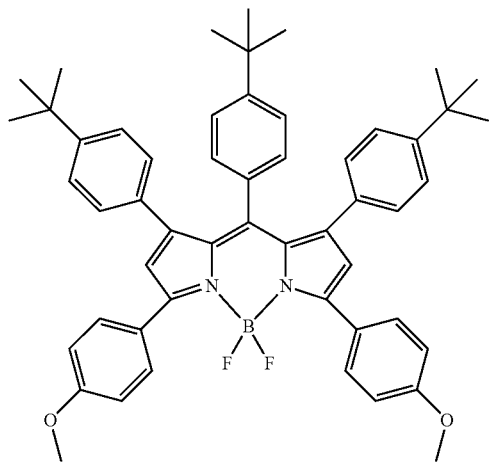
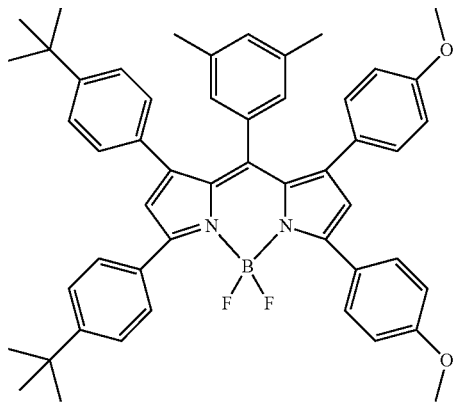

-continued
85
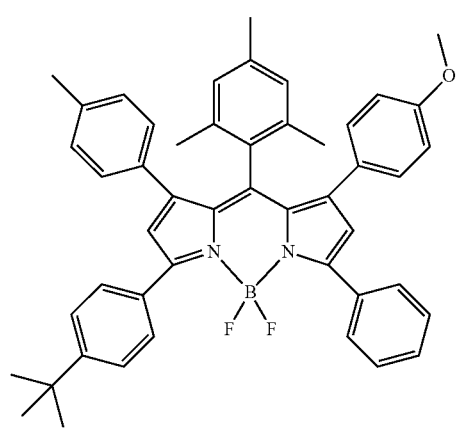
86
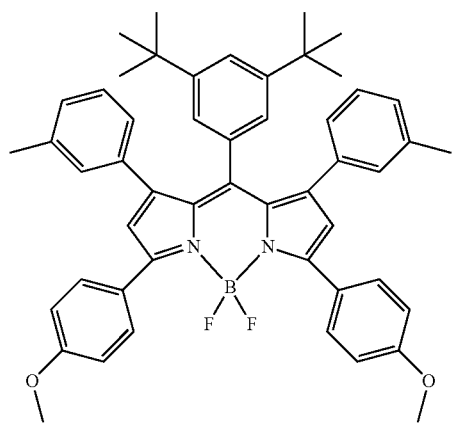
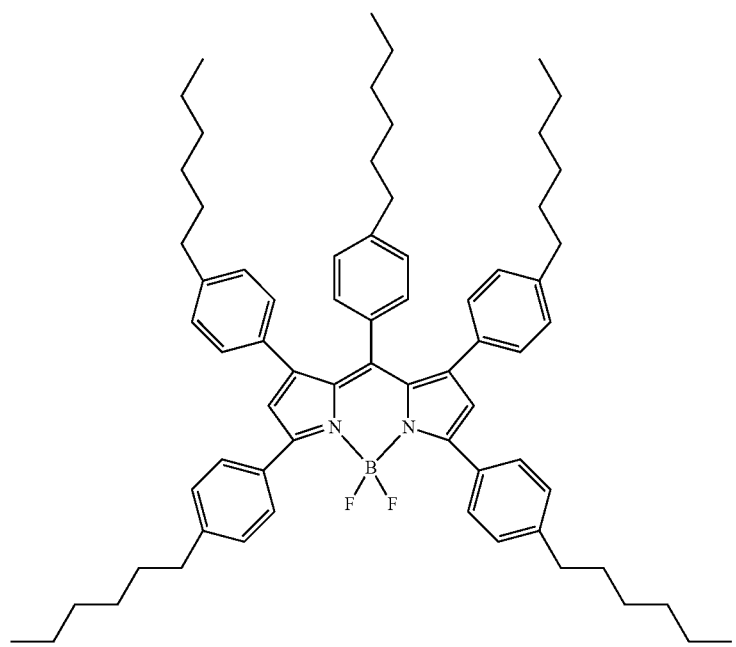
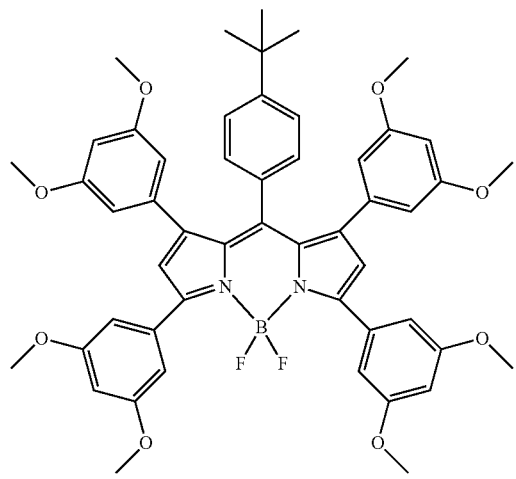
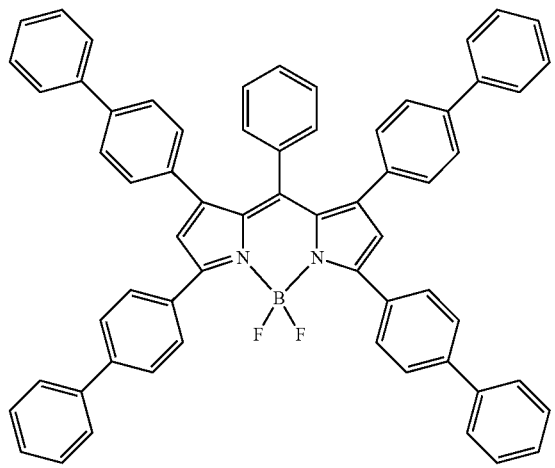

87 88
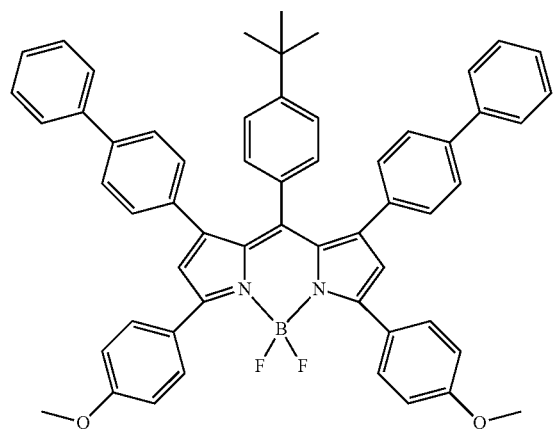
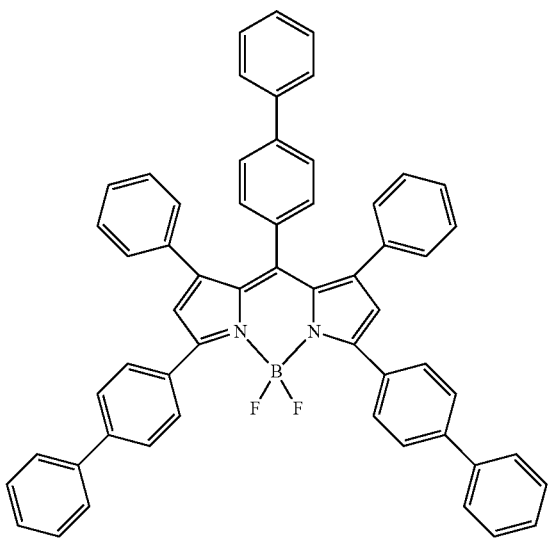
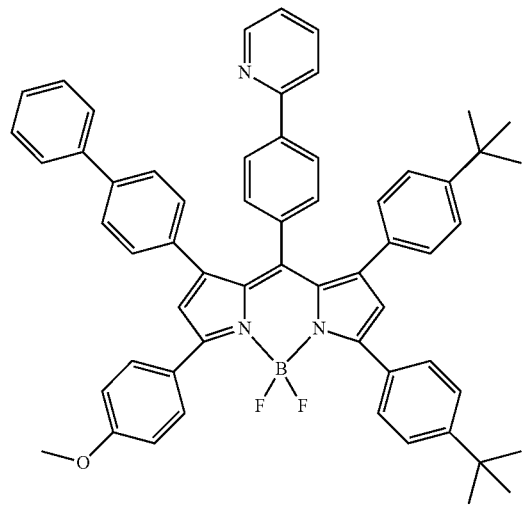
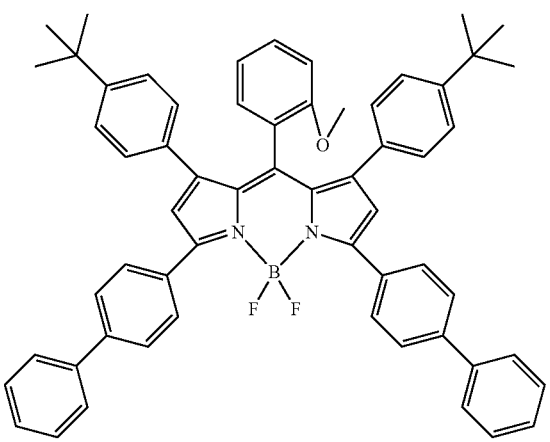
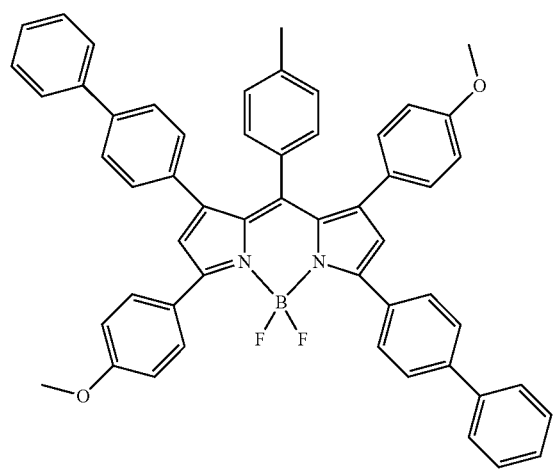
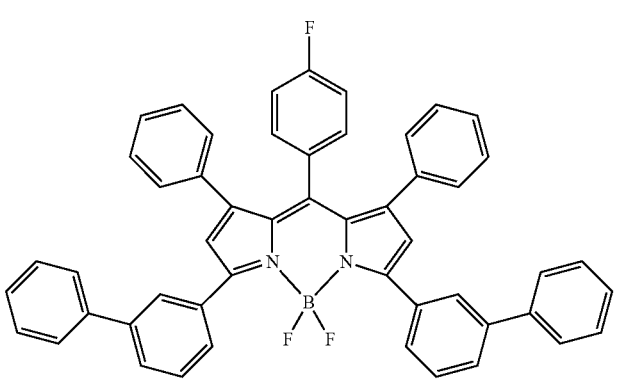

-continued
| 89 | 90 |
|---|---|
| 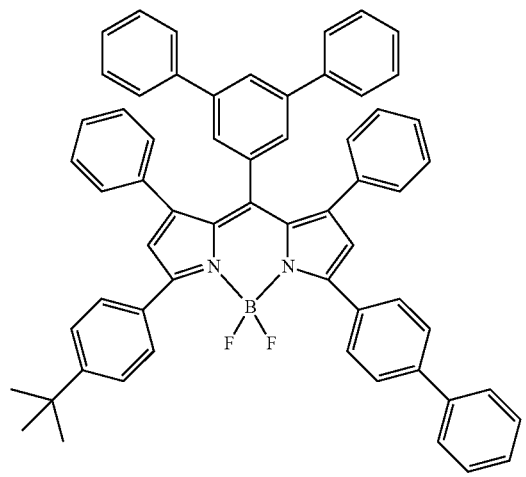 | 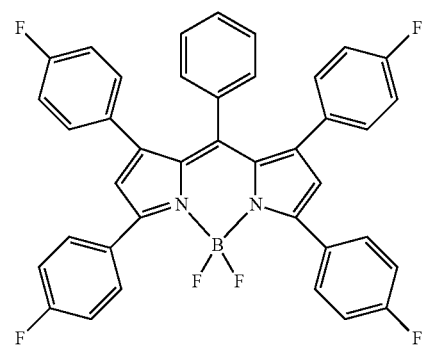 |
| 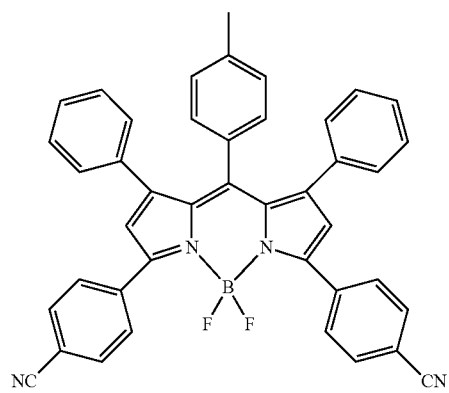 | 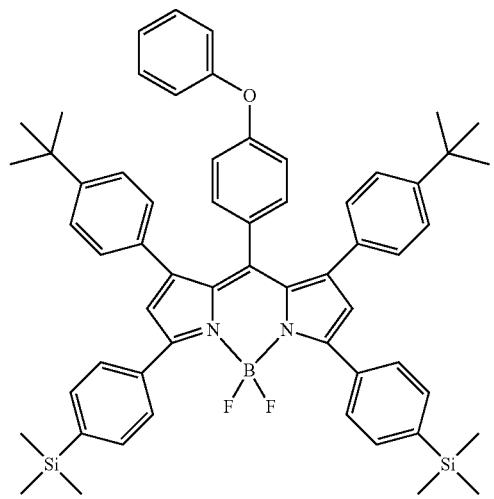 |
| 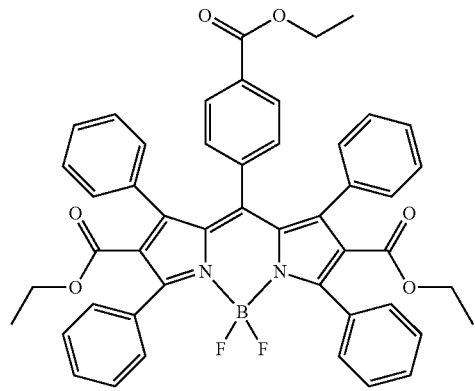 | 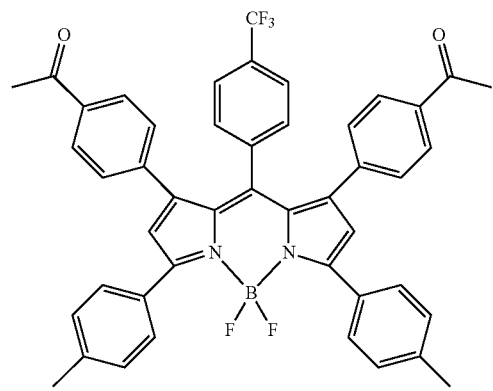 |

-continued
91
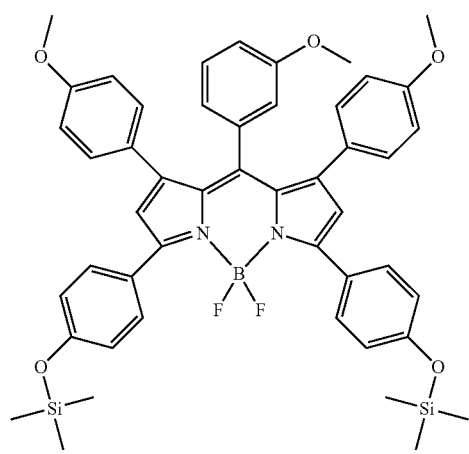
92
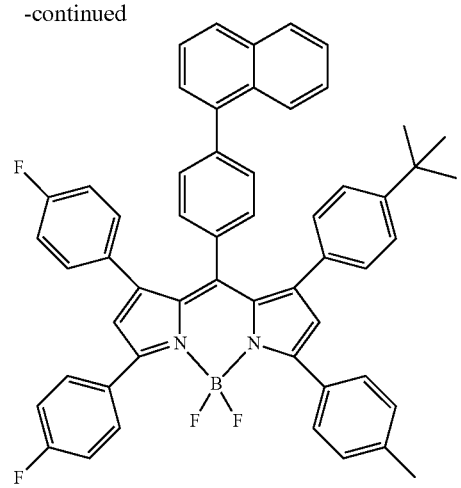
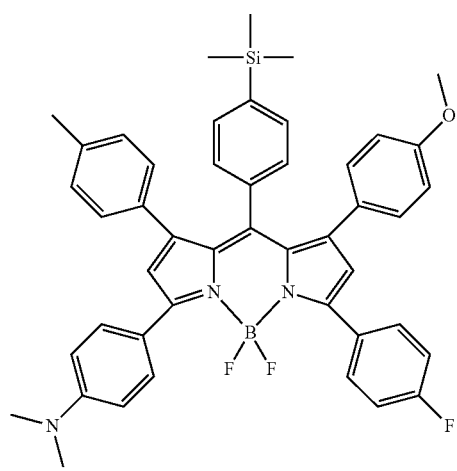
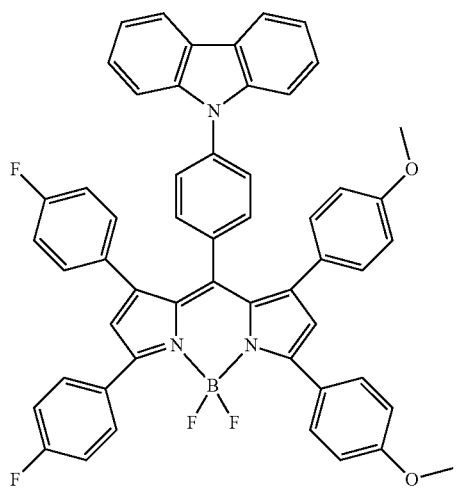
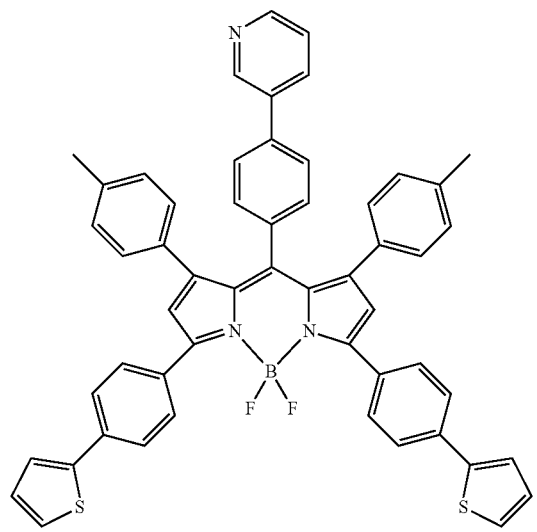
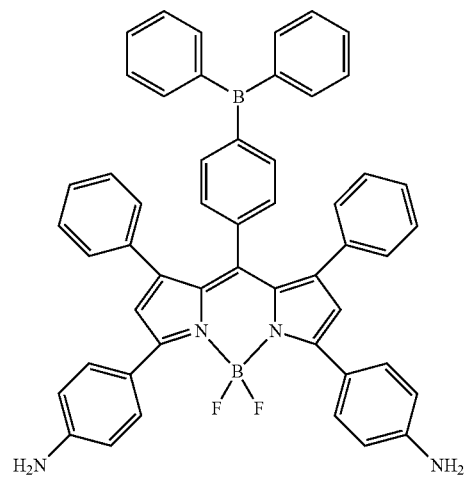

93
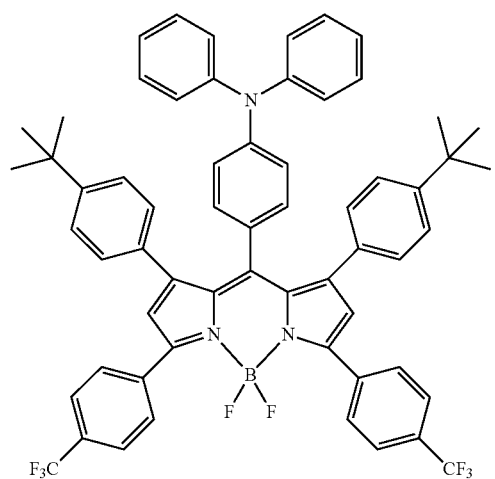
-continued
94
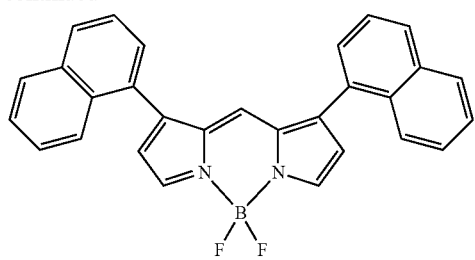
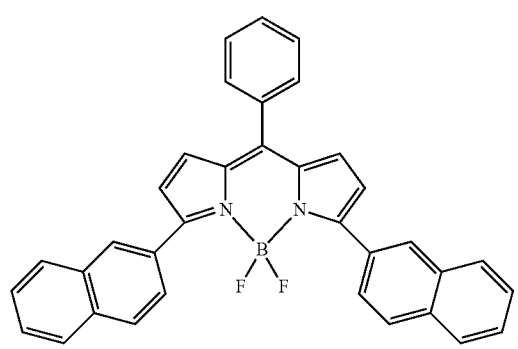
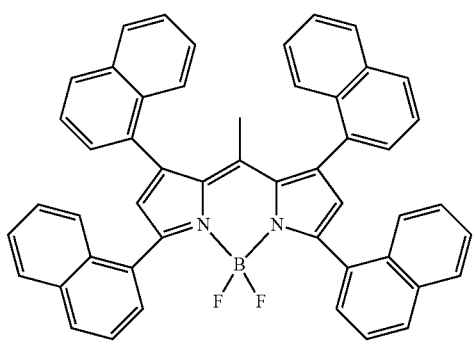
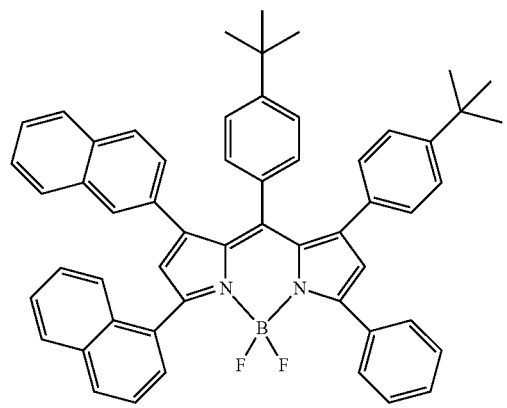
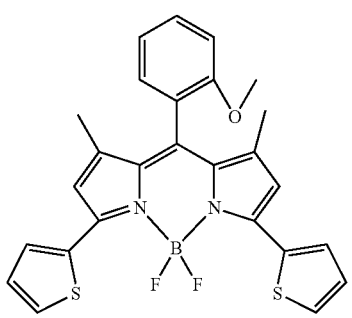
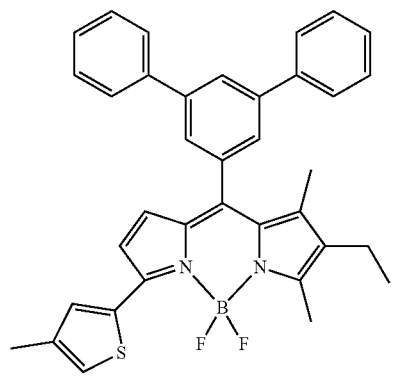
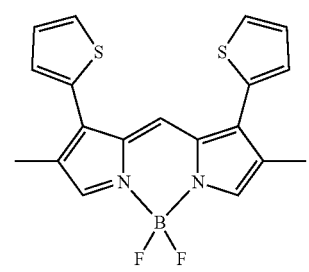
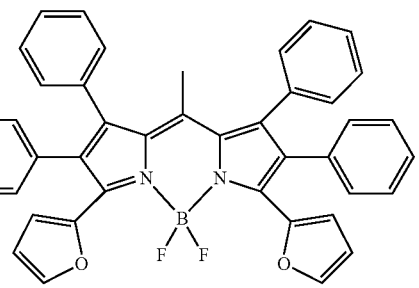

95
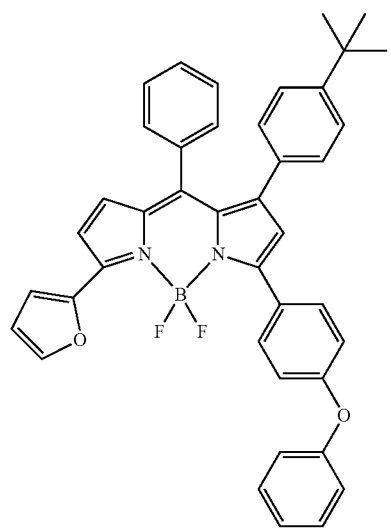
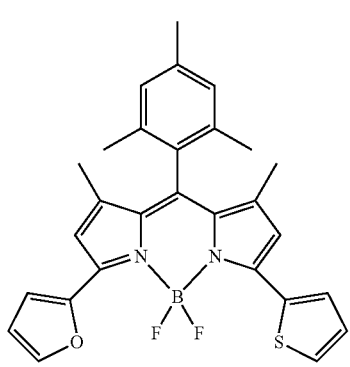
96
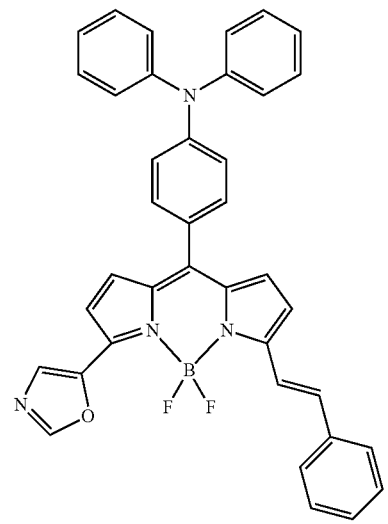
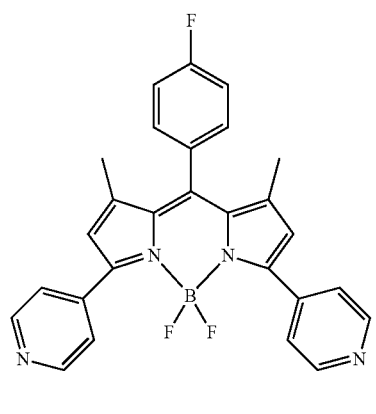
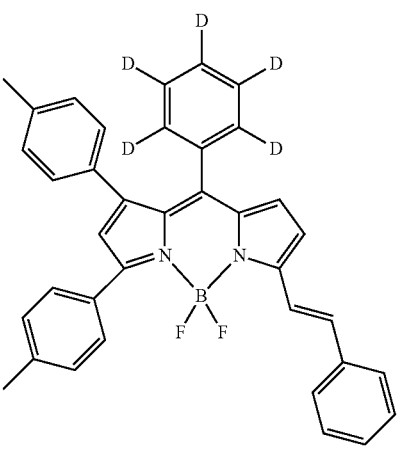
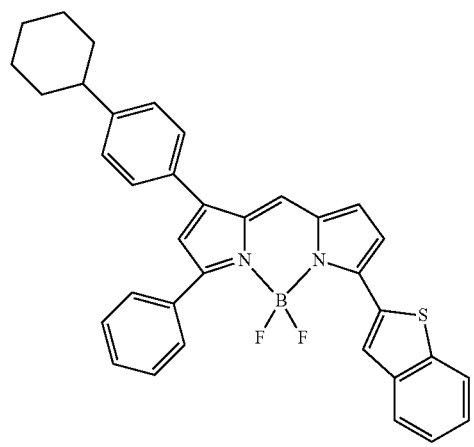
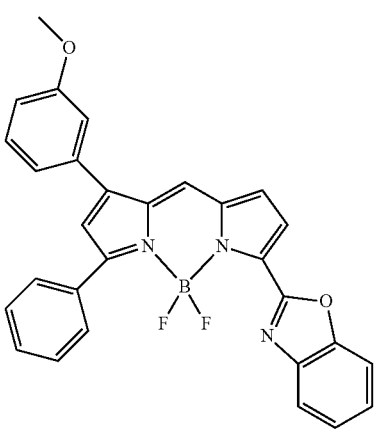

97
-continued
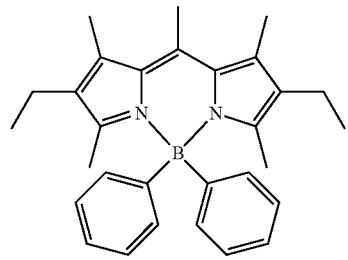 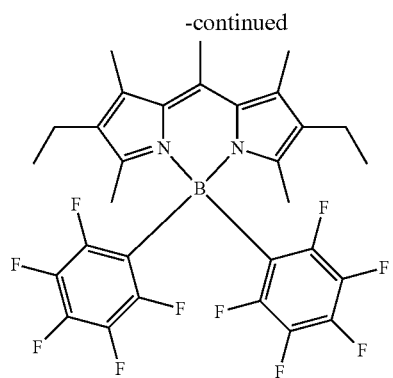 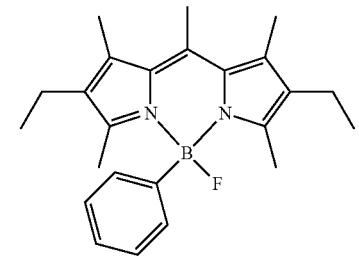
98
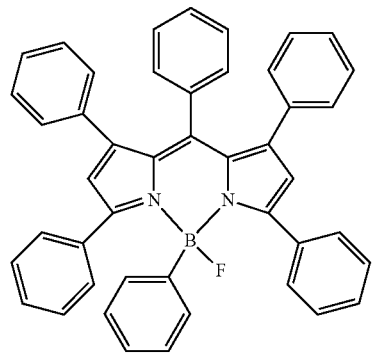 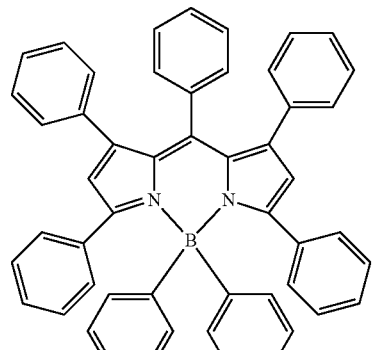 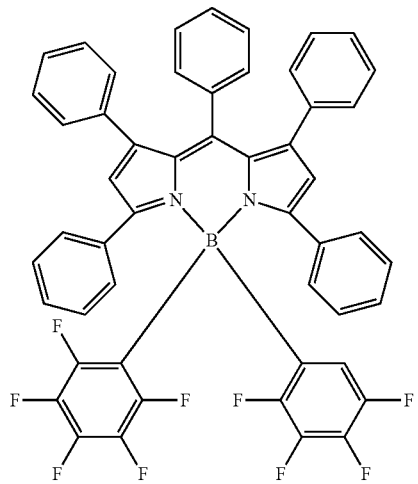
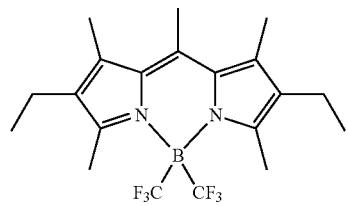 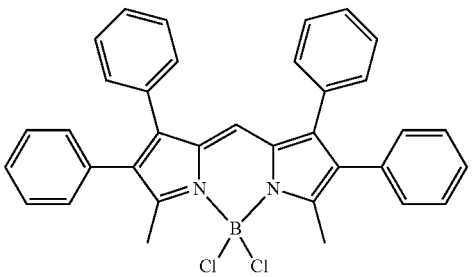 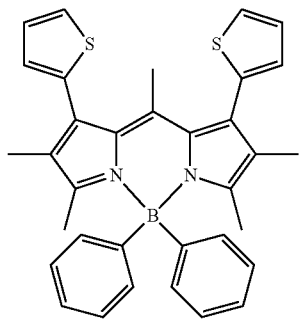
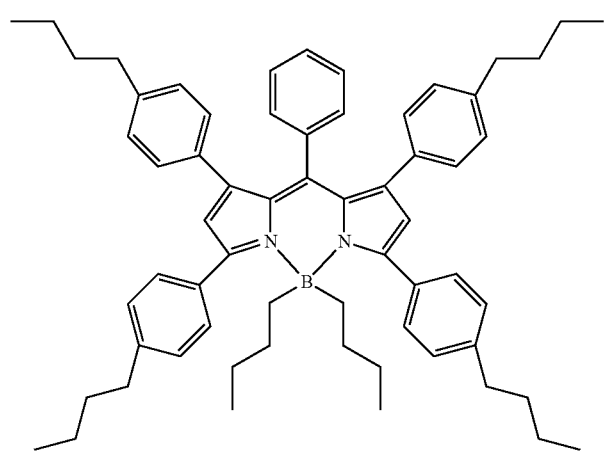 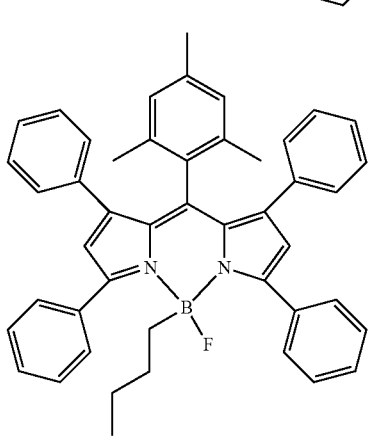

-continued
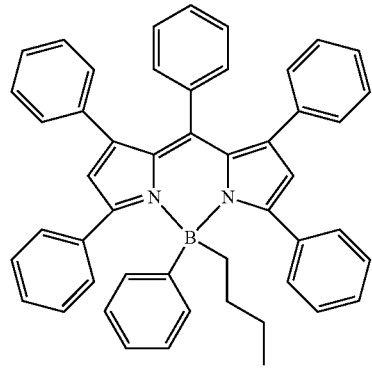
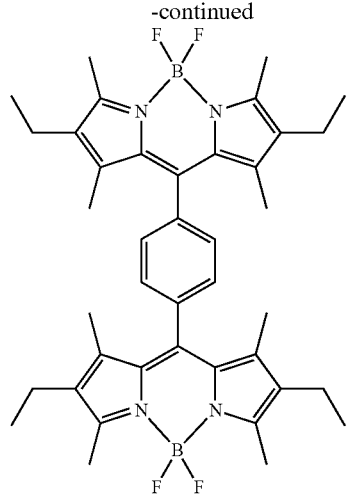
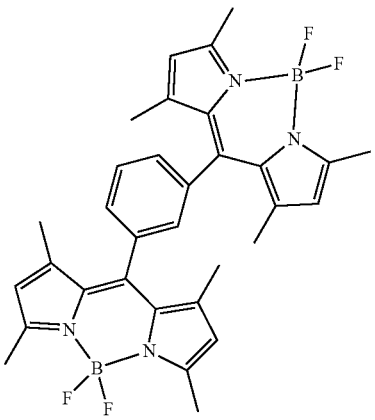
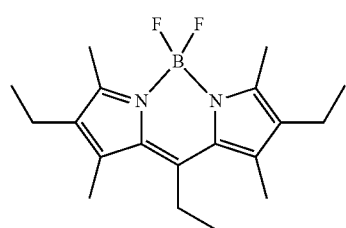
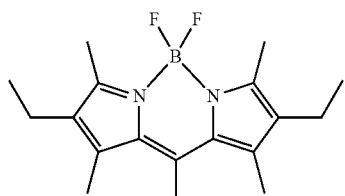
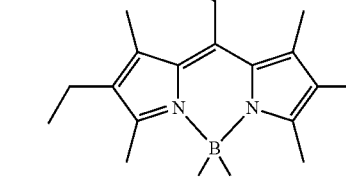
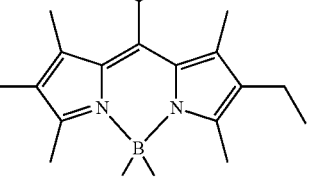
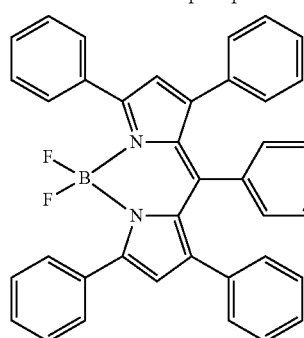
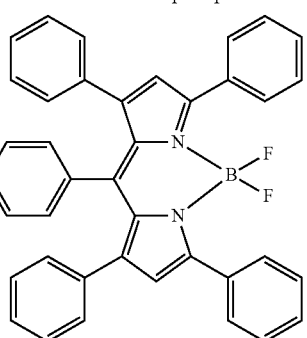
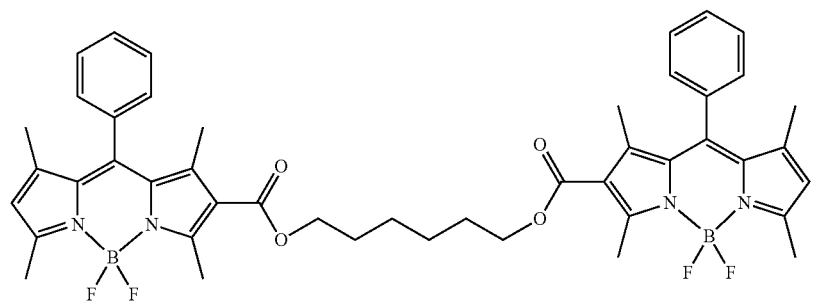

-continued
101
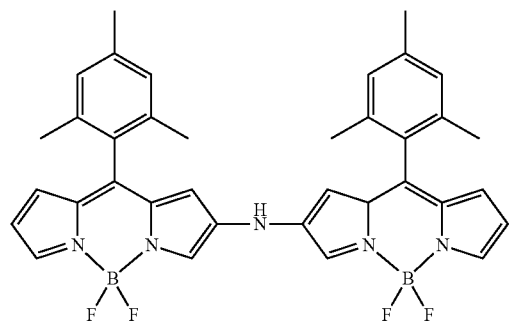
102
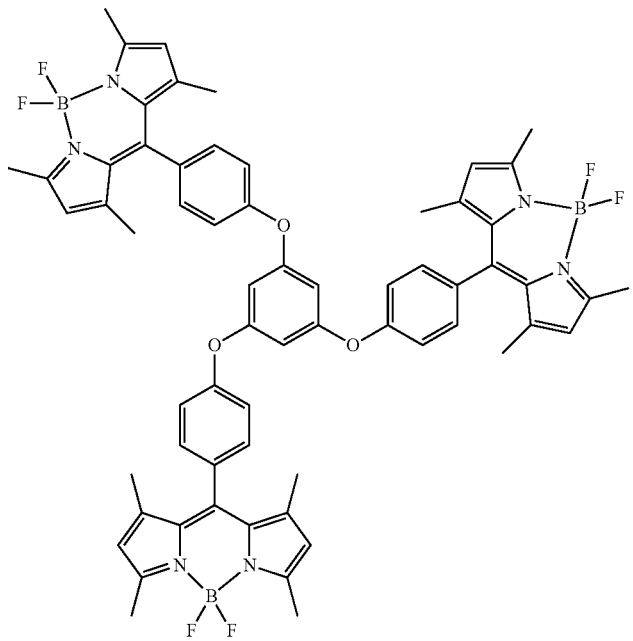
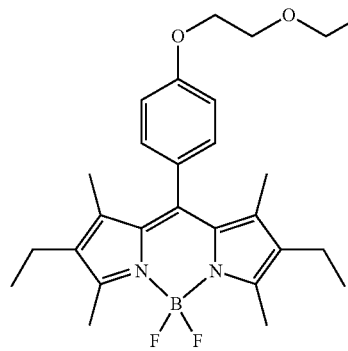
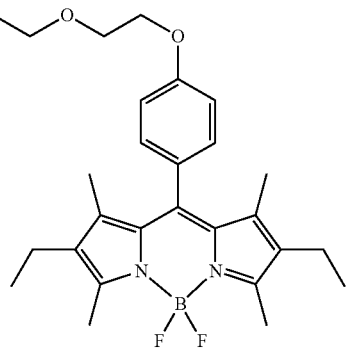
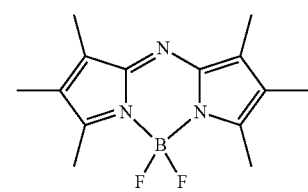
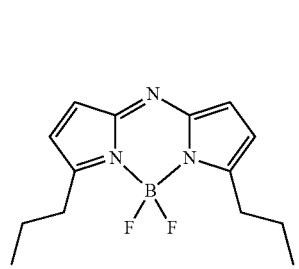
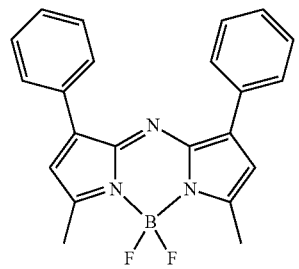
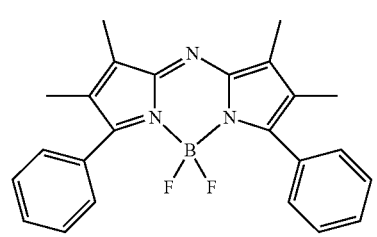
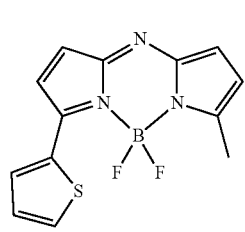
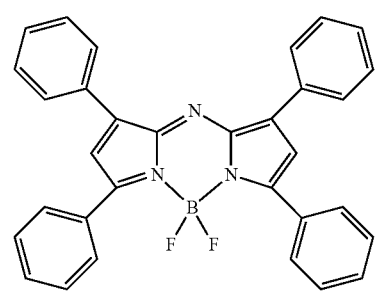
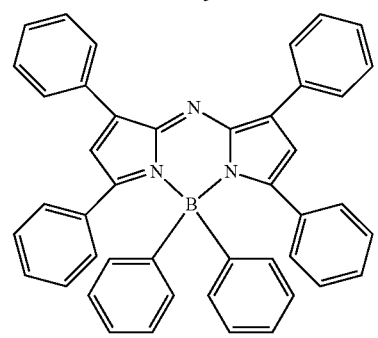

-continued
103
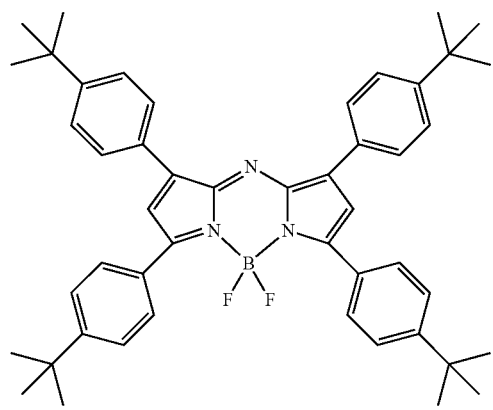
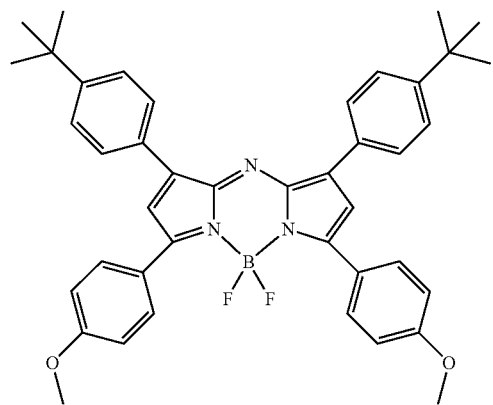
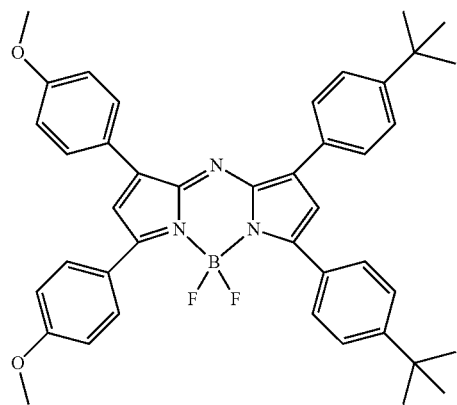
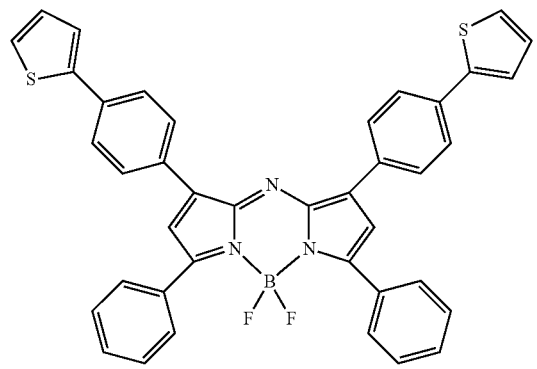
104
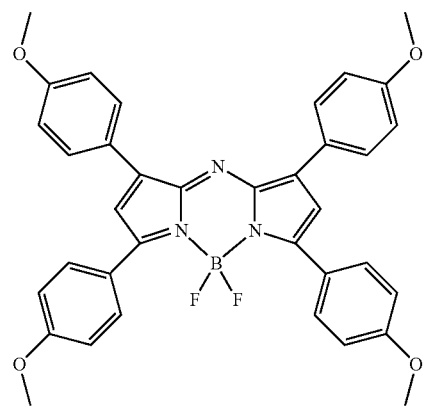
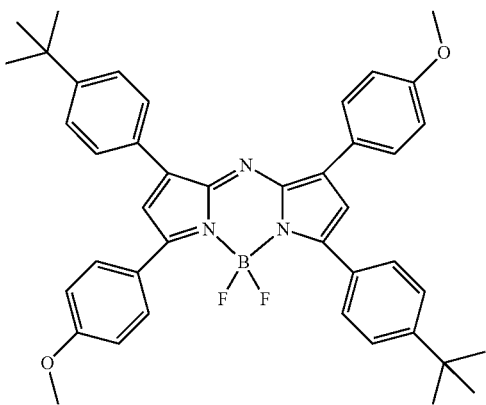
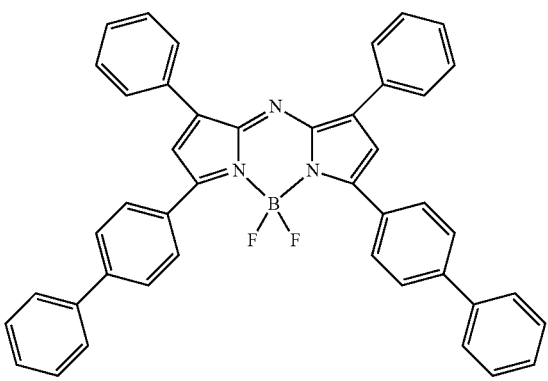
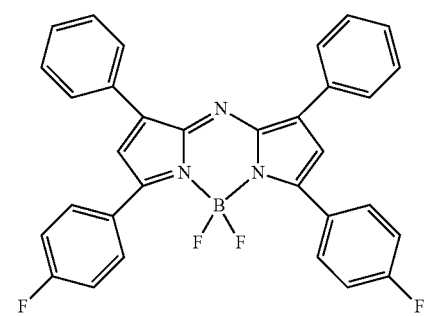

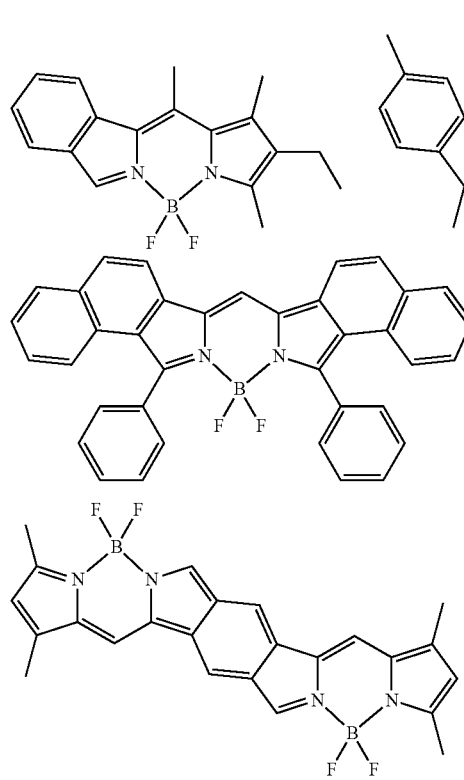
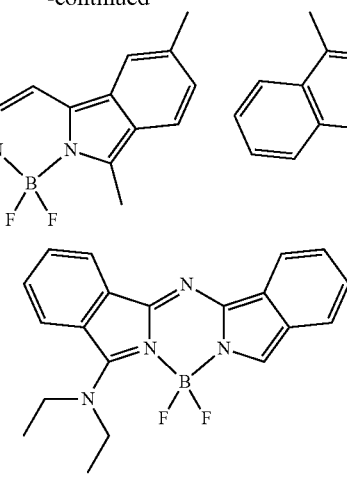

The compound represented by General Formula (1) can be synthesized by a method described in Japanese Translation of PCT Application No. H08-509471 and Japanese Patent Application Laid-open No. 2000-208262, for example. In other words, a pyrromethene compound and a metal salt are reacted with each other in the presence of a base to obtain a target pyrromethene-based metal complex.

For the synthesis of a pyrromethene-boron fluoride complex, methods described in J. Org. Chem., vol. 64, No. 21, pp. 7813-7819 (1999), Angew. Chem., Int. Ed. Engl., vol. 36, pp. 1333-1335 (1997), and the like are referred to, whereby the compound represented by General Formula (1) can be synthesized. Examples of the methods include a method that heats a compound represented by the following General Formula (3) and a compound represented by the following General Formula (4) in 1,2-dichloroethane in the presence of phosphoryl chloride and reacts them with a compound represented by the following General Formula (5) in 1,2-dichloroethane in the presence of triethylamine, thereby obtaining the compound represented by General Formula (1). However, the present invention is not limited to this method. $R^1$ to $R^9$ are similar to those described above. J represents halogen.

(3)

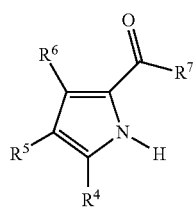

(4)

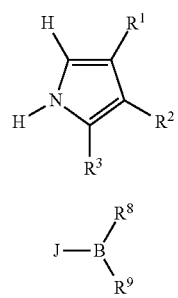

(5)

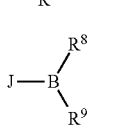

In addition, in introducing an aryl group or a heteroaryl group, there is a method that forms a carbon-carbon bond using a coupling reaction between a halogenated derivative and boronic acid or an esterified boronic acid derivative; the present invention is not limited to this method. Similarly, in introducing an amino group or a carbazolyl group, there is a method that forms a carbon-nitrogen bond using a coupling reaction between a halogenated derivative and an amine or a carbazole derivate in the presence of a metallic catalyst such as palladium, for example; the present invention is not limited to this method.

The color conversion sheet according to the embodiment of the present invention can contain other compounds as appropriate as needed, in addition to the compound represented by General Formula (1). To further increase energy transfer efficiency to the compound represented by General Formula (1) from the excitation light, assist dopants such as rubrene may be contained, for example. When any light emission color other than the light emission color of the compound represented by General Formula (1) is desired to be added, the color conversion composition can add desired organic light-emitting materials including organic light-emitting materials such as coumarin-based dyes and rhodamine-based dyes. Other than these organic light-emitting materials, known light-emitting materials such as inorganic fluorescent bodies, fluorescent pigments, fluorescent dyes, and quantum dots can be added in combination.

The following shows examples of the organic light-emitting material other than the compound represented by General Formula (1); the present invention is not limited particularly to these examples.

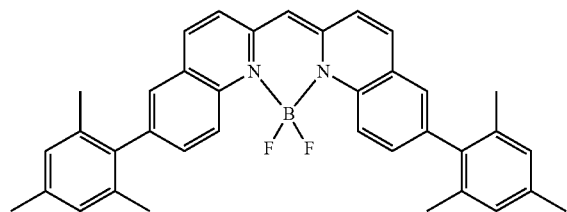

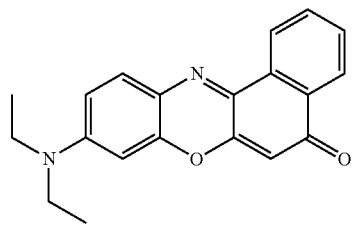

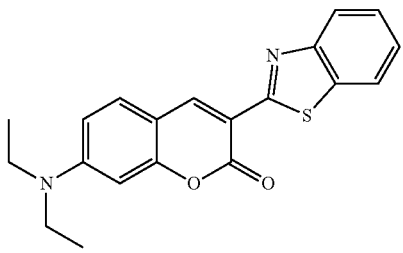

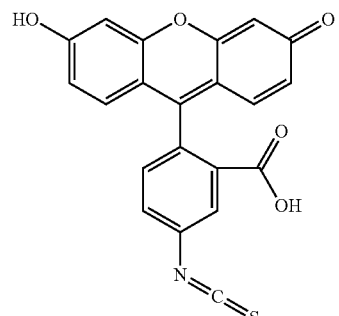

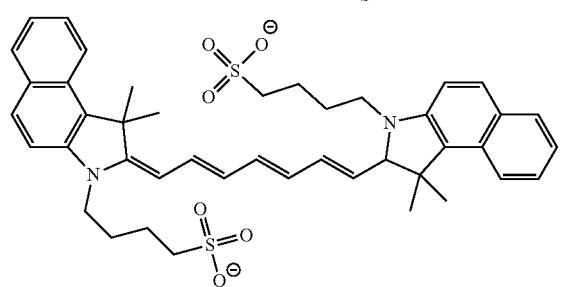

-continued

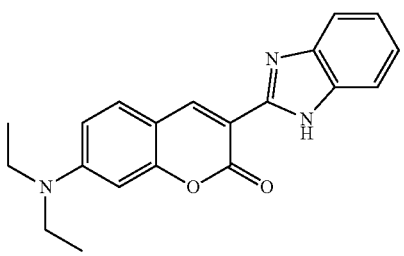

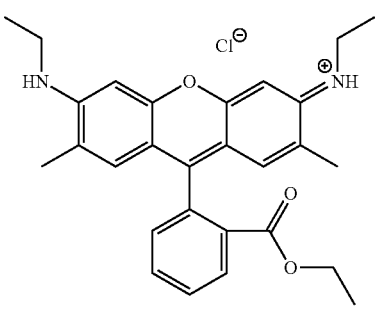

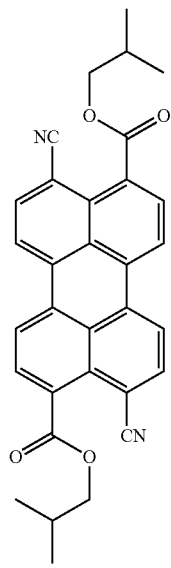

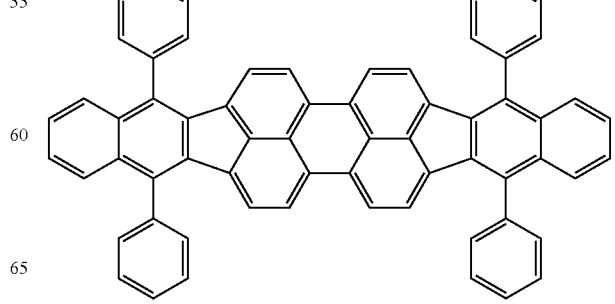

109
-continued
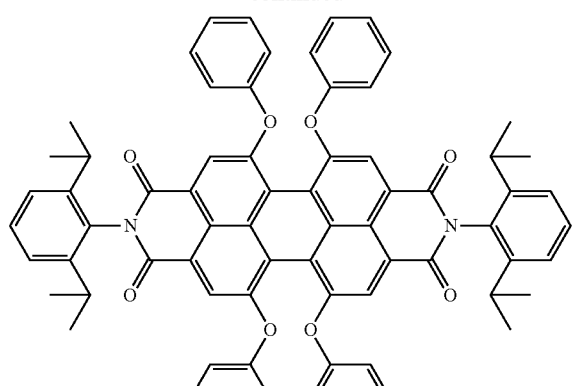
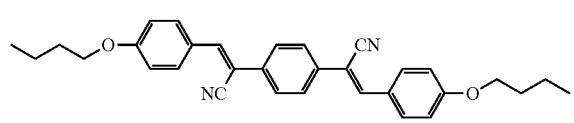
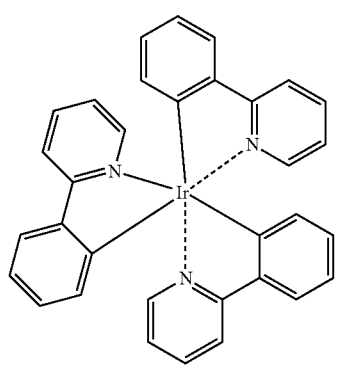
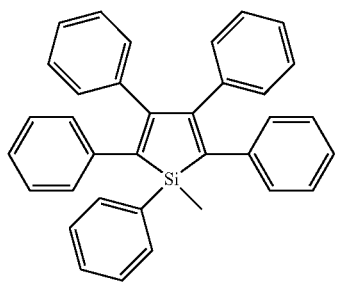
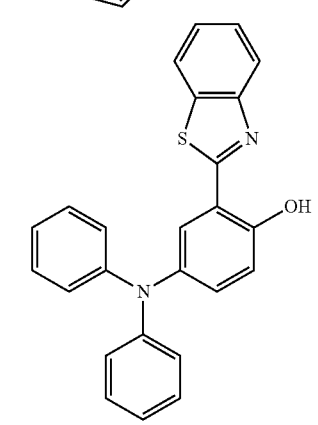
110
-continued
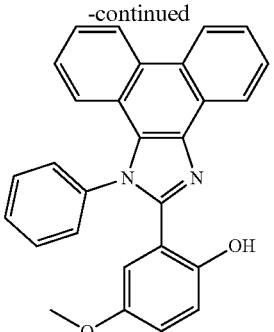
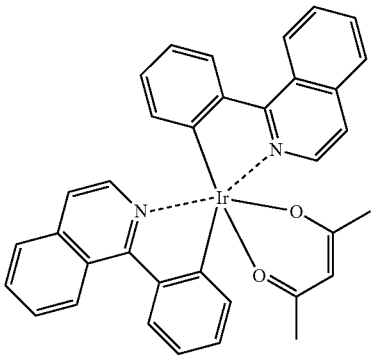
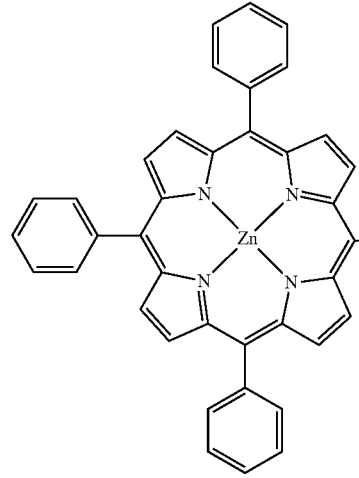
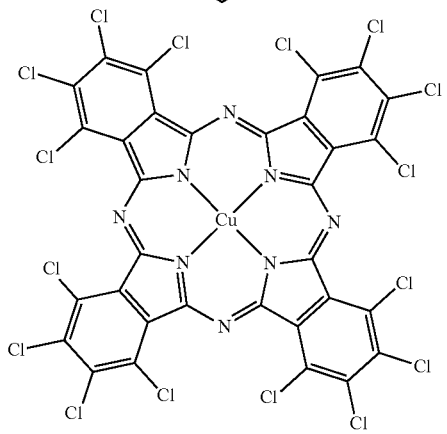
In the color conversion sheet according to the embodiment of the present invention, the content of the organic light-emitting material in each of the layer (A) and the layer (B), which depends on the molar extinction coefficient, the emission quantum yield, and the absorption intensity at an excitation wavelength of the compound and the thickness and the transmittance of a sheet to be prepared, is usually $1.0\times10^{-4}$ part by weight to 30 parts by weight relative to 100 parts by weight of the binder resin. In particular, the content of the organic light-emitting material in each of the layers is further preferably $1.0\times10^{-3}$ part by weight to 10 parts by weight and particularly preferably $5.0\times10^{-3}$ part by weight to 5 parts by weight relative to 100 parts by weight of the binder resin.

In the color conversion sheet according to the embodiment of the present invention, part of the green light emission is converted into the red light emission, and a content $w_a$ of an organic light-emitting material (a) in the layer (A) and a content $w_b$ of an organic light-emitting material (b) in the layer (B) preferably have a relation of $w_a \geq w_b$; the ratio between the content $w_a$ and the content $w_b$ is $w_a:w_b=1000:1$ to $1:1$, further preferably $500:1$ to $2:1$, and particularly preferably $200:1$ to $3:1$, where the content $w_a$ and the content $w_b$ are percentages by weight relative to the weight of the respective binder resins in the respective layers of the layer (A) and the layer (B).

When the layer (A) and the layer (B) further contain some organic light-emitting materials other than the organic light-emitting material (a) and the organic light-emitting material (b), the content of an additional organic light-emitting material is preferably an amount that does not have an excessive influence on the light emission of the organic light-emitting material (a) and the organic light-emitting material (b).

When the layer (A) contains the organic light-emitting material (a') other than the organic light-emitting material (a), for example, the content $w_a$ of the organic light-emitting material (a) in the layer (A) and a content $w_a'$ of the organic light-emitting material (a') in the layer (A) preferably have a relation of $w_a \geq w_a'$ because of not having an excessive influence on the light emission of the organic light-emitting material (a). The ratio between the content $w_a$ and the content $w_a'$ is $w_a:w_a'=1000:1$ to $1:1$, further preferably $500:1$ to $2:1$, and particularly preferably $200:1$ to $3:1$, where the content $w_a'$ is a percentage by weight relative to the weight of binder resin in the layer (A).

When the layer (A) contains the organic light-emitting material (c) other than the organic light-emitting material (a), the content $w_a$ of the organic light-emitting material (a) in the layer (A) and a content $w_c$ of the organic light-emitting material (c) in the layer (A) preferably have a relation of $w_a \geq w_c$ because of not having an excessive influence on the light emission of the organic light-emitting material (a). The ratio between the content $w_a$ and the content $w_c$ is $w_a:w_c=1000:1$ to $1:1$, further preferably $500:1$ to $2:1$, and particularly preferably $200:1$ to $3:1$, where the content $w_c$ is a percentage by weight relative to the weight of the binder resin in the layer (A).

The content $w_a$ of the organic light-emitting material (a) in the layer (A), the content $w_c$ of the organic light-emitting material (c) in the layer (A), and the content $w_b$ of the organic light-emitting material (b) in the layer (B) preferably have a relation of $w_a \geq w_b \geq w_c$ because of not having an excessive influence on the light emission of the organic light-emitting material (a) and the organic light-emitting material (b).

When the layer (B) contains the organic light-emitting material (b') other than the organic light-emitting material (b), the content $w_b$ of the organic light-emitting material (b) in the layer (B) and a content $w_b'$ of the organic light-emitting material (b') in the layer (B) preferably have a relation of $w_b \geq w_b'$ because of not having an excessive influence on the light emission of the organic light-emitting material (b). The ratio between the content $w_b$ and the content $w_b'$ is $w_b:w_b'=1000:1$ to $1:1$, further preferably $500:1$ to $2:1$, and particularly preferably $200:1$ to $3:1$, where the content $w_b'$ is a percentage by weight relative to the weight of the binder resin in the layer (B).

When the layer (B) contains the organic light-emitting material (d) other than the organic light-emitting material (b), the content $w_a$ of the organic light-emitting material (a) in the layer (A) and a content $w_d$ of the organic light-emitting material (d) in the layer (B) preferably have a relation of $w_a \geq w_d$ because of not having an excessive influence on the light emission of the organic light-emitting material (a). The ratio between the content $w_a$ and the content $w_d$ is $w_a:w_d=1000:1$ to $1:1$, further preferably $500:1$ to $2:1$, and particularly preferably $200:1$ to $3:1$, where the content $w_d$ is a percentage by weight relative to the weight of the binder resin in the layer (B).

(Binder Resin)

In the color conversion composition and the color conversion sheet according to the embodiment of the present invention, materials excellent in formability, transparency, heat resistance, and the like are suitably used for the binder resin. Examples of the binder resin include known ones such as photocurable resist materials having a reactive vinyl group such as acrylic acid-based, methacrylic acid-based, vinyl polycinnamate-based, or cyclized rubber-based one, epoxy resins, silicone resins (including organopolysiloxane cured objects (cross-linked objects) such as silicone rubbers and silicone gels), urea resins, fluorine resins, polycarbonate resins, acrylic resins, urethane resins, melamine resins, polyvinyl resins, polyamide resins, phenol resins, polyvinyl alcohol resins, polyvinyl butyral resins, cellulose resins, aliphatic ester resins, aromatic ester resins, aliphatic polyolefin resins, and aromatic polyolefin resins. For the binder resin, a mixture or copolymer of these resins may be used. These resins are designed as appropriate, whereby the binder resin useful for the color conversion sheet according to the embodiment of the present invention is obtained.

Among these resins, in view of transparency, heat resistance, and the like, suitably used are epoxy resins, silicone resins, acrylic resins, polyester resins, and mixtures thereof. Because of the easiness of the process of being made into film, thermosetting resins and photocurable resins are also suitably used.

A combination of the organic light-emitting material and the binder resin in each of the layer (A) and the layer (B) is optimized, whereby the emission peak wavelength of the organic light-emitting material can be shifted to a desired wavelength, and the color gamut can be expanded. For this purpose, the binder resin contained in the layer (A) and the binder resin contained in the layer (B) are preferably different from each other. By doing so, the organic light-emitting material (a) that converts the blue light into the green light and the organic light-emitting material (b) that converts the blue light and the green light into the red light are dispersed in different binder resins to enable the respective emission peak wavelengths of the organic light-emitting material (a) and the organic light-emitting material (b) to be individually adjusted to respective optimum peak wavelengths. That the two binders are different from each other refers to that the compositions of the resins are different from each other.

In the color conversion sheet according to the embodiment of the present invention, in obtaining favorable white light, the emission peak wavelength from the layer (A) is preferably observed in a region of 500 nm or more and 580 nm or less. In improving color reproducibility, the emission peak wavelength from the layer (A) is more preferably 510 nm or more and 550 nm or less, further preferably 515 nm or more and 540 nm or less, and particularly preferably 520 nm or more and 530 nm or less.

In the color conversion sheet according to the embodiment of the present invention, in obtaining favorable white light, the emission peak wavelength from the layer (B) is preferably observed in a region of 580 nm or more and 750 nm or less. In improving color reproducibility, the emission peak wavelength from the layer (B) is more preferably 620 nm or more and 700 nm or less, further preferably 630 nm or more and 680 nm or less, and particularly preferably 635 nm or more and 660 nm or less.

A SP value as a solubility parameter of the binder resin and the emission peak wavelength of the organic light-emitting material have strong relation. In a binder resin having a large SP value, interaction between the binder resin and the organic light-emitting material stabilizes the excited state of the organic light-emitting material. For this reason, the emission peak wavelength of this organic light-emitting material shifts to a longer wavelength side than in a binder resin having a smaller SP value. Consequently, the organic light-emitting material is dispersed in the binder resin having an optimum SP value, whereby the emission peak wavelength of the organic light-emitting material can be optimized.

Preferably $SP_A \leq SP_B$ where the SP value of the binder resin contained in the layer (A) is $SP_A$ $(cal/cm^3)^{0.5}$ and the SP value of the binder resin contained in the layer (B) is $SP_B$ $(cal/cm^3)^{0.5}$. In this case, the difference between the emission peak wavelengths of the green light and the red light in the layer (A) and the layer (B), respectively, is larger than a case in which the organic light-emitting materials are dispersed in the same binder resin; consequently, the color gamut expands.

In particular, preferably $SP_B \geq 10.0$. In this case, the emission peak wavelength of the red light in the layer (B) shifts to a longer wavelength by a larger amount, and consequently, the layer (B) can emit deep red color. In view of enhancing the effect, more preferably $SP_B \geq 10.2$, further preferably $SP_B \geq 10.4$, and particularly preferably $SP_B \geq 10.6$.

The upper limit value of $SP_B$ is not limited to a particular value; the binder resin having $SP_B \leq 15.0$ is favorable in the dispersibility of the organic light-emitting material and can be thus suitably used. In view of enhancing the effect, more preferably $SP_B \leq 14.0$, further preferably $SP_B \leq 13.0$, and particularly preferably $SP_B \leq 12.0$.

When $SP_A \leq 10.0$, shift to a longer wavelength of the emission peak wavelength of the green light in the layer (A) is reduced, and consequently, the difference between the emission peak wavelengths of the green light and the red light in the layer (A) and the layer (B), respectively, is larger, which is thus preferred. In view of enhancing the effect, more preferably $SP_A \leq 9.8$, further preferably $SP_A \leq 9.7$, and particularly preferably $SP_A \leq 9.6$.

The lower limit value of $SP_A$ is not limited to a particular value; the binder resin having $SP_A \geq 7.0$ is favorable in the dispersibility of the organic light-emitting material and can be thus suitably used. In view of enhancing the effect, more preferably $SP_A \geq 7.4$, further preferably $SP_A \geq 7.8$, and particularly preferably $SP_A \geq 8.0$.

The solubility parameter (SP value) is a value calculated from the type and proportion of monomers contained in a resin using Fedors' method of estimation described in Poly. Eng. Sci., vol. 14, No. 2, pp. 147-154 (1974) and the like, which is generally used. For a mixture of a plurality of resins, the value can be calculated by a similar method. The SP value of polymethyl methacrylate can be calculated to be 9.9 $(cal/cm^3)^{0.5}$, the SP value of polyethylene terephthalate (PET) can be calculated to be 11.6 $(cal/cm^3)^{0.5}$, and the SP value of bisphenol A epoxy resin can be calculated to be 10.9 $(cal/cm^3)^{0.5}$, for example.

The binder resins in the layer (A) and the layer (B) are not limited to particular resins; Table 2 lists the type of binder resins that can be suitably used for the layer (A) and binder resins that can be suitably used for the layer (B) and representative SP values of the respective resins. The binder resins in the layer (A) and the layer (B) are preferably any combination of the resins listed in Table 2, for example.

TABLE 2

| Layer (A) (SP value) | Layer (B) (SP value) |
|---|---|
| Acrylic resin (9.3-9.9) | Acrylic resin (9.3-9.9) |
| Epoxy resin (10.9) | Epoxy resin (10.9) |
| Polyester resin (10.7) | Polyester resin (10.7) |
| Urethane resin (10) | Urethane resin (10) |
| Vinyl acetate resin (9.4) | Vinyl acetate resin (9.4) |
| Vinyl chloride resin (9.7) | Polyvinyl alcohol resin (12.6) |
| Silicone resin (7.3-7.6) | Vinylidene chloride resin (12.2) |
| Fluorine resin (6.2) | Polyamide resin (13.6) |
| Polystyrene (9.0) | Acrylonitrile resin (14.8) |
| Styrene butadiene rubber (8.3-8.6) | |

(Other Additives)

The color conversion composition and the color conversion sheet according to the embodiment of the present invention can contain other additives such as antioxidants, processing-and-thermal stabilizers, lightfast stabilizers such as ultraviolet absorbers, dispersants and leveling agents for stabilizing coatings, plasticizers, cross-linking agents such as epoxy compounds, curing agents such as amines, acid anhydrides, and imidazole, adhesive assistants such as silane coupling agents as a modifier for sheet surface, inorganic particles such as silica particles and silicone fine particles as a color conversion material settling inhibitor, and silane coupling agents, in addition to the organic light-emitting material (a), the organic light-emitting material (b), and the binder resin.

Examples of the antioxidants include, but are not limited to, phenol-based antioxidants such as 2,6-di-tert-butyl-p-cresol and 2,6-di-tert-butyl-4-ethylphenol. These antioxidants may be contained singly or in combination.

Examples of the processing-and-thermal stabilizers include, but are not limited to, phosphorous-based stabilizers such as tributyl phosphite, tricyclohexyl phosphite, triethyl phosphine, and diphenylbutyl phosphine. These stabilizers may be contained singly or in combination.

Examples of the lightfast stabilizers include, but are not limited to, benzotriazoles such as 2-(5-methyl-2-hydroxy-phenyl)benzotriazole and 2-[2-hydroxy-3,5-bis(α,α-dimethylbenzyl)phenyl]-2H-benzotriazole. These lightfast stabilizers may be contained singly or in combination.

In view of not hindering the light from the light source and the light emission of the light-emitting material, these additives are preferably small in extinction coefficient in the visible range. Specifically, a molar extinction coefficient s of these additives is preferably 1,000 or less, more preferably 500 or less, further preferably 200 or less, and particularly preferably 100 or less in the entire wavelength range of 400 nm or more and 800 nm or less.

For the lightfast stabilizers, compounds having a role as a singlet oxygen quencher can also be suitably used. The singlet oxygen quencher is a material that traps singlet oxygen produced from oxygen molecules activated through optical energy and deactivates the singlet oxygen. The singlet oxygen quencher coexisting in the color conversion layer can prevent the light-emitting material from degrading by the singlet oxygen.

It is known that the singlet oxygen is produced by the occurrence of electron and energy exchange between a triplet excited state of dye such as rose bengal or methylene blue and an oxygen molecule in the ground state.

In the color conversion sheet according to the present invention, the contained organic light-emitting material is excited by the excitation light and emits light with a wavelength different from that of the excitation light to perform light color conversion. This excitation-emission cycle is repeated, and interaction between produced excited species and oxygen contained in the color conversion sheet increases the probability of the singlet oxygen being produced. Consequently, the probability of collision of the organic light-emitting material and the singlet oxygen also increases, and the degradation of the organic light-emitting material is likely to proceed.

Organic light-emitting materials are susceptible to the influence of the singlet oxygen compared with inorganic light-emitting materials. The compound represented by General Formula (1) in particular is higher in reactivity with the singlet oxygen than compounds having a condensed aryl ring such as perylene or derivatives thereof and thus receives a large influence on durability by the singlet oxygen. Given these circumstances, the produced singlet oxygen is quickly deactivated by the singlet oxygen quencher, whereby the durability of the compound represented by General Formula (1) excellent in emission quantum yield and color purity can be improved.

Examples of the compounds having a role as a singlet oxygen quencher include, but are not limited to, specific tertiary amines, catechol derivatives, and nickel compounds. These compounds (lightfast stabilizers) may be contained singly or in combination.

The tertiary amines refer to compounds having a structure in which all the N—H bonds of ammonia are replaced with N—C bonds. The substituent on the nitrogen atom is selected from an alkyl group, a cycloalkyl group, a heterocyclic group, an alkenyl group, a cycloalkenyl group, an alkynyl group, an aryl group, a heteroaryl group, an aldehyde group, a carbonyl group, a carboxy group, an oxycarbonyl group, a carbamoyl group, and a condensed ring and an aliphatic ring formed between adjacent substituents. These substituents may be further substituted by the substituents described above.

The substituent on the nitrogen atom of the tertiary amines is preferably a substituted or unsubstituted alkyl group, a substituted or unsubstituted cycloalkyl group, a substituted or unsubstituted aryl group, or a substituted or unsubstituted heteroaryl group in view of photostability. Among them, more preferred are a substituted or unsubstituted alkyl group, a substituted or unsubstituted cycloalkyl group, or a substituted or unsubstituted aryl group.

The aryl group in this case is preferably a phenyl group or a naphthyl group and more preferably a phenyl group, because it does not hinder the light from the light source and the light emission of the light-emitting material. An increased number of aryl groups on the nitrogen atom causes concern about an increase in light absorption in the visible range, and among the three substituents on the nitrogen atom, the number of the aryl groups is preferably two or less and more preferably one or less. When at least one of the three substituents on the nitrogen atom is a substituted or unsubstituted alkyl group, the singlet oxygen can be trapped more efficiently, which is thus preferred. In particular, two or more of the three substituents are preferably substituted or unsubstituted alkyl groups.

Preferred examples of the tertiary amines include, but are not limited to, triethylamine, 1,4-diazabicyclo[2.2.2]octane, tri-n-butylamine, N,N-diethylaniline, and 2,2,6,6-tetramethylpiperidine.

The catechol derivatives refer to compounds having two or more hydroxy groups on a benzene ring including isomers such as resorcinol and hydroquinone. These compounds can trap the singlet oxygen more efficiently than phenol derivatives, in which one hydroxy group is on the benzene ring.

The substituent on the benzene ring of catechol derivatives is selected from hydrogen, an alkyl group, a cycloalkyl group, a heterocyclic group, an alkenyl group, a cycloalkenyl group, an alkynyl group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents other than a hydroxy group. These substituents may be further substituted by the substituents described above.

Among them, preferred are a substituted or unsubstituted alkyl group, a substituted or unsubstituted cycloalkyl group, a substituted or unsubstituted aryl group, a substituted or unsubstituted heteroaryl group, or halogen in view of photostability, and more preferred are a substituted or unsubstituted alkyl group, a substituted or unsubstituted cycloalkyl group, a substituted or unsubstituted aryl group, or halogen. In addition, because of being less in discoloration after reaction with the singlet oxygen quencher, more preferred are a substituted or unsubstituted alkyl group, a substituted or unsubstituted cycloalkyl group, or halogen. Particularly preferred is a substituted or unsubstituted alkyl group.

As to the position of the hydroxy groups on the benzene ring of catechol derivatives, at least two hydroxy groups are preferably adjacent to each other. This is because the compound is more resistant to photooxidation than resorcinol (1,3-substituted) and hydroquinone (1,4-substituted). Also after being oxidized, light absorption in the visible range is small, and the discoloration of the color conversion sheet can be prevented.

Preferred examples of the catechol derivatives include, but are not limited to, 4-tert-butylbenzene-1,2-diol and 3,5-di-tert-butylbenzene-1,2-diol.

The nickel compounds are compounds containing nickel; examples of the nickel compounds include, but are not limited to, inorganic salts such as nickel chloride, complexes such as bis(acetylacetonate)nickel, and salts of organic acids such as nickel carbamate. The organic acids refer to organic compounds having a carboxy group, a sulfonyl group, a phenolic hydroxy group, or a thiol group. Among them, in view of being uniformly dispersed in the color composition sheet, the nickel compounds are preferably complexes and salts of organic acids.

Examples of nickel complexes and nickel salts of organic acids suitably used as the singlet oxygen quencher include, but are not limited to, acetylacetonate-based nickel complexes, bisdithio-α-diketone-based nickel complexes, dithiolate-based nickel complexes, aminothiolate-based nickel complexes, thiocatechol-based nickel complexes, salicylaldehydeoxime-based nickel complexes, thiobisphenolate-based nickel complexes, indoaniline-based nickel compounds, carboxylic acid-based nickel salts, sulfonic acid-based nickel salts, phenol-based nickel salts, carbamic acid-based nickel salts, and dithiocarbamic acid-based nickel salts.

Among them, the nickel compounds are preferably at least one of nickel salts of organic acids, acetylacetonate-based nickel complexes, and thiobisphenolate-based nickel complexes. In particular, in view of the easiness of synthesis and being low in price, nickel salts of organic acids are preferred. In addition, in view of being small in molar extinction coefficient in the visible range and not absorbing the light emission of the light source and the light-emitting material, sulfonic acid-based nickel salts are preferred. In addition, in view of exhibiting a better singlet oxygen quenching effect, nickel salts of aryl sulfonic acids are more preferred; in view of solubility to a wide range of solvents, nickel salts of alkyl sulfonic acids are preferred. The aryl group of the aryl sulfonic acids is preferably a substituted or unsubstituted phenyl group and more preferably a phenyl group substituted by an alkyl group in view of solubility and dispersibility to solvents.

The nickel compounds are preferably both acetylacetonate-based nickel complexes and thiobisphenolate-based nickel complexes in view of solubility to organic solvents and being small in molar extinction coefficient in the visible range. The ligand on nickel in these complexes may be substituted by substituents such as an alkyl group, a cycloalkyl group, a heterocyclic group, an alkenyl group, a cycloalkenyl group, an alkynyl group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, and a phosphine oxide group. These substituents may be further substituted by the substituents described above.

Among them, preferred are a substituted or unsubstituted alkyl group, a substituted or unsubstituted cycloalkyl group, a substituted or unsubstituted aryl group, a substituted or unsubstituted heteroaryl group, or halogen in view of photostability, and more preferred are a substituted or unsubstituted alkyl group, a substituted or unsubstituted cycloalkyl group, a substituted or unsubstituted aryl group, or halogen. In addition, more preferred are a substituted or unsubstituted alkyl group, a substituted or unsubstituted cycloalkyl group, or halogen because of being less in discoloration after reaction with the singlet oxygen quencher. Particularly preferred is a substituted or unsubstituted alkyl group.

Examples of a nickel compound with a molar extinction coefficient s of 100 or less in the entire wavelength region of 400 nm or more and 800 nm or less include nickel salts of p-toluyl sulfonic acid, acetylacetone nickel (II) complex, hexafluoroacetylacetone nickel (II) complex, 2,2'-thiobis-phenolate-n-butylamine nickel (II) complex, and [2,2'-thio-bis(4-tert-octylphenolate)]-2-ethylhexylamine nickel (II) complex. However, the nickel compounds are not limited to these nickel salts and nickel complexes; compounds with a molar extinction coefficient c of 100 or less in the entire wavelength region of 400 nm or more and 800 nm or less among the various kinds of nickel compounds described above are suitably used.

For the lightfast stabilizers, compounds having a role as a radical quencher can also be suitably used. Preferred examples thereof include hindered amine-based compounds. Examples of the hindered amine-based compounds include piperidine derivatives such as 2,2,6,6-tetramethylpiperidine, 4-hydroxy-2,2,6,6-tetramethylpiperidine, 4-hydroxy-1,2,2,6,6-pentamethylpiperidine, 4-methoxy-2,2,6,6-tetramethylpiperidine, 4-methoxy-1,2,2,6,6-pentamethylpiperidine, bis(2,2,6,6-tetramethyl-4-piperidyl) sebacate, bis(1,2,2,6,6-pentamethyl-4-piperidyl) sebacate, 2,2,6,6-tetramethyl-4-piperidyl methacrylate, and 1,2,2,6,6-pentamethyl-4-piperidyl methacrylate and oxides thereof.

In the color conversion composition and the color conversion sheet according to the embodiment of the present invention, the content of these additives, which depends on the molar extinction coefficient, the emission quantum yield, and the absorption intensity at an excitation wavelength of the compound and the thickness and the transmittance of a color conversion sheet to be prepared, is usually preferably $1.0 \times 10^{-3}$ part by weight or more, more preferably $1.0 \times 10^{-2}$ part by weight or more, and further preferably $1.0 \times 10^{-1}$ part by weight or more relative to 100 parts by weight of the binder resin. The content of the additives is preferably 30 parts by weight or less, more preferably 15 parts by weight or less, and further preferably 10 parts by weight or less relative to 100 parts by weight of the binder resin.

<Base Layer>

In the color conversion sheet according to the embodiment of the present invention, the layer (A) and the layer (B) as the color conversion layer described above are preferably formed on a base layer (the base layer 10 illustrated in FIGS. 1 and 2, for example).

For the base layer, known metals, films, glasses, ceramics, papers, and the like can be used without any particular limitation. Specifically, examples of the base layer include metal plates and foils of aluminum (including aluminum alloys), zinc, copper, iron, and the like; films of plastics such as cellulose acetate, polyethylene terephthalate (PET), polyethylene, polyester, polyamide, polyimide, polyphenylene sulfide, polystyrene, polypropylene, polycarbonate, polyvinyl acetal, aramids, silicones, polyolefins, thermoplastic fluororesins, and a copolymer of tetrafluoroethylene and ethylene (ETFE); films of plastics of α-polyolefin resins, polycaprolactone resins, acrylic resins, silicone resins, and copolymerized resins of theses resins and ethylene; papers laminated with the plastics and papers coated with the plastics; papers laminated or deposited with the metals; and plastic films laminated or deposited with the metals. When the base layer is a metal plate, the surface thereof may be subjected to chromium-based or nickel-based plating treatment or ceramic treatment.

Among these materials, in view of the easiness of preparing the color conversion sheet and the easiness of shaping the color conversion sheet, glasses and resin films are preferably used. To exclude the possibility of breakage or the like when a film-shaped base layer is handled, films having high strength are preferred. In view of those required characteristics and economy, resin films are preferred; among them, in view of economy and handleability, preferred are plastic films selected from the group consisting of PET, polyphenylene sulfide, polycarbonate, and polypropylene. When the color conversion sheet is dried or when the color conversion sheet is shaped under pressure at a high temperature of 200° C. or more by an extruder, a polyimide film is preferred in view of heat resistance. In view of the easiness of peeling off the sheet, the surface of the base layer may be subjected to mold releasing treatment in advance. Similarly, to improve inter-layer adhesiveness, the surface of the base layer may be subjected to highly adhesive treatment in advance.

The thickness of the base layer is not limited to a particular thickness; the lower limit thereof is preferably 25 µm or more and more preferably 38 µm or more. The upper limit thereof is preferably 5,000 µm or less and more preferably 3,000 µm or less.

<Light Extraction Layer>

The color conversion sheet according to the embodiment of the present invention may further include a light extraction layer, in addition to the layer (A) and the layer (B) in order to improve light extraction efficiency. The light extraction layer is a layer that reduces reflection on the boundary between two adjacent layers.

Figure 3:
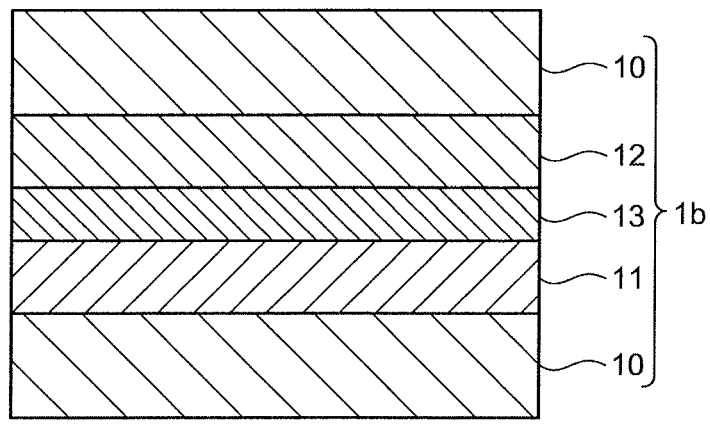
FIG. 3 is a schematic sectional view of an example in which a light extraction layer is included in the color conversion sheet according to the embodiment of the present invention.

FIG. 3 is a schematic sectional view of an example in which the light extraction layer is included in the color conversion sheet according to the embodiment of the present invention. As illustrated in FIG. 3, this color conversion sheet 1b includes a plurality of (two in the example in FIG. 3) base layers 10 and includes the layer (A) 11, the layer (B) 12, and a light extraction layer 13 in such a manner that they are interposed between these base layers 10. As illustrated in FIG. 3, the color conversion sheet 1b preferably includes the light extraction layer 13 between the layer (A) 11 and the layer (B) 12. In the structure example of this color conversion sheet 1b, the layer (A) 11, the light extraction layer 13, and the layer (B) 12 are laminated on one base layer 10 in this order, thereby forming a laminate with a lamination structure of the layer (B)/the light extraction layer/the layer (A) on this base layer 10. In addition, as illustrated in FIG. 3, another base layer 10 is laminated on the layer (B) 12 in this laminate.

Although the laminate of the layer (A) 11, the light extraction layer 13, and the layer (B) 12 is interposed between the base layers 10 in the structure example of the color conversion sheet 1b illustrated in FIG. 3, the color conversion sheet according to the embodiment of the present invention is not limited to this structure example. This laminate may be formed on the base layer 10 without being interposed between the base layers 10. The light extraction layer 13 may be formed between one end face on the upper side in the lamination direction of the layer (A) 11 and one end face on the lower side in the lamination direction of the layer (B) 12 as exemplified in FIG. 3 or formed on one end face on the upper side in the lamination direction of the layer (B) 12 or one end face on the lower side in the lamination direction of the layer (A) 11. In particular, as exemplified in FIG. 3, when the light extraction layer 13 is formed between the layer (A) 11 and the layer (B) 12, the light emission of the organic light-emitting material in the layer (A) 11 efficiently enters the layer (B) 12, whereby emission loss between these layers reduces to increase color conversion efficiency, and the luminance of white light after color conversion improves, which is thus preferred.

When the light extraction layer 13 is formed between the layer (A) 11 and the layer (B) 12, the respective refractive indices of the layer (A) 11, the layer (B) 12, and the light extraction layer 13 are not limited to particular refractive indices; when the respective refractive indices of the layer (A) 11, the layer (B) 12, and the light extraction layer 13 relative to light with a wavelength of 589.3 nm are $n_A$, $n_B$, and $n_C$, respectively, preferably $n_A \leq n_C \leq n_B$ or $n_B \leq n_C \leq n_A$. In these cases, the reflection of light on the boundary between the layer (A) 11 and the light extraction layer 13 and the boundary between the layer (B) 12 and the light extraction layer 13 can be reduced.

<Barrier Layer>

The color conversion sheet according to the embodiment of the present invention may further include a barrier layer, in addition to the layer (A) and the layer (B). The barrier layer is used as appropriate in order to prevent degradation by oxygen, water, and heat for the color conversion layer exemplified by the layer (A) and the layer (B). Examples of this barrier layer include metal oxide thin films and metal nitride thin films of inorganic oxides such as silicon oxide, aluminum oxide, titanium oxide, tantalum oxide, zinc oxide, tin oxide, indium oxide, yttrium oxide, and magnesium oxide, inorganic nitrides such as silicon nitride, aluminum nitride, titanium nitride, and silicon carbide nitride, mixtures thereof, and with other elements added thereto; and films formed of various kinds of resins such as polyvinyl chloride-based resins, acrylic-based resins, silicone-based resins, melamine-based resins, urethane-based resins, fluorine-based resins, and polyvinyl alcohol-based resins such as a saponified product of vinyl acetate.

Example of a barrier resin suitably used for the barrier layer in the present invention include resins such as polyester, poly vinyl chloride, nylon, polyvinyl fluoride, polyvinylidene chloride, polyacrylonitrile, polyvinyl alcohol, and an ethylene-vinyl alcohol copolymer and mixtures of these resins. Among them, polyvinylidene chloride, polyacrylonitrile, an ethylene-vinyl alcohol copolymer, and polyvinyl alcohol are extremely small in oxygen permeability coefficient, and the barrier resin preferably contains these resins. In addition, the barrier resin more preferably contains polyvinylidene chloride, polyvinyl alcohol, or an ethylene-vinyl alcohol copolymer because of resistance to discoloration and particularly preferably contains polyvinyl alcohol or an ethylene-vinyl alcohol copolymer because of being small in environmental loads. These resins may be contained singly or mixed with different resins; in view of the uniformity of the film and cost, a film formed of a single resin is more preferred.

For polyvinyl alcohol, a saponified product of polyvinyl acetate in which the acetyl group is saponified in 98 mol % or more can be used, for example. For the ethylene-vinyl alcohol copolymer, a saponified product of an ethylene-vinyl alcohol copolymer with an ethylene content of 20% to 50% in which the acetyl group is saponified in 98 mol % or more can be used, for example.

Commercially available resins and films can also be used for the barrier layer. Specific examples thereof include polyvinyl alcohol resin PVA117 manufactured by Kuraray Co., Ltd. and ethylene-vinyl alcohol copolymer ("EVAL" (registered trademark)) resins L171B and F171B and film EF-XL manufactured by Kuraray Co., Ltd.

To the barrier layer, antioxidants, curing agents, cross-linking agents, processing-and-thermal stabilizers, lightfast stabilizers such as ultraviolet absorbers, and the like may be added as needed to the extent that they do not have an excessive influence on the light emission and durability of the color conversion layer.

The thickness of the barrier layer, which is not limited to a particular thickness, is preferably 100 µm or less in view of the flexibility of the entire color conversion sheet and cost. The thickness of the barrier layer is more preferably 50 µm or less and further preferably 20 µm or less. The thickness of the barrier layer is particularly preferably 10 µm or less and may be 1 µm or less. In view of the easiness of layer formation, the thickness of the barrier layer is preferably 0.01 µm or more.

Figure 4:
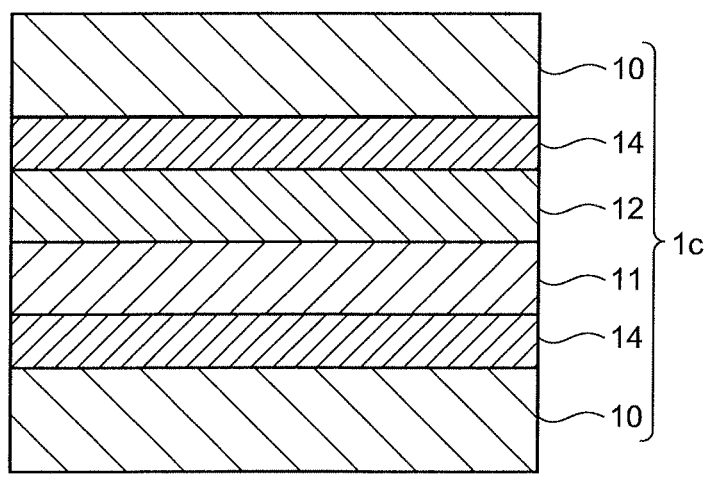
FIG. 4 is a schematic sectional view of an example in which barrier layers are included in the color conversion sheet according to the embodiment of the present invention.

A representative structure example of the color conversion sheet in which the barrier layer is included is one shown below, for example. FIG. 4 is a schematic sectional view of an example in which barrier layers are included in the color conversion sheet according to the embodiment of the present invention. As illustrated in FIG. 4, this color conversion sheet 1c includes a plurality of (two in the example in FIG. 4) base layers 10 and includes the layer (A) 11, the layer (B) 12, and a plurality of (two in the example in FIG. 4) barrier layers 14 in such a manner that they are interposed between these base layers 10. These barrier layers 14 are formed so as to interpose a laminate of the layer (A) 11 and the layer (B) 12 therebetween from both sides in the lamination direction. In the structure example of this color conversion sheet 1c, one barrier layer 14, the layer (A) 11, the layer (B) 12, and another barrier layer 14 are laminated on one base layer 10 in this order. With this lamination, a laminate with a lamination structure of the barrier layer/the layer (B)/the layer (A)/the barrier layer is formed on this base layer 10. In addition, as illustrated in FIG. 4, another base layer 10 is laminated on the barrier layer 14 on the upper side in the lamination direction of this laminate.

Figure 5:
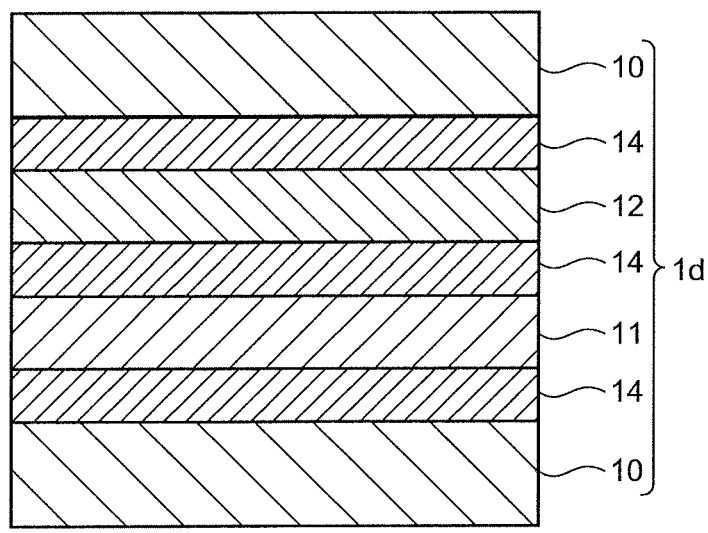
FIG. 5 is a schematic sectional view of another example in which the barrier layers are included in the color conversion sheet according to the embodiment of the present invention.

FIG. 5 is a schematic sectional view of another example in which the barrier layers are included in the color conversion sheet according to the embodiment of the present invention. As illustrated in FIG. 5, this color conversion sheet 1d includes a plurality of (two in the example in FIG. 5) base layers 10 and includes the layer (A) 11, the layer (B) 12, and a plurality of (three in the example in FIG. 5) barrier layers 14 in such a manner that they are interposed between these base layers 10. These barrier layers 14 are formed so as to interpose the layer (A) 11 therebetween from both sides in the lamination direction and to interpose the layer (B) 12 therebetween from both sides in the lamination direction. In the structure example of this color conversion sheet 1d, one barrier layer 14, the layer (A) 11, another barrier layer 14, the layer (B) 12, and still another barrier layer 14 are laminated on one base layer 10 in this order. With this lamination, a laminate with a lamination structure of the barrier layer/the layer (B)/the barrier layer/the layer (A)/the barrier layer is formed on this base layer 10. In addition, as illustrated in FIG. 5, another base layer 10 is laminated on the barrier layer 14 on the upper side in the lamination direction of this laminate.

In the present invention, the barrier layer may be provided on either end face on both sides in the lamination direction of the laminate of the layer (A) and the layer (B) as in the barrier layers 14 exemplified in FIG. 4 or provided on one end face of both sides in the lamination direction of this laminate. The barrier layer may be provided both on either end face on both sides in the lamination direction of the layer (A) and either end face on both sides in the lamination direction of the layer (B) as in the barrier layers 14 exemplified in FIG. 5 or provided on at least one end face of these end faces.

<Other Functional Layers>

The color conversion sheet according to the embodiment of the present invention may be further provided with a light diffusion layer or an auxiliary layer having an anti-reflection function, an anti-glare function, an anti-reflection-and-anti-glare function, a hard coating function (an abrasion-resistant function), an antistatic function, a soil-resistant function, an electromagnetic shielding function, an infrared cutting function, an ultraviolet cutting function, a polarizing function, or a toning function in accordance with required functions.

<Adhesive Layer>

In the color conversion sheet according to the embodiment of the present invention, an adhesive layer may be provided between the layers as needed. For the adhesive layer, known materials can be used without particular limitation so long as they do not have an excessive influence on the light emission and durability of the color conversion sheet. When strong adhesion is required, for example, photocurable materials, thermocurable materials, anaerobic curable materials, and thermoplastic materials are preferably used as the adhesive layer. Among them, thermocurable materials are more preferred, and in particular, a thermocurable material that is curable at 0° C. to 150° C. is preferred.

The thickness of the adhesive layer, which is not limited a particular thickness, is preferably 0.01 μm to 100 μm, more preferably 0.01 μm to 25 μm, further preferably 0.05 μm to 5 μm, and particularly preferably 0.05 μm to 1 μm.

<Method for Manufacturing Color Conversion Sheet>

The following describes an example of a method for preparing the color conversion sheet according to the embodiment of the present invention. In this method for preparing the color conversion sheet, first, a composition for preparing the color conversion layer is prepared as follows.

Certain amounts of materials such as the organic light-emitting materials, the binder resin, and a solvent described below are mixed with each other. These materials are mixed with each other so as to give a certain composition and are then uniformly mixed and dispersed by a stirring and kneading machine such as a homogenizer, a rotary-and-revolutionary stirring machine, a triple roll mill, a ball mill, a planetary ball mill, or a beads mill to prepare the composition for preparing the color conversion layer, that is, the color conversion composition. After being mixed and dispersed or during being mixed and dispersed, defoaming in a vacuum or under a reduced pressure is also preferably performed. In addition, a specific component may be mixed in advance, or treatment such as aging may be performed. A desired solid content can be obtained by removing the solvent by an evaporator.

The solvent is not limited to a particular solvent so long as it can adjust the viscosity of a resin in a fluid state and does not have an excessive influence on the light emission and durability of a light-emitting substance. Examples of the solvent include water, 2-propanol, ethanol, toluene, methyl ethyl ketone, methyl isobutyl ketone, cyclohexanone, hexane, acetone, terpineol, texanol, methyl cellosolve, ethyl cellosolve, butyl carbitol, butyl carbitol acetate, 1-methoxy-2-propanol, and propylene glycol monomethyl ether acetate. Two or more of these solvents can be contained in combination. Toluene among these solvents in particular is suitably contained in view of not having any influence on the degradation of the compound represented by General Formula (1) and giving a less amount of a residual solvent after being dried.

Next, the color conversion composition prepared by the method described above is applied to a substrate such as the base layer or the barrier layer and is dried. The color conversion layer (the layer (A) and the layer (B) used for the color conversion sheet, for example) is thus prepared. The application can be performed by a reverse roll coater, a blade coater, a slit die coater, a direct gravure coater, an offset gravure coater, a kiss coater, a natural roll coater, an air knife coater, a roll blade coater, a reverse roll blade coater, a two-stream coater, a rod coater, a wire bar coater, an applicator, a dip coater, a curtain coater, a spin coater, a knife coater, or the like. To obtain the uniformity of the film thickness of the color conversion layer, the application is preferably performed by a slit die coater.

The drying of the color conversion layer can be performed using a general heating apparatus such as a hot air drier or an infrared drier. For the heating of the color conversion sheet, a general heating apparatus such as a hot air drier or an infrared drier is used. In this case, heating conditions include usually 1 minute to 5 hours at 40° C. to 250° C. and preferably 2 minutes to 4 hours at 60° C. to 200° C. Stepwise heating and curing such as step cure is also available.

After the color conversion layer is prepared, the base layer can be changed as needed. In this case, examples of a simple method include, but are not limited to, a method that performs the change using a hot plate and a method that uses a vacuum laminator or a dry film laminator.

For a method for laminating the layers, known methods such as application and dry laminate can be used. The method for laminating the layers is not limited to a particular method in the present invention; examples thereof, when Laminate (A) and Laminate (B) are laminated on each other, include a method that forms the layer (B) on the layer (A) by application and drying, a method that forms the layer (A) on the layer (B) by application and drying, a method that laminates a separately formed self-supporting film for the layer (B) on the layer (A), a method that laminates a separately formed self-supporting film for the layer (A) on the layer (B), and a method that laminates lamination units independently prepared on each other such as laminating a lamination unit with a lamination structure of "the base layer/the layer (A)" and a lamination unit with a lamination structure of "the layer (B)/base layer" on each other. To increase the stability of the color conversion sheet, a thermal curing process, a photocuring process, an aging process, or the like is also preferably further performed after the layers are laminated on each other.

<Excitation Light>

As to the type of the excitation light, any excitation light can be used so long as it exhibits light emission in a wavelength region that can be absorbed by the organic light-emitting materials used in the present invention. Excitation light from any light source can be used such as hot-cathode tubes, cold-cathode tubes, fluorescent light sources such as inorganic electroluminescence (EL) elements, organic EL element light sources, LED light sources, incandescent light sources, sunlight, or the like. In particular, excitation light from an LED light source is preferred. For display and lighting uses, further preferred is excitation light from a blue LED light source having excitation light in a wavelength range of 400 nm or more and 500 nm or less in view of the capability of increasing the color purity of blue light.

The maximum emission wavelength of the excitation light is more preferably 430 nm or more and 500 nm or less and further preferably 440 nm or more and 500 nm or less, because the excitation energy is smaller to enable the degradation of the organic light-emitting material to be inhibited. The maximum emission wavelength of the excitation light is particularly preferably 450 nm or more and 500 nm or less. The maximum emission wavelength of the excitation light is more preferably 480 nm or less and further preferably 470 nm or less, because the overlap of the emission spectra between the excitation light and the green light is made small to enable color reproducibility to be improved.

The excitation light may have one emission peak or have two or more emission peaks; to increase color purity, preferred is one having one emission peak. A plurality of excitation light sources having different emission peaks can be freely combined with each other.

<Light Source Unit>

The light source unit according to the embodiment of the present invention includes the light source and the color conversion composition or the color conversion sheet described above. When the light source unit includes the color conversion composition, the method for arranging the light source and the color conversion composition is not limited to a particular method; the color conversion composition may be directly applied to the light source, or the color conversion composition may be applied to film or glass separate from the light source. When the light source unit includes the color conversion sheet, the method for arranging the light source and the color conversion sheet is not limited to a particular method; the light source and the color conversion sheet may adhere closely to each other, or the remote phosphor method, in which the light source and the color conversion sheet are separate from each other, may be used. The light source unit may further include a color filter for the purpose of increasing color purity.

As described above, in the color conversion sheet, the layer (B) converts the color of light emitted by either or both of the light source of the excitation light and the layer (A). For this reason, in the light source unit including the light source and the color conversion sheet, the arrangement of the light source and the layer (A) and the layer (B) included in the color conversion sheet is preferably an arrangement in which the light source, the layer (A), and the layer (B) are arranged in this order. In this case, the color conversion efficiency of the light from the light source by the color conversion sheet is high.

As described above, the excitation light in a wavelength range of 400 nm or more and 500 nm or less has relatively small excitation energy and can thus prevent the decomposition of the light-emitting substance such as the compound represented by General Formula (1). Consequently, the light source included in the light source unit is preferably a light-emitting diode having its maximum emission in a wavelength range of 400 nm or more and 500 nm or less. In addition, this light source preferably has maximum emission in a wavelength range of 430 nm or more and 480 nm or less and further preferably has maximum emission in a wavelength range of 450 nm or more and 470 nm or less. The light source unit of the present invention can be used for displays, lighting, the interior design, signs, signboards, and the like and is suitably used for displays and lighting in particular.

<Display and Lighting Apparatus>

The display according to the embodiment of the present invention includes the light source unit including the light source and the color conversion sheet as described above. For a display such as a liquid crystal display, for example, the light source unit described above is used as a backlight unit. The lighting apparatus according to the embodiment of the present invention includes the light source unit including the light source and the color conversion sheet as described above. This lighting apparatus is configured to emit white light by combining a blue LED light source as the light source unit and the color conversion sheet or the color conversion composition that converts blue light from this blue LED light source into light with a wavelength longer than that of the blue light with each other, for example.

EXAMPLES

The following describes the present invention with reference to examples; these examples do not limit the present invention. In the following examples and comparative examples, Compounds G-1, G-2, G-3, G-4, R-1, and R-2 are compounds shown below.

G-1
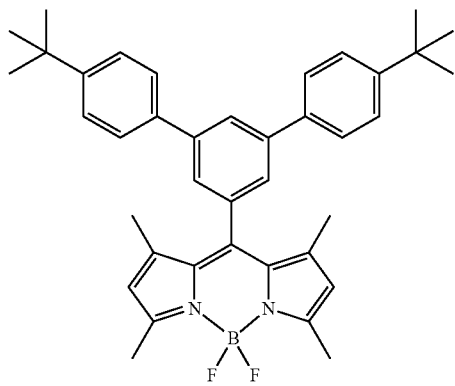

G-2
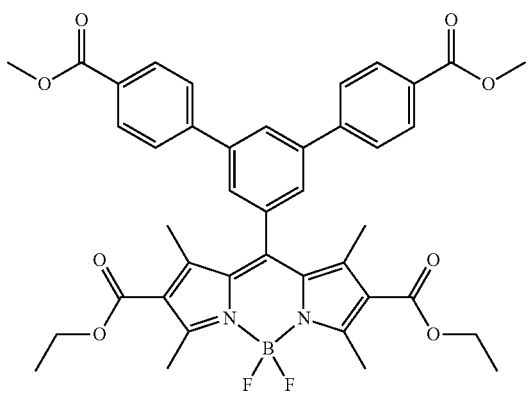

G-3
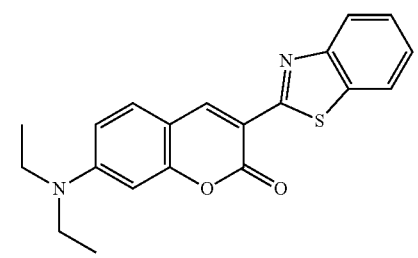

G-4
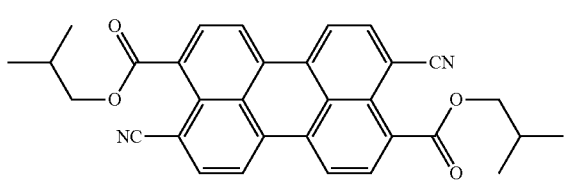

R-1
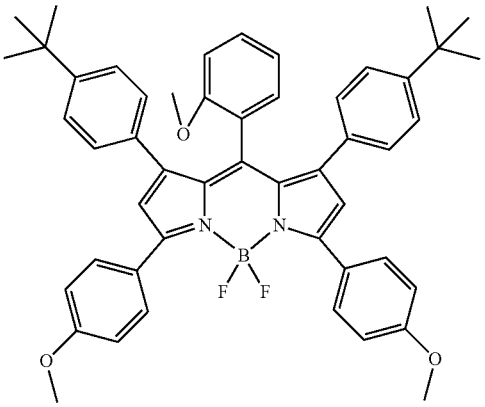

R-2
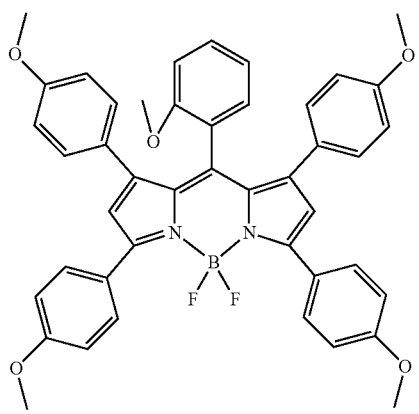

The following describes methods of evaluation about structural analysis in the examples and the comparative examples.

<Measurement of $^1$H-NMR>

$^1$H-NMR on the compounds was measured with a deuteriochloroform solution using Superconducting FTNMR EX-270 (manufactured by JEOL Ltd.).

<Measurement of Absorption Spectrum>

Absorption spectra of the compounds were measured with the compounds dissolved in toluene at a concentration of $1\times10^{-6}$ mol/L using U-3200 type spectrophotometer (manufactured by Hitachi, Ltd.).

<Measurement of Fluorescence Spectrum>

For fluorescence spectra of the compounds, fluorescence spectra when the compounds were dissolved in toluene at a concentration of $1\times10^{-6}$ mol/L and were excited at a wavelength of 460 nm were measured using F-2500 type fluorescence spectrophotometer (manufactured by Hitachi, Ltd.).

<Measurement of Refractive Index of Resin>

The refractive index of resins such as the binder resin was measured as a refractive index relative to light with a wavelength of 589.3 nm of a resin film formed by applying it to a PET film using a reflectance spectrometer FE-3000 (manufactured by Otsuka Electronics Co., Ltd.). The resin film had an average film thickness of 30 μm and was formed by applying a resin solution to "Lumirror" U48 (manufactured by Toray Industries, Inc., thickness: 50 μm) using a Baker applicator and was heated and dried at 100° C. for 20 minutes.

<Measurement of Color Conversion Characteristics>

In the measurement of color conversion characteristics, with each of the color conversion sheets and a prism sheet mounted on a planar light-emitting device installing a blue LED element with an emission peak wavelength of 457 nm, a current of 30 mA was passed through this planar light-emitting device to light up this blue LED element, and an emission spectrum, chromaticity, and luminance were measured using a spectral radiance meter (CS-1000 manufactured by Konica Minolta, Inc.).

<Calculation of Color Gamut>

From the emission spectrum obtained by the measurement of the color conversion characteristics and the spectral data of the transmittance of a color filter, a color gamut in the (u',v') color space when color purity was improved by the color filter was calculated. The area of the calculated color gamut in the (u',v') color space was evaluated based on the following criteria by a ratio with the color gamut area of the BT. 2020 standard as 100%. As an evaluation result of the area of the color gamut in this (u',v') color space, "A" indicates that the ratio is 91% or more. "B" indicates that the ratio is 86% or more and 90% or less. "C" indicates that the ratio is 81% or more and 85% or less. "D" indicates that the ratio is 80% or less. In this evaluation result, a higher ratio indicates a wider color gamut and that the color reproducibility of the color conversion sheet is more favorable.

Synthesis Example 1

The following describes a method for synthesizing Compound G-1 of a synthesis example 1 of the present invention. In the method for synthesizing Compound G-1, 3,5-dibromobenzaldehyde (3.0 g), 4-t-butylphenylboronic acid (5.3 g), tetrakis(triphenylphosphine)palladium (0) (0.4 g), and potassium carbonate (2.0 g) were put into a flask, which was purged with nitrogen. Degassed toluene (30 mL) and degassed water (10 mL) were added thereto, and the resultant mixture was refluxed for 4 hours. This reaction solution was cooled to room temperature, and an organic phase was separated and was then washed with a saturated saline solution. This organic phase was dried with magnesium sulfate and was filtered, and the solvent was then distilled off therefrom. The obtained reaction product was purified by silica gel chromatography to obtain 3,5-bis(4-t-butylphenyl)benzaldehyde (3.5 g) as a white solid.

Next, 3,5-bis(4-t-butylphenyl)benzaldehyde (1.5 g) and 2,4-dimethylpyrrole (0.7 g) were put into a reaction solution, and dehydrated dichloromethane (200 mL) and trifluoroacetic acid (one drop) were added thereto, and the resultant mixture was stirred for 4 hours in a nitrogen atmosphere. Subsequently, a dehydrated dichloromethane solution of 2,3-dichloro-5,6-dicyano-1,4-benzoquinone (0.85 g) was added thereto, and the resultant mixture was stirred for additional 1 hour. After completion of reaction, a boron trifluoride diethyl ether complex (7.0 mL) and diisopropylethylamine (7.0 mL) were added thereto, and the resultant mixture was stirred for 4 hours. Water (100 mL) was then further added thereto, the resultant mixture was stirred, and an organic phase was separated. This organic phase was dried with magnesium sulfate and was filtered, and the solvent was then distilled off therefrom. The obtained reaction product was purified by silica gel chromatography to obtain a compound (0.4 g) (yield: 18%). A 1H-NMR analysis result of this obtained compound is as follows, by which it was confirmed that this compound was Compound G-1.

$^1$H-NMR (CDCl$_3$, ppm): 7.95 (s, 1H), 7.63-7.48 (m, 10H), 6.00 (s, 2H), 2.58 (s, 6H), 1.50 (s, 6H), 1.37 (s, 18H).

Figure 6:
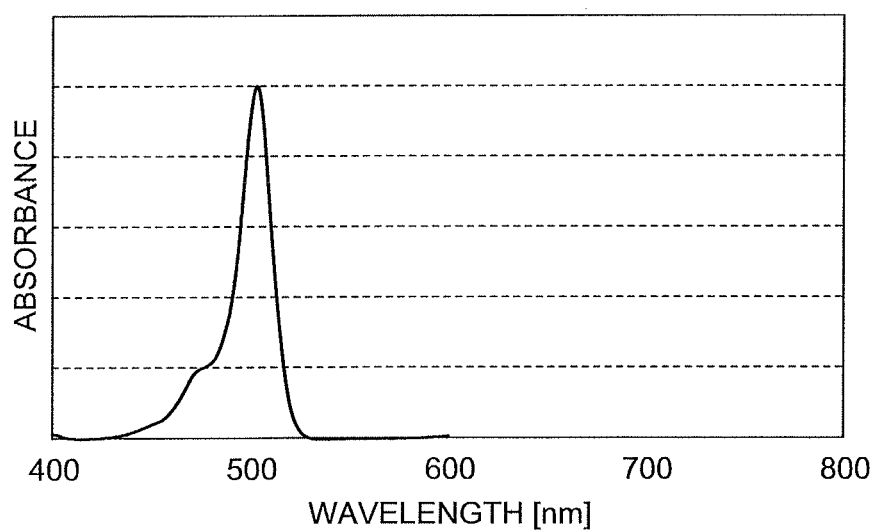
FIG. 6 is a diagram exemplifying an absorption spectrum of a compound of a synthesis example 1 in examples of the present invention.
Figure 7:
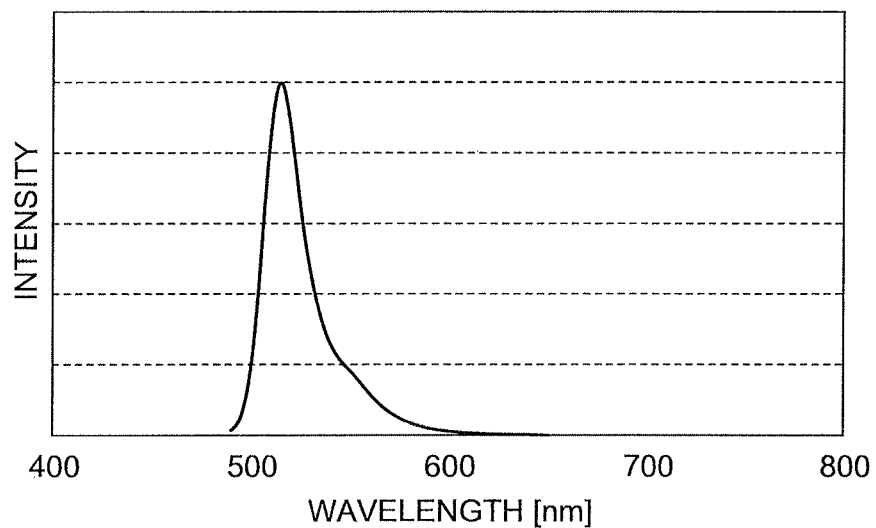
FIG. 7 is a diagram exemplifying an emission spectrum of the compound of the synthesis example 1 in the examples of the present invention.

An absorption spectrum of this compound G-1 is as illustrated in FIG. 6, which showed light absorption characteristics against a blue excitation light source (460 nm). A fluorescence spectrum of this compound G-1 is as illustrated in FIG. 7, which showed a sharp emission peak in the green region. Showing an emission quantum yield of 83%, this Compound G-1 was a compound that enabled efficient color conversion.

Synthesis Example 2

The following describes a method for synthesizing Compound R-1 of a synthesis example 2 of the present invention. In the method for synthesizing Compound R-1, a mixed solution of 4-(4-t-butylphenyl)-2-(4-methoxyphenyl)pyrrole (300 mg), 2-methoxybenzoyl chloride (201 mg), and toluene (10 mL) was heated at 120° C. for 6 hours in a nitrogen flow. This heated solution was cooled to room temperature and was then evaporated. Next, the resultant concentrate was washed with ethanol (20 mL) and was dried in a vacuum to obtain 2-(2-methhoxybenzoyl)-3-(4-t-butylphenyl)-5-(4-methoxyphenyl)pyrrole (260 mg). Next, a mixed solution of 2-(2-methhoxybenzoyl)-3-(4-t-butylphenyl)-5-(4-methoxyphenyl)pyrrole (260 mg), 4-(4-t-butylphenyl)-2-(4-methoxyphenyl)pyrrole (180 mg), methanesulfonic acid anhydride (206 mg), and degassed toluene (10 mL) was heated at 125° C. for 7 hours in a nitrogen flow. This heated solution was cooled to room temperature, water (20 mL) was then injected thereto, and an organic phase was extracted with dichloromethane (30 mL). This organic phase was washed with water (20 L) twice and was evaporated, and the resultant concentrate was dried in a vacuum to obtain a pyrromethene body.

Next, to a mixed solution of the obtained pyrromethene body and toluene (10 mL) in a nitrogen stream, diisopropylethylamine (305 mg) and a boron trifluoride diethyl ether complex (670 mg) were added, and the resultant mixture was stirred at room temperature for 3 hours. Water (20 mL) was then injected thereinto, and an organic phase was extracted with dichloromethane (30 mL). This organic phase was washed with water (20 mL) twice, was dried with magnesium sulfate, and was evaporated. Subsequently, the resultant concentrate was purified by silica gel chromatography and was dried in a vacuum to obtain reddish-violet powder (0.27 g). A $^1$H-NMR analysis result of the obtained reddish-violet powder is as follows, by which it was confirmed that the reddish-violet powder obtained as above was Compound R-1.

$^1$H-NMR (CDCl$_3$, ppm): 1.19 (s, 18H), 3.42 (s, 3H), 3.85 (s, 6H), 5.72 (d, 1H), 6.20 (t, 1H), 6.42-6.97 (m, 16H), 7.89 (d, 4H).

Figure 8:
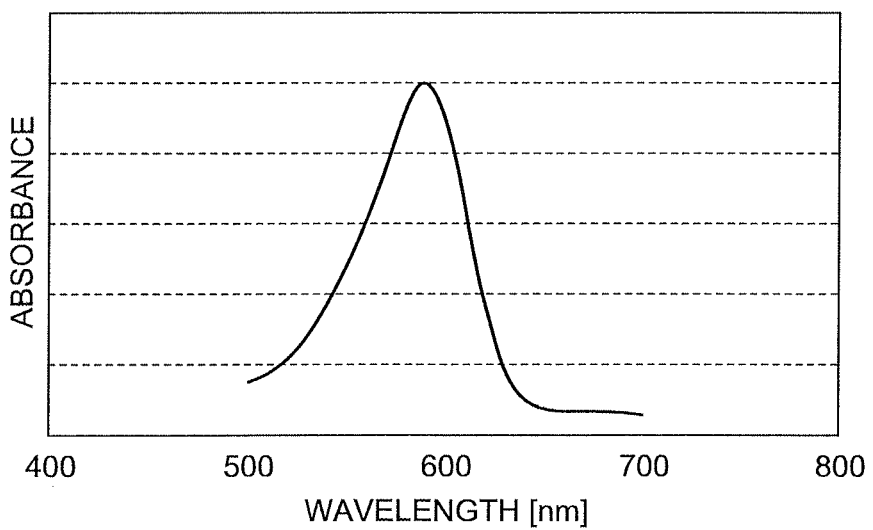
FIG. 8 is a diagram exemplifying an absorption spectrum of a compound of a synthesis example 2 in the example of the present invention.
Figure 9:
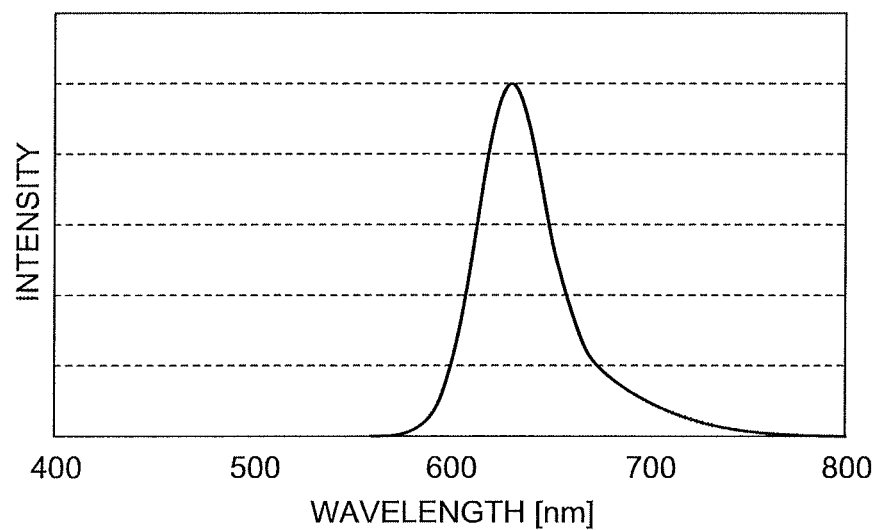
FIG. 9 is a diagram exemplifying an emission spectrum of the compound of the synthesis example 2 in the examples of the present invention.

An absorption spectrum of this compound R-1 is as illustrated in FIG. 8, which showed light absorption characteristics against blue and green excitation light sources. A fluorescence spectrum of this compound R-1 is as illustrated in FIG. 9, which showed a sharp emission peak in the red region. Showing an emission quantum yield of 90%, this Compound R-1 was a compound that enabled efficient color conversion.

Example 1

In an example 1 of the present invention, using Acrylic Resin T1 (SP value=9.5 (cal/cm$^3$)$^{0.5}$) as a binder resin, 0.25 part by weight of Compound G-1 as the organic light-emitting material (a) and 400 parts by weight of toluene as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) obtain a color conversion composition for the layer (A) preparation.

Similarly, using Polyester Resin T11 (SP value=10.7 $(cal/cm^3)^{0.5}$) as a binder resin, 0.017 part by weight of Compound R-1 as the organic light-emitting material (b) and 300 parts by weight of toluene as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for the layer (B) preparation.

Next, the color conversion composition for the layer (A) preparation was applied to "Lumirror" U48 (manufactured by Toray Industries, Inc., thickness: 50 μm) as a base layer A using a slit die coater and was heated and dried at 100° C. for 20 minutes to form the layer (A) with an average film thickness of 16 μm. A laminate unit including the base layer A and the layer (A) was thus prepared.

Similarly, the color conversion composition for the layer (B) preparation was applied to the PET base layer side (the base layer B side) of a light diffusion film "Chemical Matte" 125PW (manufactured by Kimoto Co., Ltd., thickness: 138 μm) as a film including the base layer B and a light diffusion layer using a slit die coater and was heated and dried at 100° C. for 20 minutes to form the layer (B) with an average film thickness of 48 μm. A laminate unit including the light diffusion layer, the base layer B, and the layer (B) was thus prepared.

Next, the above two units were laminated by heating so as to laminate the layer (A) and the layer (B) directly on each other. With this lamination, a color conversion sheet having a structure of "the base layer A/the layer (A)/the layer (B)/the base layer B/the light diffusion layer" was prepared.

Figure 10:
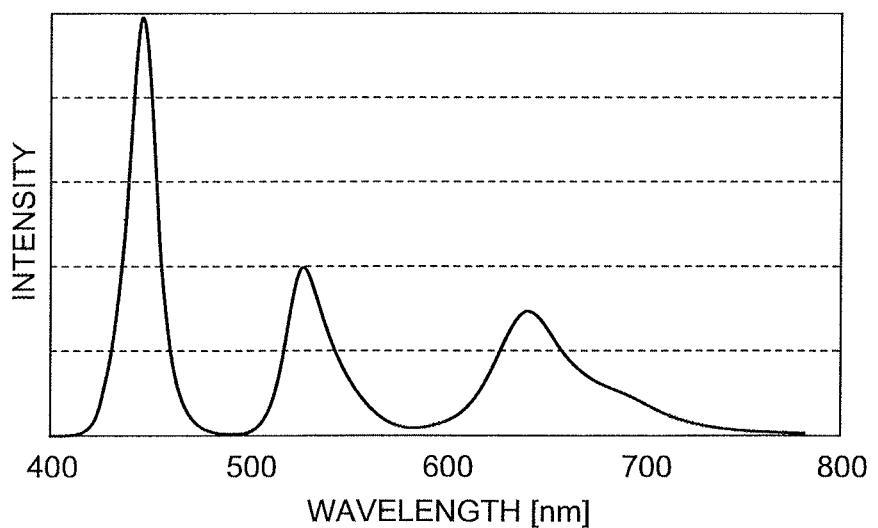
FIG. 10 is a diagram exemplifying an emission spectrum of a color conversion sheet in an example 1 of the present invention.

Blue LED light with an emission peak wavelength of 457 nm was subjected to color conversion using this color conversion sheet; the emission spectrum showed sharp emission peaks in the red region, the green region, and the blue region as illustrated in FIG. 10, by which white light with XY color coordinates of (X,Y)=(0.25,0.22) was obtained. When only the emission region of green light was extracted, high color purity green emission with a peak wavelength of 527 nm and with a full width at half maximum of an emission spectrum at the peak wavelength being 27 nm was obtained. When only the emission region of red light was extracted, high color purity red emission with a peak wavelength of 641 nm and with a full width at half maximum of an emission spectrum at the peak wavelength being 49 nm was obtained. The area of the color gamut in the (u',v') color space was 96% relative to the color gamut area of the BT. 2020 standard. An evaluation result of the example 1 is listed in Table 3 below. In Table 3, "Color coordinates (X,Y)" are the values of the XY color coordinates. "Color gamut area" is the area of the color gamut in the (u',v') color space. "A" to "D" in the column of "Color gamut area" show evaluation results of this area of the color gamut. The same holds true for all the tables.

Examples 2 to 5, and 13 and Comparative Example 1

In examples 2 to 5, and 13 of the present invention and a comparative example 1 against the present invention, color conversion films were prepared and evaluated similarly to the example 1 except that the organic light-emitting materials (Compounds G-1, G-2, G-3, and G-4) listed in Table 3 were used as appropriate as the organic light-emitting material (a) of the layer (A), that the organic light-emitting materials (Compounds R-1 and R-2) listed in Table 3 were used as appropriate as the organic light-emitting material (b) of the layer (B), and that the binder resins (Acrylic Resin T1 and Polyester Resin T11) listed in Table 3 were used as appropriate as the respective binder resins of the layer (A) and the layer (B) Evaluation results of the examples 2 to 5, and 13 and the comparative example 1 are listed in Table 3.

Comparative Example 2

In a comparative example 2 against the present invention, using Acrylic Resin T1 (SP value=9.5 $(cal/cm^3)^{0.5}$) as a binder resin, 0.25 part by weight of Compound G-1 as the organic light-emitting material (a), 0.017 part by weight of Compound R-1 as the organic light-emitting material (c), and 400 parts by weight of toluene as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for color conversion layer preparation.

Next, the color conversion composition for color conversion layer preparation was applied to "Lumirror" U48 (manufactured by Toray Industries, Inc., thickness: 50 μm) as the base layer A using a slit die coater and was heated and dried at 100° C. for 20 minutes to form a color conversion layer with an average film thickness of 16 μm. A laminate unit including the base layer A and the color conversion layer was thus prepared.

Next, a light diffusion film "Chemical Matte" 125PW (manufactured by Kimoto Co., Ltd., thickness: 138 μm) as a film including the base layer B and a light diffusion layer and the unit were laminated by heating so as to laminate the base layer B side of the light diffusion film and the color conversion layer side of the unit directly on each other. With this lamination, a color conversion sheet having a structure of "the base layer A/the color conversion layer/the base layer B/the light diffusion layer" was prepared.

Blue LED light with an emission peak wavelength of 457 nm was subjected to color conversion using this color conversion sheet; white light with XY color coordinates of (X,Y)=(0.25,0.22) was obtained. When only the emission region of green light was extracted, high color purity green emission with a peak wavelength of 527 nm and with a full width at half maximum of an emission spectrum at the peak wavelength being 33 nm was obtained. When only the emission region of red light was extracted, high color purity red emission with a peak wavelength of 626 nm and with a full width at half maximum of an emission spectrum at the peak wavelength being 50 nm was obtained. The area of the color gamut in the (u',v') color space was 84% relative to the color gamut area of the BT. 2020 standard. An evaluation result of the comparative example 2 is listed in Table 3.

Comparative Examples 3 to 5

In comparative examples 3 to 5 against the present invention, color conversion films were prepared and evaluated similarly to the comparative example 2 except that the organic light-emitting materials (Compounds G-1, G-3, and G-4) listed in Table 3 were used as appropriate as the organic light-emitting material (a) and that the binder resins (Acrylic Resin T1 and Polyester Resin T11) listed in Table 3 were used as appropriate as the binder resin. Evaluation results of the comparative examples 3 to 5 are listed in Table 3.

Example 6

In an example 6 of the present invention, using Acrylic Resin T1 (SP value=9.5 (cal/cm$^3$)$^{0.5}$) as a binder resin, 0.25 part by weight of Compound G-1 as the organic light-emitting material (a), 0.01 part by weight of Compound R-1 as the organic light-emitting material (c), and 400 parts by weight of toluene as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for the layer (A) preparation.

Similarly, using Polyester Resin T11 (SP value=10.7 (cal/cm$^3$)$^{0.5}$) as a binder resin, 0.017 part by weight of Compound R-1 as the organic light-emitting material (b) and 300 parts by weight of toluene as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for the layer (B) preparation.

Next, the color conversion composition for the layer (A) preparation was applied to "Lumirror" U48 (manufactured by Toray Industries, Inc., thickness: 50 μm) as the base layer A using a slit die coater and was heated and dried at 100° C. for 20 minutes to form the layer (A) with an average film thickness of 16 μm. A laminate unit including the base layer A and the layer (A) was thus prepared.

Similarly, the color conversion composition for the layer (B) preparation was applied to the PET base layer side (the base layer B side) of a light diffusion film "Chemical Matte" 125PW (manufactured by Kimoto Co., Ltd., thickness: 138 μm) as a film including the base layer B and a light diffusion layer using a slit die coater and was heated and dried at 100° C. for 20 minutes to form the layer (B) with an average film thickness of 16 μm. A laminate unit including the light diffusion layer, the base layer B, and the layer (B) was thus prepared.

Next, the above two units were laminated by heating so as to laminate the layer (A) and the layer (B) directly on each other. With this lamination, a color conversion sheet having a structure of "the base layer A/the layer (A)/the layer (B)/the base layer B/the light diffusion layer" was prepared.

Blue LED light with an emission peak wavelength of 457 nm was subjected to color conversion using this color conversion sheet; an emission spectrum similar to that in FIG. 10 was obtained, by which white light with XY color coordinates of (X,Y)=(0.25,0.22) was obtained. When only the emission region of green light was extracted, high color purity green emission with a peak wavelength of 525 nm and with a full width at half maximum of an emission spectrum at the peak wavelength being 27 nm was obtained. When only the emission region of red light was extracted, high color purity red emission with a peak wavelength of 639 nm and with a full width at half maximum of an emission spectrum at the peak wavelength being 50 nm was obtained. The area of the color gamut in the (u',v') color space was 95% relative to the color gamut area of the BT. 2020 standard. An evaluation result of the example 6 is listed in Table 3.

Examples 7 to 11

In examples 7 to 11 of the present invention, color conversion films were prepared and evaluated similarly to the example 6 except that the organic light-emitting materials (Compounds G-1 and G-2) listed in Table 3 were used as appropriate as the organic light-emitting material (a) of the layer (A), that the organic light-emitting materials (Compounds R-1 and R-2) listed in Table 3 were used as appropriate as the organic light-emitting material (c) of the layer (A), that the organic light-emitting materials (Compounds R-1 and R-2) listed in Table 3 were used as appropriate as the organic light-emitting material (b) of the layer (B), and that the binder resins (Acrylic Resin T1 and Polyester Resin T11) listed in Table 3 were used as appropriate as the respective binder resins of the layer (A) and the layer (B). Evaluation results of the examples 7 to 11 are listed in Table 3.

Example 12

In an example 12 of the present invention, using Acrylic Resin T1 (SP value=9.5 (cal/cm$^3$)$^{0.5}$) as a binder resin, 0.25 part by weight of Compound G-2 as the organic light-emitting material (a) and 400 parts by weight of toluene as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for the layer (A) preparation.

Similarly, using Polyester Resin T11 (SP value=10.7 (cal/cm$^3$)$^{0.5}$) as a binder resin, 0.017 part by weight of Compound R-1 as the organic light-emitting material (b), 0.015 part by weight of Compound G-1 as the organic light-emitting material (d), and 300 parts by weight of toluene as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for the layer (B) preparation.

Next, the color conversion composition for the layer (A) preparation was applied to "Lumirror" U48 (manufactured by Toray Industries, Inc., thickness: 50 μm) as the base layer A using a slit die coater and was heated and dried at 100° C. for 20 minutes to form the layer (A) with an average film thickness of 13 μm. A laminate unit including the base layer A and the layer (A) was thus prepared.

Similarly, the color conversion composition for the layer (B) preparation was applied to the PET base layer side (the base layer B side) of a light diffusion film "Chemical Matte" 125PW (manufactured by Kimoto Co., Ltd., thickness: 138 μm) as a film including the base layer B and a light diffusion layer using a slit die coater and was heated and dried at 100° C. for 20 minutes to form the layer (B) with an average film thickness of 48 μm. A laminate unit including the light diffusion layer, the base layer B, and the layer (B) was thus prepared.

Next, the above two units were laminated by heating so as to laminate the layer (A) and the layer (B) directly on each other. With this lamination, a color conversion sheet having a structure of "the base layer A/the layer (A)/the layer (B)/the base layer B/the light diffusion layer" was prepared.

Blue LED light with an emission peak wavelength of 457 nm was subjected to color conversion using this color conversion sheet; an emission spectrum similar to that in FIG. 10 was obtained, by which white light with XY color coordinates of (X,Y)=(0.25,0.22) was obtained. When only the emission region of green light was extracted, high color purity green emission with a peak wavelength of 527 nm and with a full width at half maximum of an emission spectrum at the peak wavelength being 28 nm was obtained. When only the emission region of red light was extracted, high color purity red emission with a peak wavelength of 642 nm and with a full width at half maximum of an emission spectrum at the peak wavelength being 50 nm was obtained. The area of the color gamut in the (u',v') color space was 95% relative to the color gamut area of the BT. 2020 standard. An evaluation result of the example 12 is listed in Table 3.

The examples 1 to 3, in which the organic light-emitting materials exhibiting light emission with high color purity (Compounds G-1, G-2, R-1, and R-2) were used and the binder resins having different SP values were used for the layer (A) and the layer (B), were able to achieve white light emission with an extremely wide color gamut and high color reproducibility.

In the examples 4 and 5, Compound G-1 was used as the organic light-emitting material (a), Compound R-1 was used as the organic light-emitting material (b), and the same binder resin was used for the layer (A) and the layer (B). Consequently, the examples 4 and 5 were smaller in the full width at half maximum of the light emission of Compound G-1 and were longer in the peak wavelength of the light emission of Compound R-1 than the comparative example 2 and the comparative example 3, in which a plurality of organic light-emitting materials (Compound G-1 and Compound R-1) were dispersed in the single layer and were thus able to expand the color gamut, although they were inferior to the example 1, in which the binder resins having different SP values were used for the layer (A) and the layer (B).

In the comparative example 1, the peak wavelength of the light emission of Compound G-3 used as the organic light-emitting material (a) was shorter than 500 nm, and the full width at half maximum of this light emission was as large as 56 nm; it was thus smaller in color gamut than those of the example 1 and the example 2, in which the organic light-emitting material (a) (Compounds G-1 and G-2) exhibiting light emission with high color purity was used.

In the examples 6 to 9, and 12, the organic light-emitting materials exhibiting light emission with high color purity (Compounds G-1, G-2, R-1, and R-2) were used, the binder resins having different SP values were used for the layer (A) and the layer (B), and besides a plurality of organic light-emitting materials were mixed in either the layer (A) or the layer (B). Consequently, they were able to achieve fine adjustment of the peak wavelength of light emission while maintaining a wide color gamut.

In the examples 10 and 11, a plurality of organic light-emitting materials (Compounds G-1, R-1, and R-2) were mixed in the layer (A), and the same binder resin was used for the layer (A) and the layer (B). Consequently, they were able to finely adjust the peak wavelength of light emission and were thereby able to achieve the expansion of the color gamut compared with the examples 4 and 5.

In the example 13, Compound G-4 was used as the organic light-emitting material (a), Compound R-1 was used as the organic light-emitting material (b), and the binder resins having different SP values were used for the layer (A) and the layer (B). Consequently, it was able to expand the color gamut compared with the comparative example 5, in which a plurality of organic light-emitting materials (Compound G-4 and Compound R-1) were dispersed in the single layer.

TABLE 3

| | Layer (A) | | | Layer (B) | | | Peak wavelength (nm) | | Full width at half maximum (nm) | | Color coordinates | Color gamut area |
|---|---|---|---|---|---|---|---|---|---|---|---|---|
| | Organic Light-Emitting Material | | | Organic Light-Emitting Material | | | | | | | | |
| | (a) | (c) | Binder resin | (b) | (d) | Binder resin | Green | Red | Green | Red | (X, Y) | |
| Example 1 | G-1 | — | Acrylic Resin T1 (SP value = 9.5) | R-1 | — | Polyester Resin T11 (SP value = 10.7) | 527 | 641 | 27 | 49 | (0.25, 0.22) | 96% A |
| Example 2 | G-2 | — | Acrylic Resin T1 (SP value = 9.5) | R-1 | — | Polyester Resin T11 (SP value = 10.7) | 528 | 641 | 27 | 49 | (0.25, 0.22) | 95% A |
| Example 3 | G-1 | — | Acrylic Resin T1 (SP value = 9.5) | R-2 | — | Polyester Resin T11 (SP value = 10.7) | 527 | 643 | 28 | 50 | (0.25, 0.22) | 96% A |
| Example 4 | G-1 | — | Acrylic Resin T1 (SP value = 9.5) | R-1 | — | Acrylic Resin T1 (SP value = 9.5) | 527 | 630 | 30 | 50 | (0.25, 0.22) | 88% B |
| Example 5 | G-1 | — | Polyester Resin T11 (SP value =10.7) | R-1 | — | Polyester Resin T11 (SP value = 10.7) | 533 | 639 | 31 | 50 | (0.25, 0.21) | 89% B |
| Example 6 | G-1 | R-1 | Acrylic Resin T1 (SP value = 9.5) | R-1 | — | Polyester Resin T11 (SP value = 10.7) | 525 | 639 | 27 | 50 | (0.25, 0.22) | 95% A |
| Example 7 | G-1 | R-2 | Acrylic Resin T1 (SP value = 9.5) | R-1 | — | Polyester Resin T11 (SP value = 10.7) | 527 | 642 | 27 | 50 | (0.25, 0.22) | 95% A |
| Example 8 | G-2 | R-1 | Acrylic Resin T1 (SP value = 9.5) | R-1 | — | Polyester Resin T11 (SP value = 10.7) | 528 | 639 | 27 | 50 | (0.25, 0.22) | 94% A |
| Example 9 | G-1 | R-2 | Acrylic Resin T1 (SP value = 9.5) | R-2 | — | Polyester Resin T11 (SP value = 10.7) | 528 | 642 | 27 | 50 | (0.25, 0.22) | 95% A |
| Example 10 | G-1 | R-1 | Acrylic Resin T1 (SP value = 9.5) | R-1 | — | Acrylic Resin T1 (SP value = 9.5) | 527 | 631 | 30 | 50 | (0.25, 0.22) | 89% B |
| Example 11 | G-1 | R-2 | Polyester Resin T11 (SP value =10.7) | R-1 | — | Polyester Resin T11 (SP value = 10.7) | 532 | 640 | 31 | 50 | (0.25, 0.21) | 90% B |
| Example 12 | G-2 | — | Acrylic Resin T1 (SP value = 9.5) | R-1 | G-1 | Polyester Resin T11 (SP value = 10.7) | 527 | 642 | 28 | 50 | (0.25, 0.22) | 95% A |

TABLE 3-continued

| | Layer (A) | | | Layer (B) | | | Peak wavelength (nm) | | Full width at half maximum (nm) | | Color coordinates | Color gamut area |
|---|---|---|---|---|---|---|---|---|---|---|---|---|
| | Organic Light-Emitting Material | | | Organic Light-Emitting Material | | | | | | | | |
| | (a) | (c) | Binder resin | (b) | (d) | Binder resin | Green | Red | Green | Red | (X, Y) | |
| Example 13 | G-4 | — | Acrylic Resin T1 (SP value = 9.5) | R-1 | — | Polyester Resin T11 (SP value = 10.7) | 532 | 641 | 51 | 51 | (0.25, 0.21) | 81% C |
| Comparative Example 1 | G-3 | — | Acrylic Resin T1 (SP value = 9.5) | R-1 | — | Polyester Resin T11 (SP value = 10.7) | 498 | 638 | 56 | 50 | (0.25, 0.21) | 79% D |
| Comparative Example 2 | G-1 | R-1 | Acrylic Resin T1 (SP value = 9.5) | — | — | — | 527 | 626 | 33 | 50 | (0.25, 0.22) | 84% C |
| Comparative Example 3 | G-1 | R-1 | Polyester Resin T11 (SP value =10.7) | — | — | — | 533 | 630 | 33 | 50 | (0.25, 0.22) | 85% C |
| Comparative Example 4 | G-3 | R-1 | Acrylic Resin T1 (SP value = 9.5) | — | — | — | 497 | 626 | 56 | 50 | (0.25, 0.21) | 74% D |
| Comparative Example 5 | G-4 | R-1 | Acrylic Resin T1 (SP value = 9.5) | — | — | — | 532 | 627 | 53 | 53 | (0.24, 0.21) | 70% D |

Example 14

In an example 14 of the present invention, using Acrylic Resin T2 (SP value=9.9 $(cal/cm^3)^{0.5}$, refractive index $n_A$=2.22) as a binder resin, 0.3 part by weight of Compound G-2 as the organic light-emitting material (a) and 500 parts by weight of toluene as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for the layer (A) preparation.

Similarly, using Polyester Resin T12 (SP value=10.9 $(cal/cm^3)^{0.5}$, refractive index $n_B$=2.42) as a binder resin, 0.07 part by weight of Compound R-1 as the organic light-emitting material (b) and 300 parts by weight of cyclohexanone as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for the layer (B) preparation.

Next, the color conversion composition for the layer (A) preparation was applied to "Lumirror" U34 (manufactured by Toray Industries, Inc., thickness: 75 μm) as the base layer A using a slit die coater and was heated and dried at 100° C. for 20 minutes to form the layer (A) with an average film thickness of 21 μm. A laminate unit including the base layer A and the layer (A) was thus prepared.

Similarly, the color conversion composition for the layer (B) preparation was applied to the PET base layer side (the base layer B side) of a light diffusion film "Chemical Matte" 125PW (manufactured by Kimoto Co., Ltd., thickness: 138 μm) as a film including the base layer B and a light diffusion layer using a slit die coater and was heated and dried at 100° C. for 20 minutes to form the layer (B) with an average film thickness of 14 μm. A laminate unit including the light diffusion layer, the base layer B, and the layer (B) was thus prepared.

Next, the above two units were laminated by heating so as to laminate the layer (A) and the layer (B) directly on each other. With this lamination, a color conversion sheet having a structure of "the base layer A/the layer (A)/the layer (B)/the base layer B/the light diffusion layer" was prepared.

Blue LED light with an emission peak wavelength of 457 nm was subjected to color conversion using this color conversion sheet; an emission spectrum similar to that in FIG. 10 was obtained, by which white light with XY color coordinates of (X,Y)=(0.26,0.23) was obtained. When only the emission region of green light was extracted, high color purity green emission with a peak wavelength of 527 nm and with a full width at half maximum of an emission spectrum at the peak wavelength being 27 nm was obtained. When only the emission region of red light was extracted, high color purity red emission with a peak wavelength of 646 nm and with a full width at half maximum of an emission spectrum at the peak wavelength being 50 nm was obtained. The area of the color gamut in the (u',v') color space was 97% relative to the color gamut area of the BT. 2020 standard. With the luminance of the white light after color conversion in this example 14 as 100, the example 14 and an example 15 described below were compared with each other in luminance. An evaluation result of the example 14 is listed in Table 4 below. In Table 4, "Relative luminance (%)" is relative luminance between the example 14 and the example 15.

Example 15

In the example 15 of the present invention, using Acrylic Resin T2 (SP value=9.9 $(cal/cm^3)^{0.5}$, refractive index $n_A$=2.22) as a binder resin, 0.3 part by weight of Compound G-2 as the organic light-emitting material (a) and 500 parts by weight of toluene as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for the layer (A) preparation.

Similarly, using Polyester Resin T12 (SP value=10.9 $(cal/cm^3)^{0.5}$, refractive index $n_B$=2.42) as a binder resin, 0.07 part by weight of Compound R-1 as the organic light-emitting material (b) and 300 parts by weight of cyclohexanone as a solvent were mixed with 100 parts by weight of this binder resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a color conversion composition for the layer (B) preparation.

In addition, using Polyester Resin T13 (SP value=10.6 (cal/cm³)$^{0.5}$, refractive index $n_C$=2.32) as a resin for a light extraction layer, 100 parts by weight of butyl acetate and 100 parts by weight of 1-methoxy-2-propanol as solvents were mixed with 100 parts by weight of this resin. Subsequently, the mixture of these was stirred and defoamed at 300 rpm for 20 minutes using a planetary stirring and defoaming apparatus "Mazerustar KK-400" (manufactured by Kurabo Industries Ltd.) to obtain a composition for light extraction layer preparation.

Next, the color conversion composition for the layer (A) preparation was applied to "Lumirror" U34 (manufactured by Toray Industries, Inc., thickness: 75 μm) as the base layer A using a slit die coater and was heated and dried at 100° C. for 20 minutes to form the layer (A) with an average film thickness of 21 μm. A laminate unit including the base layer A and the layer (A) was thus prepared.

Similarly, the color conversion composition for the layer (B) preparation was applied to the PET base layer side (the base layer B side) of a light diffusion film "Chemical Matte" 125PW (manufactured by Kimoto Co., Ltd., thickness: 138 μm) as a film including the base layer B and a light diffusion layer using a slit die coater and was heated and dried at 100° C. for 20 minutes to form the layer (B) with an average film thickness of 14 μm. In addition, the composition for light extraction layer preparation was applied to this layer (B) using a slit die coater and was heated and dried at 100° C. for 20 minutes to form a light extraction layer with an average film thickness of 8 μm. A laminate unit including the light diffusion layer, the base layer B, the layer (B), and the light extraction layer was thus prepared.

Next, the above two units were laminated by heating so as to laminate the layer (A) and the light extraction layer directly on each other. With this lamination, a color conversion sheet having a structure of "the base layer A/the layer (A)/the light extraction layer/the layer (B)/the base layer B/the light diffusion layer" was prepared.

Blue LED light with an emission peak wavelength of 457 nm was subjected to color conversion using this color conversion sheet; an emission spectrum similar to that in FIG. 10 was obtained, by which white light with XY color coordinates of (X,Y)=(0.26,0.23) was obtained. When only the emission region of green light was extracted, high color purity green emission with a peak wavelength of 527 nm and with a full width at half maximum of an emission spectrum at the peak wavelength being 27 nm was obtained. When only the emission region of red light was extracted, high color purity red emission with a peak wavelength of 646 nm and with a full width at half maximum of an emission spectrum at the peak wavelength being 50 nm was obtained. The area of the color gamut in the (u',v') color space was 97% relative to the color gamut area of the BT. 2020 standard. The relative luminance of the example 15 with the luminance of the white light after color conversion in this example 14 as 100 was 105. An evaluation result of the example 15 is listed in Table 4.

The example 14 was able to achieve white light emission with an extremely wide color gamut and high color reproducibility similarly to the example 1. In addition, the example 15, in which the refractive indices $n_A$, $n_B$, and $n_C$ of the layer (A), the layer (B), and the light extraction layer, respectively, relative to light with a wavelength of 589.3 nm were designed to have a relation of $n_A \leq n_C \leq n_B$, was able to reduce light reflection on the boundary between the layer (A) and the light extraction layer and the boundary between the layer (B) and the light extraction layer and consequently was able to achieve improvement in the luminance of white light after color conversion.

TABLE 4

| | Layer (A) | | | Layer (B) | | | Light extraction layer | | Peak wavelength (nm) | | Full width at half maximum (nm) | | Color coordinates | Color gamut area | Relative luminance (%) |
|---|---|---|---|---|---|---|---|---|---|---|---|---|---|---|---|
| | Organic Light-Emitting Material | Binder | Refractive index | Organic Light-Emitting Material | Binder | Refractive index | Resin | Refractive index | Green | Red | Green | Red | (X, Y) | | |
| | (a) | resin | $n_A$ | (b) | resin | $n_B$ | | $n_C$ | | | | | | | |
| Example 14 | G-2 | Acrylic Resin T2 (SP value = 9.9) | 2.22 | R-1 | Polyester Resin T12 (SP value = 10.9) | 2.42 | — | — | 527 | 646 | 27 | 50 | (0.26, 0.23) | 97% A | 100 |
| Example 15 | G-2 | Acrylic Resin T2 (SP value = 9.9) | 2.22 | R-1 | Polyester Resin T12 (SP value = 10.9) | 2.42 | Polyester Resin T13 (SP value = 10.6) | 2.32 | 527 | 646 | 27 | 50 | (0.26, 0.23) | 97% A | 105 |

As described above, the color conversion sheet, the light source unit including the same, the display, and the lighting apparatus according to the present invention are useful for achieving both light emission with high color purity and a wide color gamut and are suitable for a color conversion sheet, a light source unit including the same, a display, and a lighting apparatus that can achieve high color reproducibility in particular.

REFERENCE SIGNS LIST 1, 1a, 1b, 1c, 1d Color conversion sheet
10 Base layer
11 Layer (A)
12 Layer (B)
13 Light extraction layer
14 Barrier layer

The invention claimed is:
1. A color conversion sheet that converts incident light into light with a wavelength longer than that of the incident light, the color conversion sheet comprising the following layer (A) and layer (B):

the layer (A): a layer containing an organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing an organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin, wherein $SP_A \leq SP_B$ where SP values as solubility parameters of the binder resin contained in the layer (A) and the binder resin contained in the layer (B) are $SP_A$ $(cal/cm^3)^{0.5}$ and $SP_B$ $(cal/cm^3)^{0.5}$, respectively.

2. The color conversion sheet according to claim 1, wherein $SP_B \geq 10.0$ where a SP value as a solubility parameter of the binder resin contained in the layer (B) is $SP_B$ $(cal/cm^3)^{0.5}$.

3. The color conversion sheet according to claim 1, wherein a content $w_a$ of the organic light-emitting material (a) in the layer (A) and a content $w_b$ of the organic light-emitting material (b) in the layer (B) have a relation of $w_a \geq w_b$.

4. The color conversion sheet according to claim 1, further comprising a light extraction layer between the layer (A) and the layer (B).

5. A light source unit comprising:
a light source; and
the color conversion sheet according to claim 1.

6. The light source unit according to claim 5, wherein an arrangement of the light source and the following layer (A) and layer (B) included in the color conversion sheet is an arrangement of the light source, the layer (A), and the layer (B) in this order:

the layer (A): a layer containing the organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing the organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin.

7. A display or lighting apparatus comprising the light source unit according to claim 5.

8. A color conversion sheet that converts incident light into light with a wavelength longer than that of the incident light, the color conversion sheet comprising the following layer (A) and layer (B):

the layer (A): a layer containing an organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing an organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin, wherein at least one of the organic light-emitting material (a) and the organic light-emitting material (b) is a compound represented by General Formula (1):

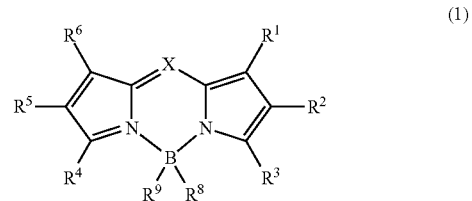

where X is C—$R^7$ or N; $R^1$ to $R^9$ are the same as or different from each other and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

9. The color conversion sheet according to claim 8, wherein the binder resin contained in the layer (A) and the binder resin contained in the layer (B) are different from each other.

10. The color conversion sheet according to claim 8, wherein $SP_B \geq 10.0$ where a SP value as a solubility parameter of the binder resin contained in the layer (B) is $SP_B$ $(cal/cm^3)^{0.5}$.

11. The color conversion sheet according to claim 8, wherein a content $w_a$ of the organic light-emitting material (a) in the layer (A) and a content $w_b$ of the organic light-emitting material (b) in the layer (B) have a relation of $w_a \geq w_b$.

12. The color conversion sheet according to claim 8, further comprising a light extraction layer between the layer (A) and the layer (B).

13. A light source unit comprising:
a light source; and
the color conversion sheet according to claim 8.

14. The light source unit according to claim 13, wherein an arrangement of the light source and the following layer (A) and layer (B) included in the color conversion sheet is an arrangement of the light source, the layer (A), and the layer (B) in this order:

the layer (A): a layer containing the organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing the organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin.

15. A display or lighting apparatus comprising the light source unit according to claim 13.

16. A color conversion sheet that converts incident light into light with a wavelength longer than that of the incident light, the color conversion sheet comprising the following layer (A) and layer (B):

the layer (A): a layer containing an organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing an organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin, wherein the layer (A) further contains an organic light-emitting material (c) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a), and the organic light-emitting material (c) is a compound represented by General Formula (1):

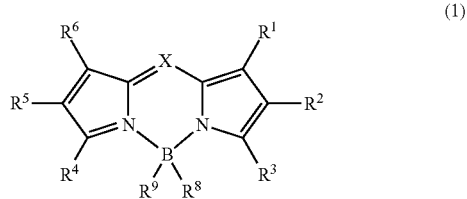

(1)

where X is C—R$^7$ or N; R$^1$ to R$^9$ are the same as or different from each other and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

17. The color conversion sheet according to claim 16, wherein the binder resin contained in the layer (A) and the binder resin contained in the layer (B) are different from each other.

18. The color conversion sheet according to claim 16, wherein a content w$_a$ of the organic light-emitting material (a) in the layer (A) and a content w$_c$ of the organic light-emitting material (c) in the layer (A) have a relation of w$_a$≥w$_c$.

19. A light source unit comprising:
a light source; and
the color conversion sheet according to claim 16.

20. The light source unit according to claim 19, wherein an arrangement of the light source and the following layer (A) and layer (B) included in the color conversion sheet is an arrangement of the light source, the layer (A), and the layer (B) in this order:

the layer (A): a layer containing the organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing the organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin.

21. A display or lighting apparatus comprising the light source unit according to claim 19.

22. A color conversion sheet that converts incident light into light with a wavelength longer than that of the incident light, the color conversion sheet comprising the following layer (A) and layer (B):

the layer (A): a layer containing an organic light-emitting material (a) that exhibits light emission with a peak wavelength observed in a region of 500 nm or more and 580 nm or less by using excitation light in a wavelength range of 400 nm or more and 500 nm or less and a binder resin; and the layer (B): a layer containing an organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin, wherein the layer (B) further contains an organic light-emitting material (d) that exhibits light emission with a peak wavelength observed in a region of 500 nm or more and 580 nm or less by using excitation light in a wavelength range of 400 nm or more and 500 nm or less, and the organic light-emitting material (d) is a compound represented by General Formula (1):

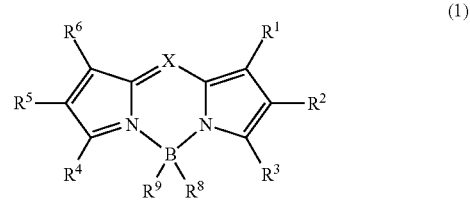

(1)

where X is C—R$^7$ or N; R$^1$ to R$^9$ are the same as or different from each other and are selected from hydrogen, an alkyl group, a cycloalkyl group, a heterocyclic group, an alkenyl group, a cycloalkenyl group, an alkynyl group, a hydroxy group, a thiol group, an alkoxy group, an alkylthio group, an aryl ether group, an aryl thioether group, an aryl group, a heteroaryl group, halogen, a cyano group, an aldehyde group, a carbonyl group, a carboxy group, an oxycarbonyl group, a carbamoyl group, an amino group, a nitro group, a silyl group, a siloxanyl group, a boryl group, a phosphine oxide group, and a condensed ring and an aliphatic ring formed between adjacent substituents.

23. The color conversion sheet according to claim 22, wherein the binder resin contained in the layer (A) and the binder resin contained in the layer (B) are different from each other.

24. A light source unit comprising:
   a light source; and
   the color conversion sheet according to claim 22.

25. The light source unit according to claim 24, wherein an arrangement of the light source and the following layer (A) and layer (B) included in the color conversion sheet is an arrangement of the light source, the layer (A), and the layer (B) in this order:
   the layer (A): a layer containing the organic light-emitting material (a) that exhibits light emission with a peak wavelength observed in a region of 500 nm or more and 580 nm or less by using excitation light in a wavelength range of 400 nm or more and 500 nm or less and a binder resin; and
   the layer (B): a layer containing the organic light-emitting material (b) that exhibits light emission with a peak wavelength observed in a region of 580 nm or more and 750 nm or less by being excited by either or both of excitation light in a wavelength range of 400 nm or more and 500 nm or less and light emission from the organic light-emitting material (a) and a binder resin.

26. A display or lighting apparatus comprising the light source unit according to claim 24.

* * * * *